(12) United States Patent
Chen

(10) Patent No.: US 7,502,430 B2
(45) Date of Patent: *Mar. 10, 2009

(54) COHERENT AVERAGING FOR MEASURING TRAVELING WAVE TUBE AMPLIFIER NONLINEARITY

(75) Inventor: Ernest C. Chen, San Pedro, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 460 days.

This patent is subject to a terminal disclaimer.

(21) Appl. No.: 10/962,346

(22) Filed: Oct. 8, 2004

(65) Prior Publication Data

US 2005/0078778 A1    Apr. 14, 2005

Related U.S. Application Data

(63) Continuation-in-part of application No. PCT/US03/33130, filed on Oct. 17, 2003, and a continuation-in-part of application No. 10/165,710, filed on Jun. 7, 2002, and a continuation-in-part of application No. 09/844,401, filed on Apr. 27, 2001, now Pat. No. 7,209,524.

(60) Provisional application No. 60/510,368, filed on Oct. 10, 2003.

(51) Int. Cl.
*H04L 25/08* (2006.01)

(52) U.S. Cl. .................. 375/346; 375/324; 375/228; 375/316; 375/325; 375/350; 455/22; 455/21; 455/63.1; 455/67.11; 455/68; 725/61; 725/67; 725/68

(58) Field of Classification Search ................. 375/278, 375/284, 285, 296, 297, 346, 148, 240.27
See application file for complete search history.

(56) References Cited

U.S. PATENT DOCUMENTS

| | | | |
|---|---|---|---|
| 3,076,180 A | | 1/1963 | Havens et al. |
| 3,383,598 A | | 5/1968 | Sanders |
| 3,878,468 A | | 4/1975 | Falconer et al. |
| 3,879,664 A | | 4/1975 | Monsen |
| 3,974,449 A | * | 8/1976 | Falconer ..................... 375/233 |
| 4,039,961 A | | 8/1977 | Ishio et al. |
| 4,068,186 A | | 1/1978 | Sato et al. |
| 4,213,095 A | | 7/1980 | Falconer |

(Continued)

FOREIGN PATENT DOCUMENTS

DE    3642213    12/1986

(Continued)

OTHER PUBLICATIONS

Patent Abstracts of Japan; vol. 015, No. 355 (E-1109): JP 03139027; Nippon Telegraph and Telephone Corporation; Publication date: Jun. 13, 1991.

(Continued)

*Primary Examiner*—Chieh M Fan
*Assistant Examiner*—Siu M Lee

(57) ABSTRACT

A method and system provide the ability to measure a transmission performance characteristic. A signal is received and demodulated. An ideal signal is generated from the demodulated signal. The received signal is coherently averaged to reduce noise. The performance characteristic is the estimated TWTA nonlinearity from a difference between the coherently averaged ideal signal and received signal.

22 Claims, 33 Drawing Sheets

U.S. PATENT DOCUMENTS

| | | | |
|---|---|---|---|
| 4,253,184 A | 2/1981 | Gitlin et al. | |
| 4,283,684 A | 8/1981 | Satoh | |
| 4,384,355 A | 5/1983 | Werner | |
| RE31,351 E | 8/1983 | Falconer | |
| 4,416,015 A | 11/1983 | Gitlin | |
| 4,422,175 A | 12/1983 | Bingham et al. | |
| 4,500,984 A | 2/1985 | Shimbo et al. | |
| 4,519,084 A | 5/1985 | Langseth | |
| 4,594,725 A | 6/1986 | Desperben et al. | |
| 4,628,507 A | 12/1986 | Otani | |
| 4,637,017 A | 1/1987 | Assal et al. | |
| 4,647,873 A | 3/1987 | Beckner et al. | |
| 4,654,863 A | 3/1987 | Belfield et al. | |
| 4,670,789 A | 6/1987 | Plume | |
| 4,709,374 A | 11/1987 | Farrow | |
| 4,800,573 A | 1/1989 | Cupo | |
| 4,829,543 A | 5/1989 | Borth et al. | |
| 4,835,790 A | 5/1989 | Yoshida et al. | |
| 4,847,864 A | 7/1989 | Cupo | |
| 4,860,315 A | 8/1989 | Hosoda et al. | |
| 4,878,030 A | 10/1989 | Vincze | |
| 4,896,369 A | 1/1990 | Adams et al. | |
| 4,918,708 A | 4/1990 | Pottinger et al. | |
| 4,993,047 A | 2/1991 | Moffat et al. | |
| 5,043,734 A | 8/1991 | Niho | |
| 5,088,110 A | 2/1992 | Bonnerot et al. | |
| 5,111,155 A | 5/1992 | Keate et al. | |
| 5,121,414 A * | 6/1992 | Levine et al. | 375/343 |
| 5,199,047 A | 3/1993 | Koch | |
| 5,221,908 A | 6/1993 | Katz et al. | |
| 5,229,765 A | 7/1993 | Gardner | |
| 5,233,632 A | 8/1993 | Baum et al. | |
| 5,237,292 A | 8/1993 | Chethik | |
| 5,285,474 A | 2/1994 | Chow et al. | |
| 5,285,480 A | 2/1994 | Chennakeshu et al. | |
| 5,317,599 A | 5/1994 | Obata | |
| 5,329,311 A | 7/1994 | Ward et al. | |
| 5,337,014 A | 8/1994 | Najle et al. | |
| 5,353,307 A | 10/1994 | Lester et al. | |
| 5,412,325 A | 5/1995 | Meyers | |
| 5,430,770 A | 7/1995 | Abbey | |
| 5,450,623 A | 9/1995 | Yokoyama et al. | |
| 5,467,197 A | 11/1995 | Hoff | |
| 5,471,508 A | 11/1995 | Koslov | |
| 5,493,307 A | 2/1996 | Tsujimoto | |
| 5,513,215 A * | 4/1996 | Marchetto et al. | 375/233 |
| 5,555,257 A | 9/1996 | Dent | |
| 5,577,067 A | 11/1996 | Zimmerman | |
| 5,577,087 A | 11/1996 | Furuya | |
| 5,579,344 A * | 11/1996 | Namekata | 375/341 |
| 5,581,229 A | 12/1996 | Hunt | |
| 5,592,481 A | 1/1997 | Wiedeman et al. | |
| 5,602,868 A | 2/1997 | Wilson | |
| 5,603,084 A | 2/1997 | Henry et al. | |
| 5,606,286 A | 2/1997 | Bains | |
| 5,608,331 A | 3/1997 | Newberg et al. | |
| 5,625,640 A * | 4/1997 | Palmer et al. | 375/132 |
| 5,642,358 A | 6/1997 | Dent | |
| 5,644,592 A | 7/1997 | Divsalar et al. | |
| 5,648,955 A | 7/1997 | Jensen et al. | |
| 5,732,113 A | 3/1998 | Schmidl et al. | |
| 5,793,818 A | 8/1998 | Claydon et al. | |
| 5,815,531 A | 9/1998 | Dent | |
| 5,819,157 A | 10/1998 | Ben-Efraim et al. | |
| 5,828,710 A | 10/1998 | Beale | |
| 5,848,060 A | 12/1998 | Dent | |
| 5,870,439 A | 2/1999 | Ben-Efraim et al. | |
| 5,870,443 A | 2/1999 | Rahnema | |
| 5,937,004 A | 8/1999 | Fasulo et al. | |
| 5,940,025 A | 8/1999 | Koehnke et al. | |
| 5,940,750 A | 8/1999 | Wang | |
| 5,946,625 A | 8/1999 | Hassan et al. | |
| 5,952,834 A | 9/1999 | Buckley | |
| 5,956,373 A | 9/1999 | Goldston et al. | |
| 5,960,040 A | 9/1999 | Cai et al. | |
| 5,963,845 A | 10/1999 | Floury et al. | |
| 5,966,048 A | 10/1999 | Thompson | |
| 5,966,186 A | 10/1999 | Shigihara et al. | |
| 5,966,412 A | 10/1999 | Ramaswamy | |
| 5,970,098 A | 10/1999 | Herzberg | |
| 5,970,156 A | 10/1999 | Hummelgaard et al. | |
| 5,970,429 A | 10/1999 | Martin | |
| 5,987,068 A | 11/1999 | Cassia et al. | |
| 5,987,069 A | 11/1999 | Furukawa et al. | |
| 5,995,832 A | 11/1999 | Mallinckrodt | |
| 5,999,793 A | 12/1999 | Ben-Efraim et al. | |
| 6,002,713 A | 12/1999 | Goldstein et al. | |
| 6,008,692 A | 12/1999 | Escartin | |
| 6,018,556 A | 1/2000 | Janesch et al. | |
| 6,021,159 A | 2/2000 | Nakagawa | |
| 6,028,894 A | 2/2000 | Oishi et al. | |
| 6,032,026 A | 2/2000 | Seki et al. | |
| 6,034,952 A | 3/2000 | Dohi et al. | |
| 6,049,566 A | 4/2000 | Saunders et al. | |
| 6,052,586 A | 4/2000 | Karabinis | |
| 6,055,278 A | 4/2000 | Ho et al. | |
| 6,061,393 A | 5/2000 | Tsui et al. | |
| 6,072,841 A | 6/2000 | Rahnema | |
| 6,078,645 A | 6/2000 | Cai et al. | |
| 6,084,919 A | 7/2000 | Kleider et al. | |
| 6,104,747 A * | 8/2000 | Jalloul et al. | 375/150 |
| 6,108,374 A | 8/2000 | Balachandran et al. | |
| 6,125,148 A | 9/2000 | Frodigh et al. | |
| 6,125,260 A | 9/2000 | Wiedeman et al. | |
| 6,128,357 A | 10/2000 | Lu et al. | |
| 6,131,013 A | 10/2000 | Bergstrom et al. | |
| 6,134,282 A | 10/2000 | Ben-Efraim et al. | |
| 6,140,809 A | 10/2000 | Doi | |
| 6,141,534 A | 10/2000 | Snell et al. | |
| 6,144,708 A | 11/2000 | Maruyama | |
| 6,166,601 A | 12/2000 | Shalom et al. | |
| 6,178,158 B1 | 1/2001 | Suzuki et al. | |
| 6,188,717 B1 | 2/2001 | Kaiser et al. | |
| 6,192,088 B1 | 2/2001 | Aman et al. | |
| 6,212,360 B1 | 4/2001 | Fleming et al. | |
| 6,219,095 B1 | 4/2001 | Zhang et al. | |
| 6,246,717 B1 | 6/2001 | Chen et al. | |
| 6,249,180 B1 | 6/2001 | Maalej et al. | |
| 6,266,534 B1 | 7/2001 | Raith et al. | |
| 6,272,679 B1 | 8/2001 | Norin | |
| 6,275,678 B1 | 8/2001 | Bethscheider et al. | |
| 6,297,691 B1 | 10/2001 | Anderson et al. | |
| 6,304,594 B1 | 10/2001 | Salinger | |
| 6,307,435 B1 * | 10/2001 | Nguyen et al. | 330/149 |
| 6,313,885 B1 | 11/2001 | Patel et al. | |
| 6,314,441 B1 * | 11/2001 | Raghunath | 708/322 |
| 6,320,464 B1 | 11/2001 | Suzuki et al. | |
| 6,320,919 B1 | 11/2001 | Khyrallah et al. | |
| 6,325,332 B1 | 12/2001 | Cellier et al. | |
| 6,330,336 B1 | 12/2001 | Kasama | |
| 6,333,924 B1 | 12/2001 | Porcelli et al. | |
| 6,335,951 B1 | 1/2002 | Cangiani et al. | |
| 6,366,309 B1 | 4/2002 | Siegle | |
| 6,369,648 B1 | 4/2002 | Kirkman | |
| 6,377,116 B1 * | 4/2002 | Mattsson et al. | 330/2 |
| 6,389,002 B1 | 5/2002 | Schilling | |
| 6,411,659 B1 | 6/2002 | Liu et al. | |
| 6,411,797 B1 | 6/2002 | Estinto | |
| 6,426,822 B1 | 7/2002 | Winter et al. | |
| 6,429,740 B1 | 8/2002 | Nguyen et al. | |
| 6,433,835 B1 | 8/2002 | Hartson et al. | |
| 6,452,977 B1 | 9/2002 | Goldston et al. | |
| 6,477,398 B1 | 11/2002 | Mills | |
| 6,501,804 B1 | 12/2002 | Dietmar et al. | |

| | | | | | |
|---|---|---|---|---|---|
| 6,515,713 B1 | 2/2003 | Nam | 2007/0121718 A1 | 5/2007 | Wang et al. |
| 6,522,683 B1 | 2/2003 | Smee et al. | | | |
| 6,529,715 B1 | 3/2003 | Kitko et al. | | | |

6,515,713 B1 2/2003 Nam
6,522,683 B1 2/2003 Smee et al.
6,529,715 B1 3/2003 Kitko et al.
6,535,497 B1 3/2003 Raith
6,535,801 B1 3/2003 Geier et al.
6,597,750 B1 7/2003 Knutson et al.
6,661,761 B2 12/2003 Hayami et al.
6,678,336 B1 1/2004 Katoh et al.
6,700,442 B2 3/2004 Ha
6,718,184 B1 4/2004 Aiken et al.
6,731,622 B1* 5/2004 Frank et al. .................. 370/342
6,731,700 B1 5/2004 Yakhnich et al.
6,745,050 B1 6/2004 Forsythe et al.
6,772,182 B1 8/2004 McDonald et al.
6,775,521 B1 8/2004 Chen
6,795,496 B1 9/2004 Soma et al.
6,809,587 B2* 10/2004 Ghannouchi et al. ........ 330/149
6,892,068 B2 5/2005 Karabinis et al.
6,922,436 B1 7/2005 Porat et al.
6,922,439 B2 7/2005 Yamaguchi et al.
6,934,314 B2 8/2005 Harles et al.
6,956,841 B1 10/2005 Stahle et al.
6,956,924 B2 10/2005 Linsky et al.
6,970,496 B1 11/2005 Ben-Bassat et al.
6,980,609 B1 12/2005 Ahn
6,990,627 B2 1/2006 Uesugi et al.
6,999,510 B2* 2/2006 Batruni ....................... 375/239
7,154,958 B2 12/2006 Dabak et al.
7,161,931 B1 1/2007 Li et al.
7,173,981 B1 2/2007 Chen et al.
7,184,473 B2 2/2007 Chen et al.
7,230,992 B2 6/2007 Walker et al.
7,239,876 B2* 7/2007 Johnson et al. .......... 455/456.1
7,251,291 B1 7/2007 Dubuc et al.
7,263,119 B1 8/2007 Hsu et al.
2001/0012322 A1 8/2001 Nagaoka et al.
2001/0016926 A1 8/2001 Riggle
2001/0024479 A1 9/2001 Samarasooriya
2001/0055295 A1 12/2001 Akiyama et al.
2002/0006795 A1 1/2002 Norin et al.
2002/0009141 A1 1/2002 Yamaguchi et al.
2002/0051435 A1 5/2002 Giallorenzi et al.
2002/0071506 A1 6/2002 Lindquist et al.
2002/0082792 A1 6/2002 Bourde et al.
2002/0136327 A1 9/2002 El-Gamal et al.
2002/0154705 A1 10/2002 Walton et al.
2002/0158619 A1 10/2002 Chen
2002/0172296 A1 11/2002 Pilcher
2002/0176516 A1 11/2002 Jeske et al.
2002/0186761 A1 12/2002 Corbaton et al.
2003/0002471 A1 1/2003 Crawford et al.
2003/0072385 A1 4/2003 Dragonetti
2003/0138037 A1 7/2003 Kaku et al.
2003/0138040 A1 7/2003 Rouphael et al.
2003/0147472 A1 8/2003 Bach et al.
2003/0171102 A1 9/2003 Yang
2003/0185310 A1 10/2003 Ketchum et al.
2003/0194022 A1 10/2003 Hammons et al.
2004/0013084 A1 1/2004 Thomas et al.
2004/0091059 A1 5/2004 Chen
2004/0110467 A1 6/2004 Wang
2004/0146014 A1 7/2004 Hammons et al.
2004/0146296 A1 7/2004 Gerszberg et al.
2005/0008100 A1 1/2005 Chen
2005/0078778 A1* 4/2005 Chen ........................ 375/346
2006/0013333 A1 1/2006 Chen
2006/0022747 A1 2/2006 Chen et al.
2006/0045191 A1 3/2006 Vasanth et al.
2006/0056541 A1 3/2006 Chen et al.
2007/0011716 A1* 1/2007 Koslov et al. ............... 725/135

2007/0121718 A1 5/2007 Wang et al.

FOREIGN PATENT DOCUMENTS

| | | |
|---|---|---|
| EP | 0115218 | 8/1984 |
| EP | 0222076 | 8/1986 |
| EP | 0238822 | 9/1987 |
| EP | 0356096 | 2/1990 |
| EP | 0491668 A2 | 6/1992 |
| EP | 0874474 A2 | 10/1998 |
| EP | 0929164 | 7/1999 |
| EP | 1011245 | 6/2000 |
| EP | 1065854 | 1/2001 |
| EP | 1335512 | 8/2003 |
| FR | 2696295 | 4/1994 |
| FR | 2724522 | 3/1996 |
| JP | 2-5631 | 1/1990 |
| JP | 2-95033 | 4/1990 |
| JP | 5-41683 | 2/1993 |
| JP | 5-114878 | 5/1993 |
| JP | 5-252084 | 9/1993 |
| JP | 07-38615 | 2/1995 |
| JP | 2001-244832 | 9/2001 |
| JP | 2002118611 | 4/2002 |
| KR | 2001 0019997 | 3/2001 |
| WO | WO 99/020001 | 4/1999 |
| WO | WO 99/23718 | 5/1999 |
| WO | 1999033203 | 7/1999 |
| WO | 0079753 A1 | 12/2000 |
| WO | 0113532 A1 | 2/2001 |
| WO | WO 01/19013 | 3/2001 |
| WO | WO 01/39455 | 5/2001 |
| WO | WO 01/39456 | 5/2001 |
| WO | WO 01/80471 | 10/2001 |
| WO | WO 02/073817 | 9/2002 |
| WO | WO 03/105375 | 12/2003 |
| WO | WO 2005/074171 | 8/2005 |
| WO | WO 2005/086444 | 9/2005 |

OTHER PUBLICATIONS

Wolcott, Ted J. et al.; "Uplink-Noise Limited Satellite Channels"; IEEE 1995; pp. 717-721; XP-00580915.

Seskar, Ivan et al.; "Implementation Aspects for Successive Interface Cancellation in DS/CDMA Systems"; Wireless Networks; 1998; pp. 447-452.

Earth Station Technology; 1986; pp. 404-412; XP-002248387.

Janssen, G.J.M; Slimane, S.B.: "Performance of a Multiuser Detector for M-PSK Signals Based on Successive Cancellation", ICC 2001, 2001 IEEE International Conference on Communications, Conference Record, Helsinky, Finland, Jun. 11-14, 2001, XP010552960.

Slimane, S.B.; Janssen, G.J.M.: "Power Optimization of M-PSK Cochannel Signals for a Narrowband Multiuser Detector", 2001 IEEE Pacific Rim Conference on Communications, Computer and Signal Processing, Victoria, B.C., Canada, Aug. 26-28, 2001, XP010560334.

Soong, A.C.K.; Krzymien, W.A.: "Performance of a Reference Symbol Assisted Multistage Successive Interference Cancelling Receiver in a Multicell CDMA Wireless System", Conference Record, Communication Theory Mini-Conference GlobeCom '95, IEEE Singapore Nov. 13-17, 1995, XP010159490.

Arslan, H; Molnar, K: "Iterative Co-channel Interference Cancellation in Narrowband Mobile Radio Systems", Emerging Technologies Symposium: Broadband, Wireless Internet Access, 2000 IEEE Apr. 10-11, 2000, Piscataway, New Jersey, US, XP010538900.

Chen, Ernest et al.; "DVB-S2 Backward-Compatible Modes: A Bridge Between the Present and the Future"; International Journal of Satellite Communications and Networking; vol. 22, Issue 3, pp. 341-365; published 2004 by John Wiley & Sons, Ltd.

Palicot, J., Veillard, J.; "Possible Coding and Modulation Approaches to Improve Service Availability for Digital HDTV Satellite Broadcasting at 22 GHz"; IEEE Transactions on Consumer Electronics; vol. 39, Issue 3; Aug. 1993; pp. 660-667.

U.S. Appl. No. 10/693,135, filed Oct. 24, 2003, Chen, Notice of Allowance Date Jun. 20, 2007.

U.S. Appl. No. 10/532,632, filed Apr. 25, 2003, Chen et al, Notice of Allowance Date Jul. 29, 2007.

Scott, R. P. et al.; Ultralow Phase Noise Ti:sapphire Laser Rivals 100 MHz Crystal Oscillator; Nov. 11-15, 2001; IEEE-Leos; pp. 1-2.

Combarel, L. et al.; HD-SAT Modems for the Satellite Broadcasting in the 20 GHz Frequency Band; IEEE Transactions on Consumer Electronics; vol. 41, Issue 4; Nov. 1995; pp. 991-999.

Meyr, Heinrich et al.; "Digital Communication Receivers: Synchronization, Channel Estimation, and Signal Processing"; 1998, John Wiley & Sons, Inc.; pp. 212-213 and 217-218; XP002364874.

Meyr, Heinrich et al.; "Digital Communication Receivers: Synchronization, Channel Estimation, and Signal Processing"; 1998, John Wiley & Sons, Inc.; pp. 610-612; XP002364876.

Mazzini, Gianluca: "Power Division Multiple Access", Universal Personal Communications, 1998, ICUPC 1998, IEEE 1998, International Conference on Florence, Italy, Oct. 5-9, 1998, New York, NY, US, IEEE, US Oct. 5, 1998, pp. 543-546, XP010314962 ISBN: 0-7803-5106-1.

Saleh, A.A.M. et al.: "Adaptive Linearization of Power Amplifiers in Digital Radio Systems", Bell System Technical Journal, American Telephone and Telegraph Co., New York, US, vol. 62, No. 4, Part 1, Apr. 1, 1983, pp. 1019-1033, XP002028354.

Ramchandran, Kannan et al.: Multiresolution Broadcast for Digital HDTV Using Joint Source/Channel Coding, IEEE, vol. 11, No. 1, Jan. 1993, pp. 6-22.

Fang, Thomas T. et al.; "Fourth-Power Law Clock Recovery with Prefiltering"; Proceedings of the International Conference on Communications (ICC); Geneva; May 23-26, 1993; New York; IEEE; US; vol. 3; May 23, 1993; pp. 811-815 XP010137089, ISBN: 0-7803-0950-2; Section I, Introduction.

U.S. Appl. No. 10/519,375, filed Dec. 22, 2004, Ernest C. Chen, Non-final Communication dated Dec. 27, 2007.

U.S. Appl. No. 10/913,927, filed Aug. 5, 2004, Ernest C. Chen, Non-final Communication dated Dec. 11, 2007.

U.S. Appl. No. 11/619,173, filed Jan. 2, 2007, Ernest C. Chen, Non-final Communication dated Nov. 15, 2007.

U.S. Appl. No. 10/532,631, filed Apr. 25, 2005, Paul R. Anderson, Non-final Communication dated Nov. 19, 2007.

U.S. Appl. No. 10/691,032, filed Oct. 22, 2003, Weizheng Wang, Non-final Communication dated Nov. 16, 2007.

U.S. Appl. No. 10/519,322, filed Dec. 23, 2004, Ernest C. Chen, Notice of Allowance dated Dec. 11, 2007.

U.S. Appl. No. 10/532,619, filed Apr. 25, 2005, Ernest C. Chen, Notice of Allowance dated Dec. 26, 2007.

U.S. Appl. No. 11/603,776, filed Nov. 22, 2006, Ernest C, Chen, Notice of Allowance dated Jan. 2, 2008.

U.S. Appl. No. 10/692,539, filed Oct. 24, 2003, Ernest C. Chen, Non-final Communication dated May 31, 2007.

U.S. Appl. No. 10/692,539, filed Oct. 24, 2003, Ernest C. Chen, Notice of Allowance dated Sep. 20, 2007.

U.S. Appl. No. 10/532,632, filed Apr. 25, 2005, Ernest C. Chen, Notice of Allowance dated Jan. 7, 2008.

EPO Communication dated Feb. 26, 2008 in European counterpart application No. 04256234.8 of corresponding U.S. Appl. No. 10/962,346, filed Oct. 8, 2004 by Ernest Chen.

Arslan, Huseyin and Molnar, Karl; "Co-channel Interference Cancellation with Successive Cancellation in Narrowband TDMA Systems"; Wireless Communications and Networking Conference; 2000 IEEE; Sep. 23-28, 2000; Piscataway, New Jersey, USA; vol. 3; pp. 1070-1074; XP010532692; ISBN: 0-7803-6596-8.

Non-final Communication dated Mar. 3, 2008 in U.S. Appl. No. 11/656,662, filed Jan. 22, 2007 by Ernest C. Chen et al.

Notice of Allowance dated Mar. 25, 2008 in U.S. Appl. No. 11/653,517, filed Jan. 16, 2007 by Ernest C. Chen.

EPO Communication dated Mar. 11, 2008 in European counterpart Application No. 03777694.5 of corresponding U.S. Appl. No. 10/532,509, filed Oct. 17, 2003 by Ernest Chen et al., now issued as Patent No. 7,230,480.

EPO Communications dated Mar. 7, 2008 in European counterpart Application No. 03742393.6 of corresponding U.S. Appl. No. 10/519,375, filed Jul. 3, 2003 by Ernest Chen et al.

Canadian Office Action dated Sep. 12, 2007 in Canadian counterpart Application No. 2491259 of corresponding U.S. Appl. No. 10/519,375, filed Jul. 3, 2003 by Ernest Chen et al.

Norwegian Office Action dated Nov. 15, 2007 in Norwegian counterpart Application No. 20026115 of corresponding U.S. Appl. No. 09/844,401, filed Apr. 27, 2001 by Ernest Chen, now issued as Patent No. 7,209,524.

EPO Communication dated Aug. 3, 2007 in European counterpart Application No. 03794510.2 of corresponding U.S. Appl. No. 10/236,414, filed Sep. 6, 2002 by Ernest Chen et al.

Non-final Communication dated Oct. 16, 2007 in U.S. Appl. No. 10/962,346, filed Oct. 8, 2004 by Ernest Chen.

Non-final Communication dated Apr. 1, 2007 in U.S. Appl. No. 10/961,579, filed by Ernest Chen.

Canadian Office Action dated Aug. 5, 2008 in Canadian counnterpart Application No. 2503532 corresponding to U.S. Appl. No. 10/532,509, filed Oct. 17, 2003 by Ernest C. Chen et al., now issued Jun. 12, 2007 as U.S. Patent No. 7,230,480.

Notice of Allowance dated May 6, 2008 in U.S. Appl. No. 10/532,631, filed Apr. 25, 2005 by Paul R. Anderson et al.

Notice of Allowance dated Apr. 30, 2008 in U.S. Appl. No. 11/603,776, filed Nov. 22, 2006 by Ernest Chen et al.

EPO Communication dated Apr. 4, 2008 in European counterpart Application No. 03757359.9 corresponding to U.S. Appl. No. 10/165,710, filed Jun. 7, 2002 by Ernest Chen.

Notice of Allowance dated Mar. 12, 2008 in U.S. Appl. No. 11/655,001, filed Jan. 18, 2007 by Weizheng Wang et al.

Japanese Office Action dated Mar. 4, 2008 in Japanese counterpart Application No. 2004-297297 corresponding to U.S. Appl. No. 10/962,346, filed Oct. 8, 2004 by Ernest Chen.

EPO Communication dated Feb. 26, 2008 in European counterpart Application No. 04256234.8 corresponding to U.S. Appl. No. 10/962,346, filed Oct. 8, 2004 by Ernest Chen.

EPO Communication dated Feb. 7, 2008 in European Counterpart Application No. 03742400.9 and received from European representative on Feb. 14, 2008 and corresponding to U.S. Appl. No. 10/519,322, filed Dec. 23, 2004 by Ernest Chen et al.

Notice of Allowance dated May 8, 2008 in U.S. Appl. No. 11/619,173, filed Jan. 2, 2007 by Ernest Chen et al.

Notice of Allowance dated May 6, 2008 in U.S. Appl. No. 10/532,632, filed Apr. 25, 2005 by Ernest Chen et al.

Notice of Allowance dated Apr. 21, 2008 in U.S. Appl. No. 10/519,322, filed Dec. 23, 2004 by Ernest Chen et al.

Canadian Office Action dated Nov. 29, 2007 in Canadian counterpart Application No. 2442400 corresponding to U.S. Appl. No. 09/844,401, filed Apr. 27, 2001 by Ernest Chen, now issued Apr. 27, 2007 as US Patent No. 7,209,524.

Notice of Allowance dated Jun. 2, 2008 in U.S. Appl. No. 10/691,032, filed Oct. 22, 2003 by Weizheng Wang et al.

Notice of Allowance dated Jun. 2, 2008 in U.S. Appl. No. 10/693,135, filed Oct. 24, 2003 by Ernest C. Chen.

Canadian Office Action dated Jan. 22, 2008 in Canadian counterpart Application No. 2487817 corresponding to U.S. Appl. No. 10/165,710, filed Jun. 7, 2002 by Ernest C. Chen.

Canadian Office Action dated Jan. 23, 2008 in Canadian counterpart Application No. 2484313 corresponding to U.S. Appl. No. 10/962,346, filed Oct. 8, 2004 by Ernest C. Chen.

Canadian Office Action dated Feb. 5, 2008 in Canadian counterpart Application No. 2503530 corresponding to U.S. Appl. No. 10/532,632, filed Apr. 25, 2005 by Ernest C. Chen et al.

Canadian Office Action dated Feb. 27, 2008 in Canadian counterpart Application No. 2515167 corresponding to U.S. Appl. No. 10/913,927, filed Aug. 5, 2004 by Ernest C. Chen.

Canadian Office Action dated Apr. 22, 2008 in Canadian counterpart Application No. 2502924 corresponding to U.S. Appl. No. 10/532,619, filed Apr. 25, 2005 by Ernest C. Chen.

EPO Summons to attend Oral Proceedings dated Jul. 28, 2008 in European counterpart Application No. 02728894.3 corresponding to U.S. Appl. No. 09/844,401, filed Apr. 27, 2001 by Ernest Chen, now issued Apr. 24, 2007 as US Patent No. 7,209,524.

Taiwanese Office Action dated May 14, 2008 in Taiwan counterpart Application No. 092129629 corresponding to U.S. Appl. No. 10/532,631, filed Apr. 25, 2005 by Paul R. Anderson et al.

Chinese Office Action dated Aug. 22, 2008 in Chinese Patent Application No. 200410100591.6 filed Oct. 10, 2004 by Ernest Chen.

Notice of Allowance dated Jun. 13, 2008 in U.S. Appl. No. 10/532,524, filed Apr. 25, 2005 by Ernest C. Chen et al.

Non-Final Office Action dated Jun. 17, 2008 in U.S. Appl. No. 10/913,927, filed Aug. 5, 2004 by Ernest C. Chen.

European Search Report and Search Opinion dated Jun. 13, 2008 in European counterpart Application No. 07075745.5 corresponding to U.S. Appl. No. 09/844,401 filed Apr. 27, 2001 by Ernest C. Chen, now issued Apr. 24, 2007 as US Patent No. 7,209,524.

El-Gamal, Abbas and Cover, Thomas M.; "Multiple User Information Theory"; Proceedings of IEEE; vol. 68, No. 12; Dec. 1980; pp. 1466-1483; XP007904837.

Scalart, Pascal; Leclerc, Michel; Fortier, Paul; Huynh Huu Tue; "Performance Analysis of a COFDM/FM In-band Digital Audio Broadcasting System"; IEEE Transactions on Broadcasting, IEEE Service Center; Piscataway, New Jersy, USA; vol. 43, No. 2; Jun. 1, 1997; pp. 191-198; XP011006070.

Arslan, Huseyin and Molnar, Karl; "Successive Cancellation of Adjacent Channel Signals in FDMA/TDMA Digital Mobile Radio Systems"; Vehicular Technology Conference; 48th IEEE VTC; Ottawa, Canada; May 18-21, 1998; New York, New York, USA; vol. 3; May 18, 1998; pp. 1720-1724; XP010288123.

Final Rejection dated Jun. 24, 2008 in U.S. Appl. No. 10/519,375, filed Dec. 22, 2004 by Ernest C. Chen et al.

Combarel, L. and Lavan, E.; "HD-SAT (Race 2075): HDTV Broadcasting over KA-Band Satellite, Cable and MMDS"; International Broadcasting Convention; 1994; pp. 633-640; XP006505143.

EPO Communication dated May 6, 2008 in European counterpart Application No. 03774848.0 corresponding to U.S. Appl. No. 10/532,582, filed Apr. 25, 2005 by Ernest C. Chen et al., now issued Feb. 6, 2007 as US Patent No. 7,173,977.

EPO Communication dated May 6, 2008 in European counterpart Application No. 03777627.5 corresponding to U.S. Appl. No. 10/532,619, filed Apr. 25, 2005 by Ernest C. Chen.

Notice of Allowance dated May 22, 2008 in U.S. Appl. No. 10/532,619, filed Apr. 25, 2005 by Ernest C. Chen.

Final Rejection dated Sep. 9, 2008 in U.S. Appl. No. 11/656,662, filed Jan. 22, 2007 by Ernest C. Chen et al.

Notice of Allowance dated Oct. 23, 2008 in U.S. Appl. No. 10/961,579 filed Oct. 8, 2004 by Ernest C. Chen.

EPO Communication dated Oct. 17, 2008 in European Patent Application No. 03774848.0 filed Oct. 15, 2003 by Ernest Chen et al.

EPO Communication dated Nov. 18, 2008 in European Patent Application No. 03742393.6 filed Jul. 3, 2003 by Ernest Chen et al.

Notice of Allowance dated Dec. 2, 2008 in U.S. Appl. No. 11/656,662 filed Jan. 22, 2007 by Ernest C. Chen et al.

Non-final Office Action dated Dec. 3, 2008 in U.S. Appl. No. 10/913,927 filed Aug. 5, 2004 by Ernest Chen.

Non-final Office Action dated Dec. 18, 2008 in U.S. Appl. No. 12/176,533 filed Jul. 21, 2008 by Ernest C. Chen et al.

* cited by examiner

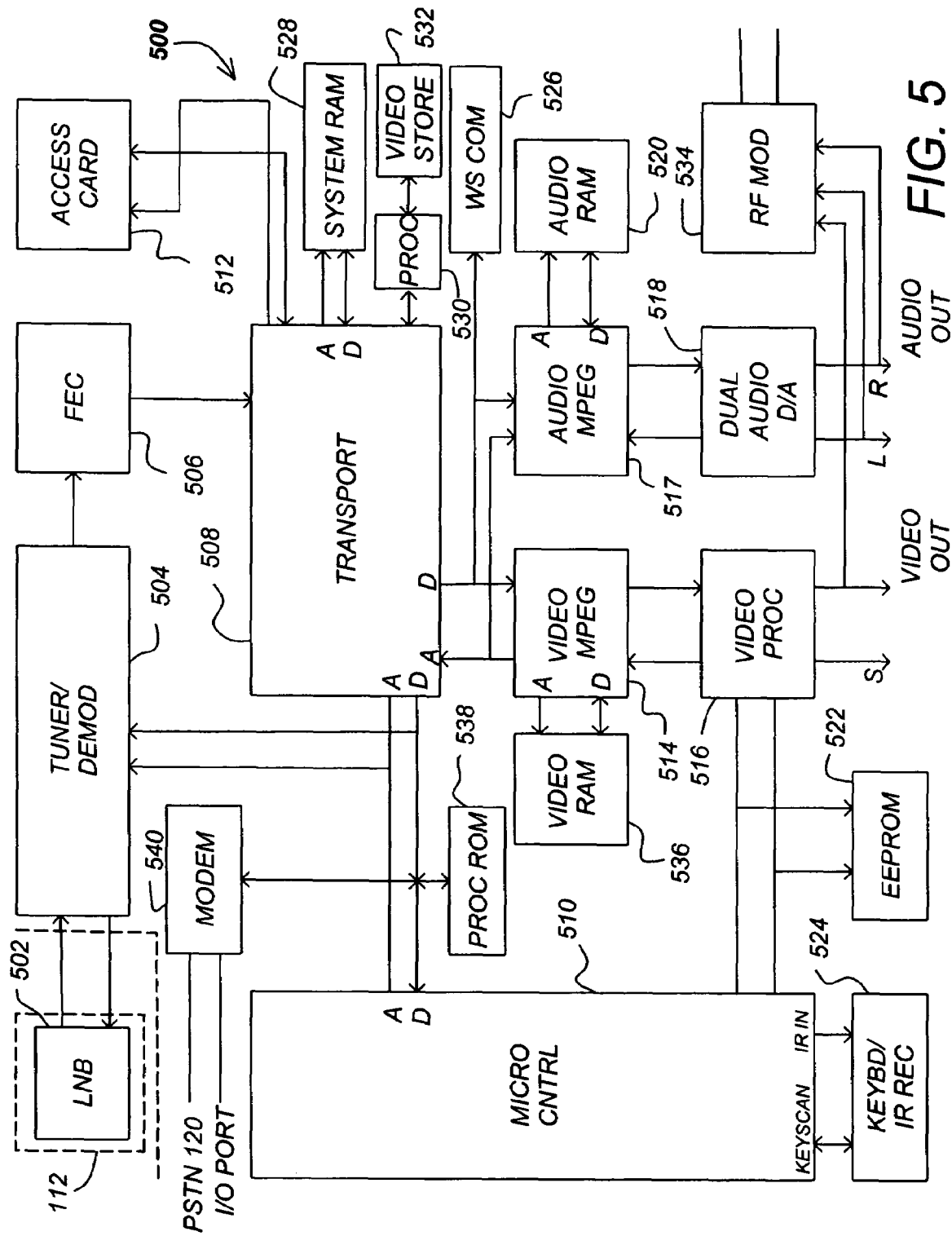

AM/PM Estimation Quality

Averaged AM/PM for Segment :1

COHERENT AVERAGING FOR MEASURING TRAVELING WAVE TUBE AMPLIFIER NONLINEARITY

CROSS-REFERENCE TO RELATED APPLICATIONS

This is a continuation-in-part application and claims the benefit under 35 U.S.C. §120 of the following co-pending and commonly-assigned utility patent applications, which are incorporated by reference herein:

Utility application Ser. No. 09/844,401, filed Apr. 27, 2001 now U.S. Pat. No. 7,209,524, by Ernest C. Chen, entitled "LAYERED MODULATION FOR DIGITAL SIGNALS"; and U.S. application Ser. No. 10/165,710, filed on Jun. 7, 2002, by Ernest C. Chen, entitled "SATELLITE TWTA ON-LINE NON-LINEARITY MEASUREMENT".

PCT International Patent Application Serial No. PCT/US03/33130, filed on Oct. 17, 2003, by Ernest C. Chen and Shamik Maitra, entitled "ESTIMATING THE OPERATING POINT ON A NONLINEAR TRAVELING WAVE TUBE AMPLIFIER".

This application claims the benefit under 35 U.S.C. §119 (e) of the following U.S. Provisional Patent Applications, which are incorporated by reference herein:

U.S. Provisional Patent Application No. 60/510,368, filed on Oct. 10, 2003, by Ernest C. Chen, entitled "IMPROVING TWTA AM-AM AND AM-PM MEASUREMENT".

BACKGROUND OF THE INVENTION

1. Field of the Invention

The present invention relates to systems and methods for transmitting data, and in particular to a system and method for improving traveling wave tube amplifier curve measurements using coherent averaging.

2. Description of the Related Art

Digital signal communication systems have been used in various fields, including digital TV signal transmission, either terrestrial or satellite. As the various digital signal communication systems and services evolve, there is a burgeoning demand for increased data throughput and added services. However, it is more difficult to implement either improvement in old systems or new services when it is necessary to replace existing legacy hardware, such as transmitters and receivers. New systems and services are advantaged when they can utilize existing legacy hardware. In the realm of wireless communications, this principle is further highlighted by the limited availability of electromagnetic spectrum. Thus, it is not possible (or at least not practical) to merely transmit enhanced or additional data at a new frequency.

The conventional method of increasing spectral capacity is to move to a higher-order modulation, such as from quadrature phase shift keying (QPSK) to eight phase shift keying (8PSK) or sixteen quadrature amplitude modulation (16QAM). Unfortunately, QPSK receivers cannot demodulate conventional 8PSK or 16QAM signals. As a result, legacy customers with QPSK receivers must upgrade their receivers in order to continue to receive any signals transmitted with an 8PSK or 16QAM modulation.

It is advantageous for systems and methods of transmitting signals to accommodate enhanced and increased data throughput without requiring additional frequency. In addition, it is advantageous for enhanced and increased throughput signals for new receivers to be backwards compatible with legacy receivers. There is further an advantage for systems and methods which allow transmission signals to be upgraded from a source separate from the legacy transmitter.

It has been proposed that a layered modulation signal, transmitting non-coherently both upper and lower layer signals, can be employed to meet these needs. Such layered modulation systems allow higher information throughput with backwards compatibility. However, even when backward compatibility is not required (such as with an entirely new system), layered modulation can still be advantageous because it requires a traveling wave tube amplifier (TWTA) peak power significantly lower than that for a conventional 8PSK or 16QAM modulation format for a given throughput.

To provide a layered modulation scheme (as described in detail below), a reconstructed upper layer signal is subtracted from a received composite signal to reveal a lower layer signal. As such, the lower-layer signal performance is impacted by how closely the upper-layer signal can be reconstructed relative to the original signal. In other words, the lower layer signal performance is impacted by the fidelity of the reconstructed signal. Thus, layered modulation requires clean cancellation of the upper-layer signal to expose the lower-layer signal for further processing. Clean cancellation requires TWTA non-linearity/distortion to be accurately reproduced in the reconstruction of the upper-layer signal. On-line estimation of the required TWTA characteristics is imperative in minimizing the required TWTA power and the complexity of satellite operation. In addition, the non-linearity measurement may be used to monitor the health of satellite TWTAs and perform other communications diagnostics. However, such an accurate reproduction and knowledge of the TWTA non-linearity presents a significant roadblock.

With a TWTA, there is a region of approximate linearity, in which the output power is nearly proportional to the input power, followed by a curved transition to a point where the output power levels off and reaches a maximum. At this point (i.e., when the TWTA curve is well in the non-linear region), the amplifier is said to have reached saturation. Due to this non-linearity and to avoid intermodulation, the input power is often "backed off" by a particular amount (e.g., 6 dB). The resulting point on the curve after the input power is "backed off" is referred to as the operating point of the TWTA. When subsequently reconstructing the upper layer signal, the amount of distortion/non-linearity used to create the original signal serves to increase the fidelity of the reconstructed signal. Thus, to produce a high fidelity reconstructed upper layer signal, knowledge of the non-linearity (and the operating point) is important. Accordingly, the inclusion of (or taking into account) TWTA non-linearity may improve upper-layer signal cancellation ratio by 10 dB or more (the cancellation ratio is the ratio between non-linearity-induced noise before and after cancellation is improved).

Errors in the estimation of the operating point can have a significant impact when reconstructing the upper layer-signal. The impact of amplitude (AM-AM [amplitude modulation to amplitude modulation]) and phase (AM-PM [amplitude modulation to phase modulation]) nonlinearity due to operating point errors may be individually analyzed based on shift analysis. Individual impacts may then be combined for total impact. To evaluate performance impacts, the synthesis of a layer-modulated signal with known TWTA non-linearity and system/representative operating CNR (carrier to noise ratio) may be used. The upper-layer cancellation error may then be calculated for each amount of simulated operating point error in the signal reconstruction process. Thus, the upper layer cancellation ratio may be plotted against the operating point displacement. The cancellation error can then be converted into an amount of lower-layer CNR degradation, which increases the CNR required for signals of both upper and lower layers. Such an increased CNR illustrates the impact of operating point estimation errors.

FIGS. 14A and 14B illustrate the impact of operating point errors in signal reconstruction with an example AM-AM and AM-PM nonlinearity. In FIGS. 14A and 14B, the sensitivity of signal reconstruction error is plotted against the TWTA input operating point error. The effective noise is calculated as a measure of signal reconstruction error.

In FIG. 14A, a set of generic TWTA non-linearity curves are used. The signal reconstruction process is assumed to have full knowledge about the non-linearity curves but is otherwise uncertain about the operating point. The performance plots of FIG. 14A indicate that cancellation errors are below −25 dB for an input operating point error up to about +/−1 dB.

In FIG. 14B, the performance plots are based on the same TWTA non-linearity but with an input backoff of 8 dB. With such an input backoff, the linearity is improved and is less susceptible to TWTA operating point error. As a result, reconstruction and cancellation errors are greatly reduced as indicated in FIG. 14B. The effective noise is below −33 dB with the same input operating error up to about +/−1 dB as in FIG. 14A.

Accordingly, there is a need for systems and methods for implementing layered modulation systems that accurately determine TWTA non-linearity and the operating point.

In the prior art, TWTA non-linearity measurements are performed on the ground before a satellite is launched. The TWTA operating point is then obtained from telemetry tracking and control (TT&C) commands that set the operating point of the TWTA (the procedure assumes that TWTA characteristics have little changed since the satellite was launched). In other words, the operating point set by TT&C commands during pre-launch measurements is used post-launch after receiving the signals from the satellite. However, TWTA characteristics including the non-linearity and the effective operating point may change over time (including after satellite launch) and temperature. In this regard, the upper-layer signal cancellation in layered modulation may not be as accurately done without non-linearity updates.

Another prior art method is to estimate the non-linearity by trial and error, hoping to converge to a required accuracy within a reasonable effort and cost.

Accordingly, what is needed is a system and method for accurately determining the non-linearity of a TWTA as it changes over time/temperature. Further, what is desired is the capability to make such determinations at any time, from anywhere within the satellite downlink footprint, automatically and accurately. The present invention meets this need and provides further advantages as detailed hereafter.

SUMMARY OF THE INVENTION

To address the requirements described above, the present invention discloses a method and apparatus for using coherent averaging for measuring traveling wave tube amplifier (TWTA) nonlinearity. In this regard, the invention aids in the accurate extraction of a lower-layer signal in a layered modulation scheme. Such an accurate extraction minimizes the amounts of power required for both layers of a signal and also helps to monitor the health of a TWTA.

To measure the non-linearity of the TWTA, the measurement procedure begins with capturing a received signal and generating an ideal signal that is noiseless and without TWTA nonlinearity. The ideal signal may be generated by re-encoding and re-modulating the symbols decoded with quasi-error-free (QEF) performance. The ideal signal represents the input to the TWTA and the captured signal represents the output of the TWTA plus downlink noise and other impairments. The two signals are aligned sample-for-sample by the timing recovery loop of a demodulator. Data pairs are then formed for all corresponding samples. Data sorting sorts the data pairs to the powers/magnitudes of the ideal signal samples.

After data sorting, the averaging process of the invention coherently adds a given number (representing the averaging ratio) of adjacent TWTA input signals to reduce the noise (i.e., thereby effectively increasing the CNR). The same process is performed on the TWTA output signal. The averaging ratio to be used depends on the signal CNR and on the quality of the non-linearity measurement that is required for a given application.

The presence of filters along the signal path before the data is collected may reduce the accuracy of the estimate. Accordingly, inverse filtering and equalization may be used to undo the filtering effect so that a full TWTA non-linearity may be restored for most accurate measurements.

BRIEF DESCRIPTION OF THE DRAWINGS

Referring now to the drawings in which like reference numbers represent corresponding parts throughout:

FIG. 5 is a block diagram of an integrated receiver/decoder;

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

1. Overview

The invention provides a method of determining/estimating on-line non-linearity measurements of a TWTA. A coherent averaging technique maximizes processing gains for best TWTA AM-AM and AM-PM measurement accuracy. The technique does not create a measurement floor in the low carrier-to-noise ratio (CNR) region that biases the estimate. Allowing current TWTA non-linearity to be measured for compensation from layer-modulated signals provides for continuous layered modulation operation without service disruptions and with best CNR performance. Additionally, a system design option is available for individual receivers to generate non-linearity curves locally, thereby eliminating the need to transmit the curves from the broadcast center.

In addition to the above, an equalizer and/or inverse filter may be used to restore part of the TWTA non-linearity that is non-observable because of linear filters along the signal path.

2. Video Distribution System

Figure 1:
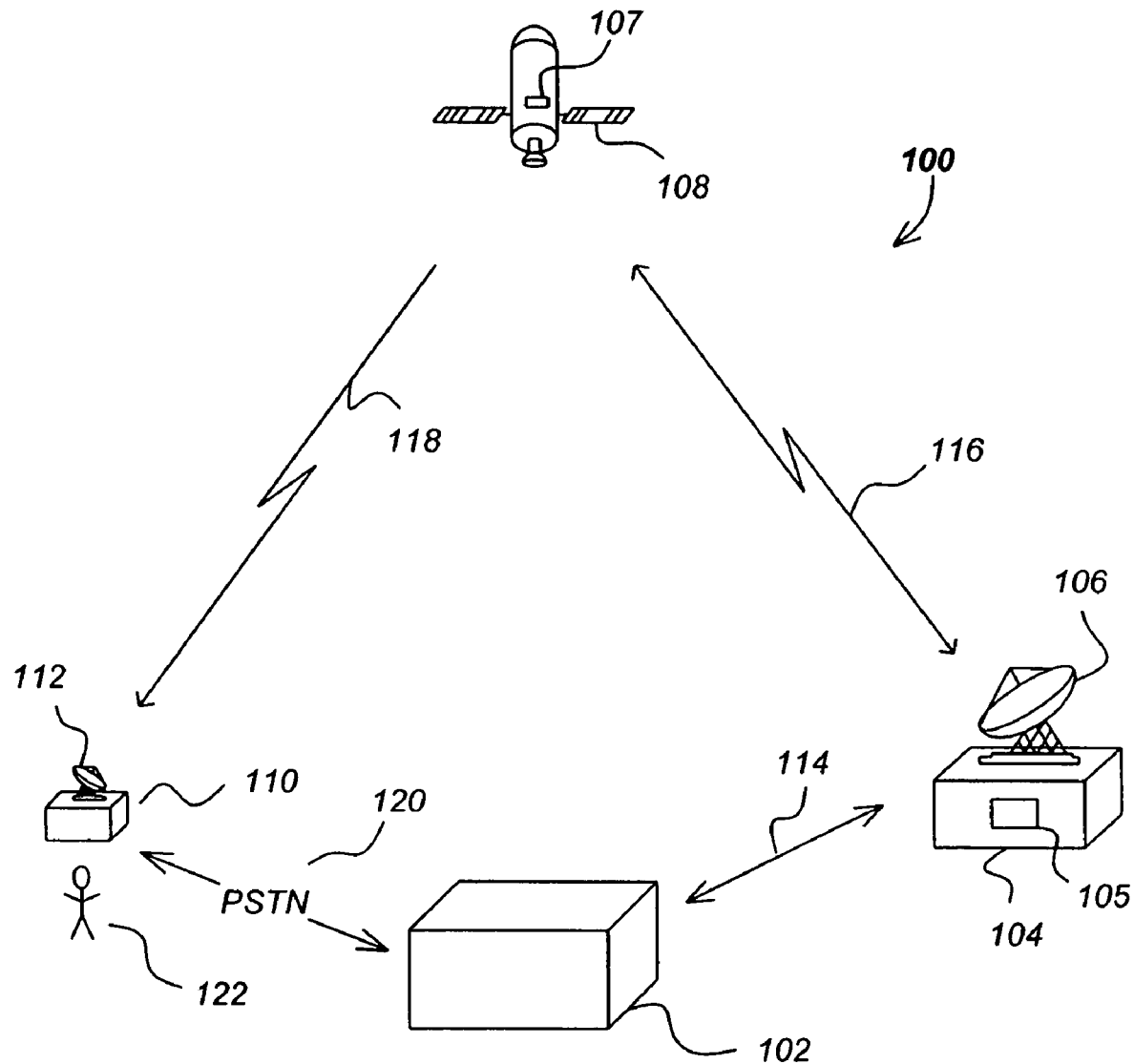
FIG. 1 is a diagram illustrating an overview of a single satellite video distribution system.

FIG. 1 is a diagram illustrating an overview of a single satellite video distribution system 100. The video distribution system 100 comprises a control center 102 in communication with an uplink center 104 via a ground or other link 114 and with a subscriber receiver station 110 via a public switched telephone network (PSTN) or other link 120. The control center 102 provides program material (e.g. video programs, audio programs and data) to the uplink center 104 and coordinates with the subscriber receiver stations 110 to offer, for example, pay-per-view (PPV) program services, including billing and associated decryption of video programs.

The uplink center 104 receives program material and program control information from the control center 102, and using an uplink antenna 106 and transmitter 105, transmits the program material and program control information to the satellite 108 via uplink signal 116. The satellite receives and processes this information, and transmits the video programs and control information to the subscriber receiver station 110 via downlink signal 118 using transmitter 107. The subscriber receiving station 110 receives this information using the outdoor unit (ODU) 112, which includes a subscriber antenna and a low noise block converter (LNB).

In one embodiment, the subscriber receiving station antenna is an 18-inch slightly oval-shaped Ku-band antenna. The slight oval shape is due to the 22.5 degree offset feed of the LNB (low noise block converter) which is used to receive signals reflected from the subscriber antenna. The offset feed positions the LNB out of the way so it does not block any surface area of the antenna minimizing attenuation of the incoming microwave signal.

The video distribution system 100 can comprise a plurality of satellites 108 in order to provide wider terrestrial coverage, to provide additional channels, or to provide additional bandwidth per channel. In one embodiment of the invention, each satellite comprises 16 transponders to receive and transmit program material and other control data from the uplink center 104 and provide it to the subscriber receiving stations 110. Using data compression and multiplexing techniques the channel capabilities, two satellites 108 working together can receive and broadcast over 150 conventional (non-HDTV) audio and video channels via 32 transponders.

While the invention disclosed herein will be described with reference to a satellite-based video distribution system 100, the present invention may also be practiced with terrestrial-based transmission of program information, whether by broadcasting means, cable, or other means. Further, the different functions collectively allocated among the control center 102 and the uplink center 104 as described above can be reallocated as desired without departing from the intended scope of the present invention.

Although the foregoing has been described with respect to an embodiment in which the program material delivered to the subscriber 122 is video (and audio) program material such as a movie, the foregoing method can be used to deliver program material comprising purely audio information or other data as well.

2.1 Uplink Configuration

Figure 2:
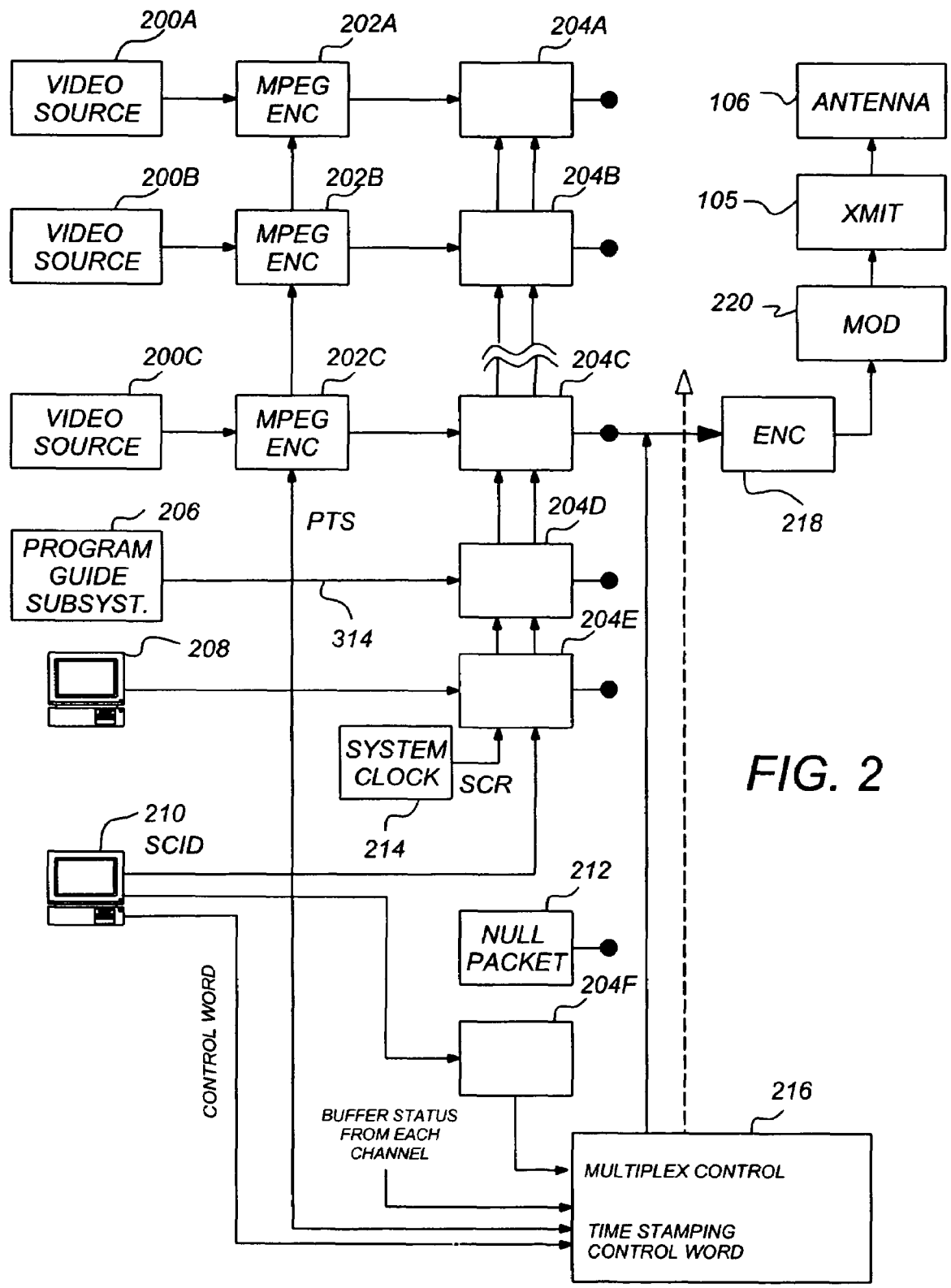
FIG. 2 is a block diagram showing a typical uplink configuration for a single satellite transponder.

FIG. 2 is a block diagram showing a typical uplink configuration for a single satellite 108 transponder, showing how video program material is uplinked to the satellite 108 by the control center 102 and the uplink center 104. FIG. 2 shows three video channels (which may be augmented respectively with one or more audio channels for high fidelity music, soundtrack information, or a secondary audio program for transmitting foreign languages), a data channel from a program guide subsystem 206 and computer data information from a computer data source 208.

The video channels are provided by a program source 200A-200C of video material (collectively referred to hereinafter as program source(s) 200). The data from each program source 200 is provided to an encoder 202A-202C (collectively referred to hereinafter as encoder(s) 202). Each of the encoders accepts a program time stamp (PTS) from the controller 216. The PTS is a wrap-around binary time stamp that is used to assure that the video information is properly synchronized with the audio information after encoding and decoding. A PTS time stamp is sent with each I-frame of the MPEG encoded data.

In one embodiment of the present invention, each encoder 202 is a second generation Motion Picture Experts Group (MPEG-2) encoder, but other decoders implementing other coding techniques can be used as well. The data channel can be subjected to a similar compression scheme by an encoder (not shown), but such compression is usually either unnecessary, or performed by computer programs in the computer data source (for example, photographic data is typically compressed into *.TIF files or *.JPG files before transmission). After encoding by the encoders 202, the signals are converted into data packets by a packetizer 204A-204F (collectively referred to hereinafter as packetizer(s) 204) associated with each program source 200.

The data packets are assembled using a reference from the system clock 214 (SCR), and from the conditional access manager 210, which provides the service channel identifier (SCID) to the packetizers 204 for use in generating the data packets. These data packets are then multiplexed into serial data and transmitted.

2.2 Broadcast Data Stream Format and Protocol

Figure 3A:
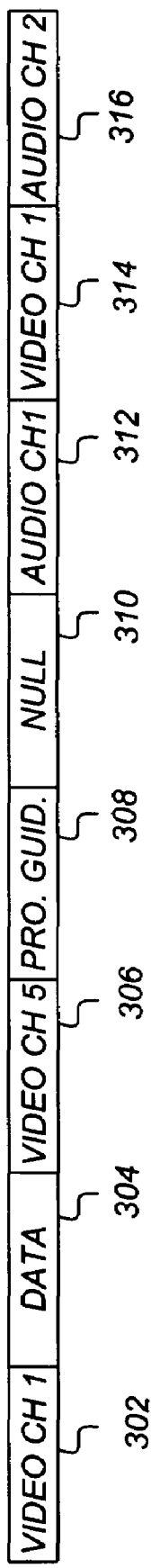
FIG. 3A is a diagram of a representative data stream.

FIG. 3A is a diagram of a representative data stream. The first packet segment 302 comprises information from video channel 1 (data coming from, for example, the first video program source 200A). The next packet segment 304 comprises computer data information that was obtained, for example from the computer data source 208. The next packet segment 306 comprises information from video channel 5 (from one of the video program sources 200). The next packet segment 308 comprises program guide information such as the information provided by the program guide subsystem 206. As shown in FIG. 3A, null packets 310 created by the null packet module 212 may be inserted into the data stream as desired followed by further data packets 312, 314, 316 from the program sources 200.

The data stream therefore comprises a series of packets (302-316) from any one of the data sources (e.g. program sources 200, program guide subsystem 206, computer data source 208) in an order determined by the controller 216. The data stream is encrypted by the encryption module 218, modulated by the modulator 220 (typically using a QPSK modulation scheme), and provided to the transmitter 105/222, which broadcasts the modulated data stream on a frequency bandwidth to the satellite via the antenna 106. The receiver 500 at the receiver station 110 receives these signals, and using the SCID, reassembles the packets to regenerate the program material for each of the channels.

Figure 3B:
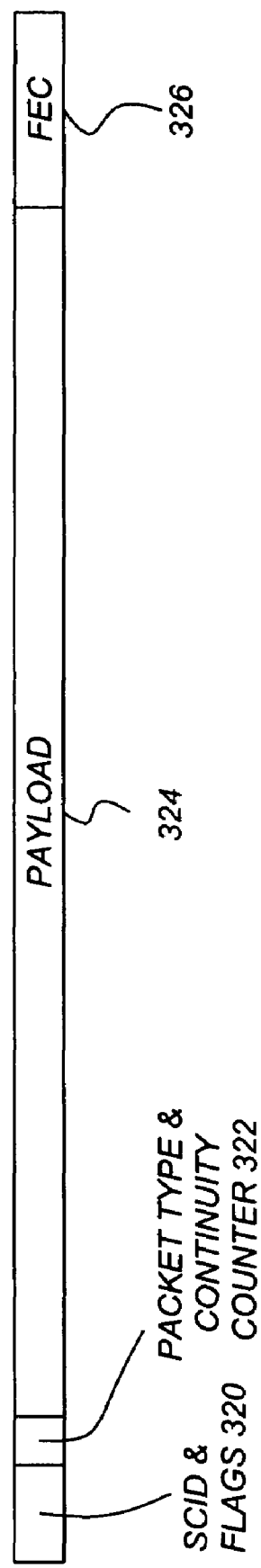
FIG. 3B is a diagram of a representative data packet.

FIG. 3B is a diagram of a data packet. Each data packet (e.g. 302-316) is 147 bytes long, and comprises a number of packet segments. The first packet segment 320 comprises two bytes of information containing the SCID and flags. The SCID is a unique 12-bit number that uniquely identifies the data packet's data channel. The flags include 4 bits that are used to control other features. The second packet segment 322 is made up of a 4-bit packet type indicator and a 4-bit continuity counter. The packet type identifies the packet as one of the four data types (video, audio, data, or null). When combined with the SCID, the packet type determines how the data packet will be used. The continuity counter increments once for each packet type and SCID. The next packet segment 324 comprises 127 bytes of payload data, which in the cases of packets 302 or 306 is a portion of the video program provided by the video program source 200. The final packet segment 326 is data required to perform forward error correction.

Figure 4:
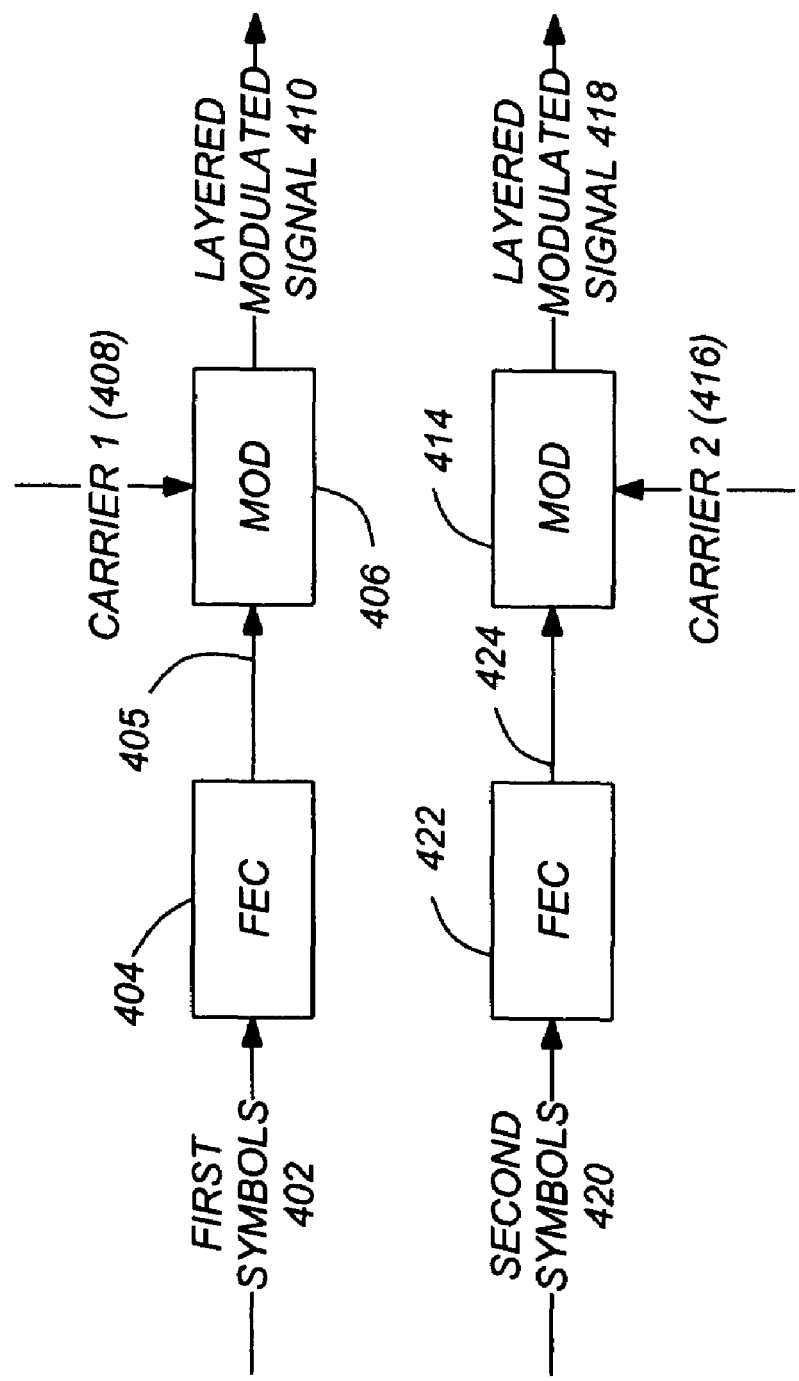
FIG. 4 is a block diagram showing one embodiment of the modulator for the uplink signal.

FIG. 4 is a block diagram showing one embodiment of the modulator 220. The modulator 220 optionally comprises a forward error correction (FEC) encoder 404 which accepts the first signal symbols 402 and adds redundant information that are used to reduce transmission errors. The coded symbols 405 are modulated by modulator 406 according to a first carrier 408 to produce an upper layer modulated signal 410. Second symbols 420 are likewise provided to an optional second FEC encoder 422 to produce coded second symbols 424. The coded second symbols 424 are provided to a second modulator 414, which modulates the coded second symbols 424 according to a second carrier 416 to produce a lower layer modulated signal 418. The upper layer modulated signal 410 and the lower layer modulated signal 418 are therefore uncorrelated. Thus, the upper layer signal 410 and the lower layer signal 418 can be transmitted to separate transponders on one or more satellites 108 via separate uplink signals 116. Thus, the lower layer signal 418 can be implemented from a separate satellite 108 that receives a separate uplink signal 116. However, in the downlink signal 118 the upper layer signal 410, must be a sufficiently greater amplitude signal than the lower layer signal 418, to maintain the signal constellations shown in FIG. 6 and FIG. 7.

It should be noted that it may be more efficient to retrofit an existing system by using a transponder on a separate satellite 108 to transmit the lower layer downlink signal over the existing legacy downlink signal rather than replacing the legacy satellite with one that will transmit both downlink signal layers. Emphasis can be given to accommodating the downlink legacy signal in implementing a layered downlink broadcast.

2.3 Integrated Receiver/Decoder

FIG. 5 is a block diagram of an integrated receiver/decoder (IRD) 500 (also hereinafter alternatively referred to as receiver 500). The receiver 500 comprises a tuner/demodulator 504 communicatively coupled to an ODU 112 having one or more low noise blocks (LNBs) 502. The LNB 502 converts the 12.2 to 12.7 GHz downlink 118 signal from the satellites 108 to, e.g., a 950-1450 MHz signal required by the IRD's 500 tuner/demodulator 504. Typically, the LNB 502 may provide either a dual or a single output. The single-output LNB 502 has only one RF connector, while the dual output LNB 502 has two RF output connectors and can be used to feed a second tuner 504, a second receiver 500, or some other form of distribution system.

The tuner/demodulator 504 isolates a single, digitally modulated 24 MHz transponder signal, and converts the modulated data to a digital data stream. Further details regarding the demodulation of the received signal follow.

The digital data stream is then supplied to a forward error correction (FEC) decoder 506. This allows the IRD 500 to reassemble the data transmitted by the uplink center 104 (which applied the forward error correction to the desired signal before transmission to the subscriber receiving station 110) verifying that the correct data signal was received, and correcting errors, if any. The error-corrected data may be fed from the FEC decoder module 506 to the transport module 508 via an 8-bit parallel interface.

The transport module 508 performs many of the data processing functions performed by the IRD 500. The transport module 508 processes data received from the FEC decoder module 506 and provides the processed data to the video MPEG decoder 514 and the audio MPEG decoder 517. As needed the transport module employs system RAM 528 to process the data. In one embodiment of the present invention, the transport module 508, video MPEG decoder 514 and audio MPEG decoder 517 are all implemented on integrated circuits. This design promotes both space and power efficiency, and increases the security of the functions performed within the transport module 508. The transport module 508 also provides a passage for communications between the microcontroller 510 and the video and audio MPEG decoders 514, 517. As set forth more fully hereinafter, the transport module also works with the conditional access module (CAM) 512 to determine whether the subscriber receiving station 110 is permitted to access certain program material. Data from the transport module 508 can also be supplied to external communication module 526.

The CAM 512 functions in association with other elements to decode an encrypted signal from the transport module 508. The CAM 512 may also be used for tracking and billing these services. In one embodiment of the present invention, the CAM 512 is a removable smart card, having contacts cooperatively interacting with contacts in the IRD 500 to pass information. In order to implement the processing performed in the CAM 512, the IRD 500, and specifically the transport module 508 provides a clock signal to the CAM 512.

Video data is processed by the MPEG video decoder 514. Using the video random access memory (RAM) 536, the MPEG video decoder 514 decodes the compressed video data and sends it to an encoder or video processor 516, which converts the digital video information received from the video MPEG module 514 into an output signal usable by a display or other output device. By way of example, processor 516 may comprise a National TV Standards Committee (NTSC) or Advanced Television Systems Committee (ATSC) encoder. In one embodiment of the invention both S-Video and ordinary video (NTSC or ATSC) signals are provided. Other outputs may also be utilized, and are advantageous if high definition programming is processed.

Audio data is likewise decoded by the MPEG audio decoder 517. The decoded audio data may then be sent to a digital to analog (D/A) converter 518. In one embodiment of the present invention, the D/A converter 518 is a dual D/A converter, one for the right and left channels. If desired, additional channels can be added for use in surround sound processing or secondary audio programs (SAPs). In one embodiment of the invention, the dual D/A converter 518 itself separates the left and right channel information, as well as any additional channel information. Other audio formats may similarly be supported. For example, other audio formats such as multi-channel DOLBY DIGITAL AC-3 may be supported.

A description of the processes performed in the encoding and decoding of video streams, particularly with respect to MPEG and JPEG encoding/decoding, can be found in Chapter 8 of "Digital Television Fundamentals," by Michael Robin and Michel Poulin, McGraw-Hill, 1998, which is hereby incorporated by reference herein.

The microcontroller 510 receives and processes command signals from the remote control 524, an IRD 500 keyboard interface, and/or another input device. The microcontroller 510 receives commands for performing its operations from a processor programming memory, which permanently stores such instructions for performing such commands. The processor programming memory may comprise a read only memory (ROM) 538, an electrically erasable programmable read only memory (EEPROM) 522 or, similar memory device. The microcontroller 510 also controls the other digital devices of the IRD 500 via address and data lines (denoted "A" and "D" respectively, in FIG. 5).

The modem 540 connects to the customer's phone line via the PSTN port 120. It calls, e.g. the program provider, and transmits the customer's purchase information for billing purposes, and/or other information. The modem 540 is controlled by the microprocessor 510. The modem 540 can output data to other I/O port types including standard parallel and serial computer I/O ports.

The present invention also comprises a local storage unit such as the video storage device 532 for storing video and/or audio data obtained from the transport module 508. Video storage device 532 can be a hard disk drive, a read/writable compact disc of DVD, a solid state RAM, or any other suitable storage medium. In one embodiment of the present invention, the video storage device 532 is a hard disk drive with specialized parallel read/write capability so that data may be read from the video storage device 532 and written to the device 532 at the same time. To accomplish this feat, additional buffer memory accessible by the video storage 532 or its controller may be used. Optionally, a video storage processor 530 can be used to manage the storage and retrieval of the video data from the video storage device 532. The video storage processor 530 may also comprise memory for buffering data passing into and out of the video storage device 532. Alternatively or in combination with the foregoing, a plurality of video storage devices 532 can be used. Also alternatively or in combination with the foregoing, the microcontroller 510 can also perform the operations required to store and or retrieve video and other data in the video storage device 532.

The video processing module 516 input can be directly supplied as a video output to a viewing device such as a video or computer monitor. In addition, the video and/or audio outputs can be supplied to an RF modulator 534 to produce an RF output and/or 8 vestigal side band (VSB) suitable as an input signal to a conventional television tuner. This allows the receiver 500 to operate with televisions without a video output.

Each of the satellites 108 comprises a transponder, which accepts program information from the uplink center 104, and relays this information to the subscriber receiving station 110. Known multiplexing techniques are used so that multiple channels can be provided to the user. These multiplexing techniques include, by way of example, various statistical or other time domain multiplexing techniques and polarization multiplexing. In one embodiment of the invention, a single transponder operating at a single frequency band carries a plurality of channels identified by respective service channel identification (SCID).

Preferably, the IRD 500 also receives and stores a program guide in a memory available to the microcontroller 510. Typically, the program guide is received in one or more data packets in the data stream from the satellite 108. The program guide can be accessed and searched by the execution of suitable operation steps implemented by the microcontroller 510 and stored in the processor ROM 538. The program guide may include data to map viewer channel numbers to satellite transponders and service channel identifications (SCIDs), and also provide TV program listing information to the subscriber 122 identifying program events.

The functionality implemented in the IRD 500 depicted in FIG. 5 can be implemented by one or more hardware modules, one or more software modules defining instructions performed by a processor, or a combination of both.

The present invention provides for the modulation of signals at different power levels and advantageously for the signals to be non-coherent from each layer. In addition, independent modulation and coding of the signals may be performed. Backwards compatibility with legacy receivers, such as a quadrature phase shift keying (QPSK) receiver is enabled and new services are provided to new receivers. A typical new receiver of the present invention uses two demodulators and one remodulator as will be described in detail hereafter.

In a typical backwards-compatible embodiment of the present invention, the legacy QPSK signal is boosted in power to a higher transmission (and reception) level. This creates a power "room" in which a new lower layer signal may operate. The legacy receiver will not be able to distinguish the new lower layer signal from additive white Gaussian noise, and thus operates in the usual manner. The optimum selection of the layer power levels is based on accommodating the legacy equipment, as well as the desired new throughput and services.

The new lower layer signal is provided with a sufficient carrier to thermal noise ratio to function properly. The new lower layer signal and the boosted legacy signal are non-coherent with respect to each other. Therefore, the new lower layer signal can be implemented from a different TWTA and even from a different satellite. The new lower layer signal format is also independent of the legacy format, e.g., it may be QPSK or 8PSK, using the conventional concatenated FEC code or using a new Turbo code. The lower layer signal may even be an analog signal.

The combined layered signal is demodulated and decoded by first demodulating the upper layer to remove the upper carrier. The stabilized layered signal may then have the upper layer FEC decoded and the output upper layer symbols communicated to the upper layer transport. The upper layer symbols are also employed in a remodulator, to generate an idealized upper layer signal. The idealized upper layer signal is then subtracted from the stable layered signal to reveal the lower layer signal. The lower layer signal is then demodulated and FEC decoded and communicated to the lower layer transport.

Signals, systems and methods using the present invention may be used to supplement a pre-existing transmission compatible with legacy receiving hardware in a backwards-compatible application or as part of a preplanned layered modulation architecture providing one or more additional layers at a present or at a later date.

2.4 Layered Signals

Figure 6B:
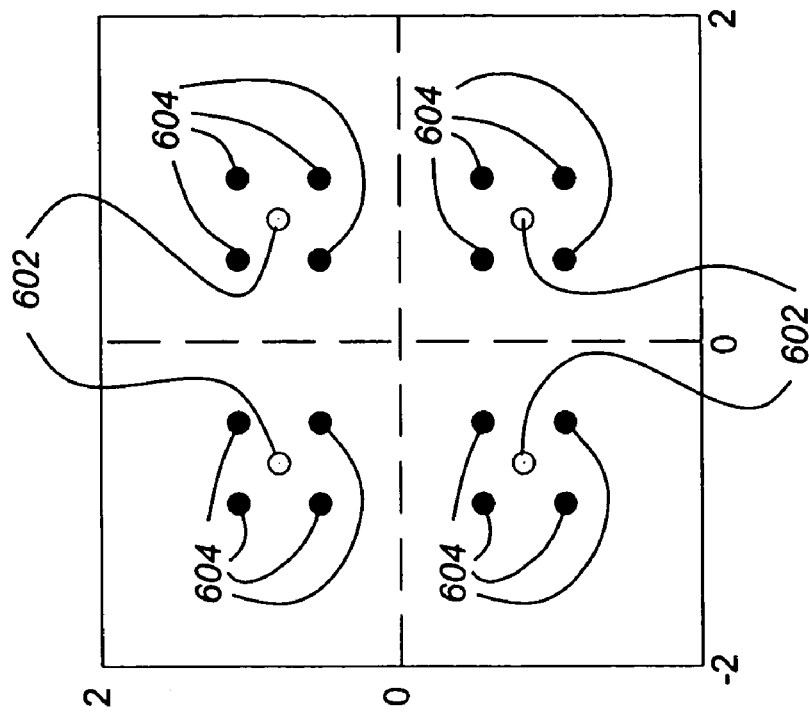
FIGS. 6A-6C are diagrams illustrating the basic relationship of signal layers in a layered modulation transmission.
Figure 6A:
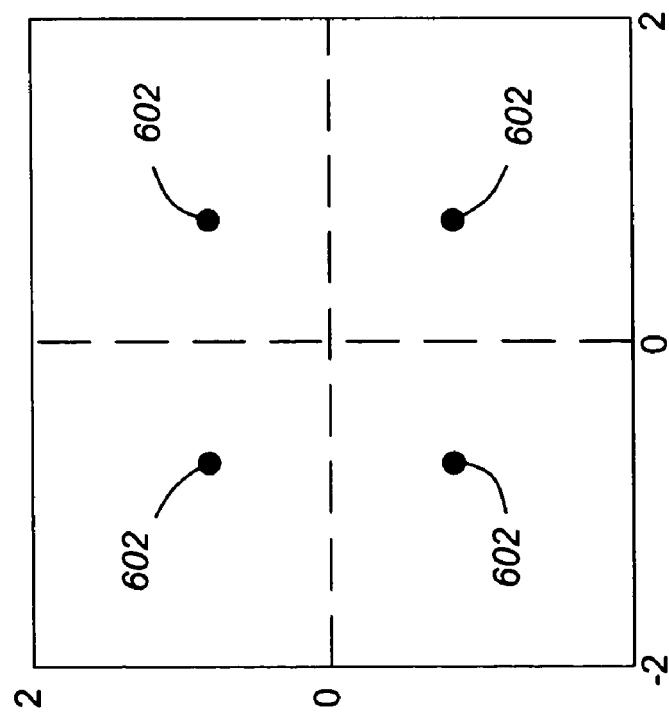
Figure 6C:
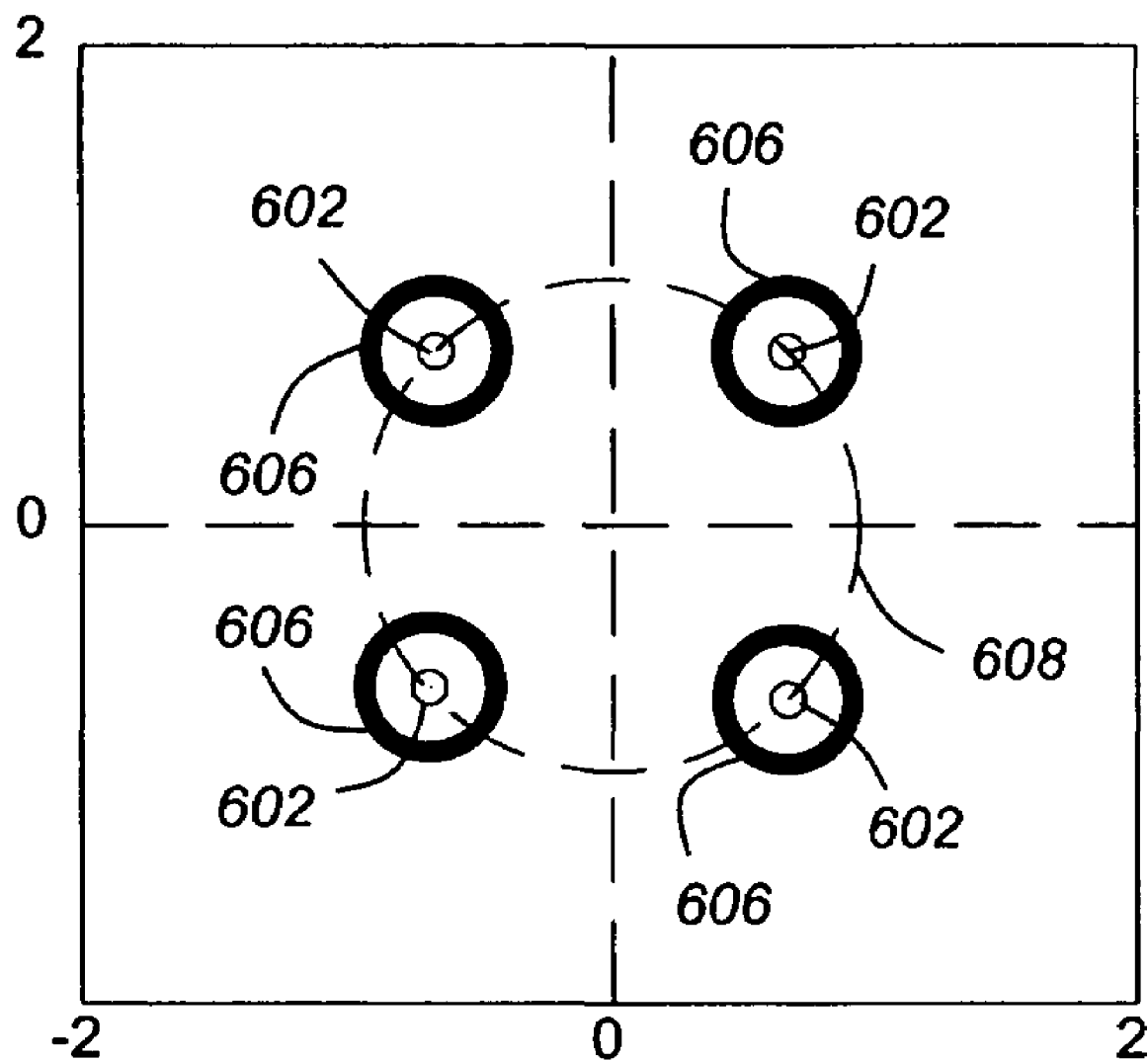

FIGS. 6A-6C illustrate the basic relationship of signal layers in a received layered modulation transmission. FIG. 6A illustrates an upper layer signal constellation 600 of a transmission signal showing the signal points or symbols 602. FIG. 6B illustrates the lower layer signal constellation of symbols 604 over the upper layer signal constellation 600 where the layers are coherent (or synchronized). FIG. 6C illustrates a lower layer signal 606 of a second transmission layer over the upper layer constellation where the layers are non-coherent. The lower layer 606 rotates about the upper layer constellation 602 due to the relative modulating frequencies of the two layers in a non-coherent transmission. Both the upper and lower layers rotate about the origin due to the first layer modulation frequency as described by path 608.

Figure 7B:
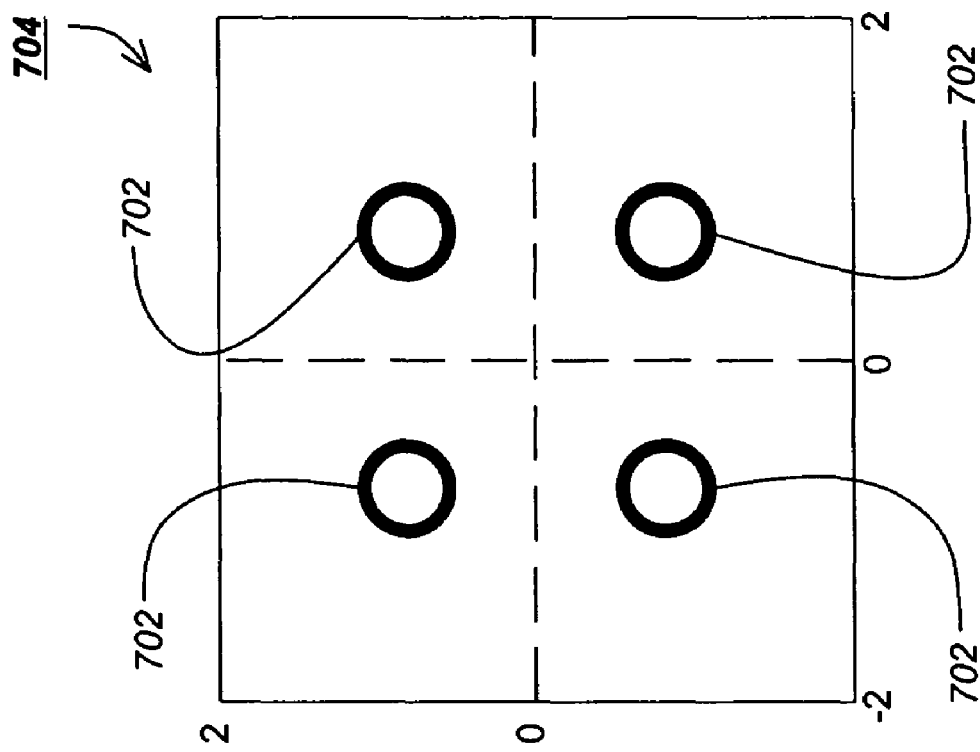
FIGS. 7A-7C are diagrams illustrating a signal constellation of a second transmission layer over the first transmission layer after first layer demodulation.
Figure 7A:
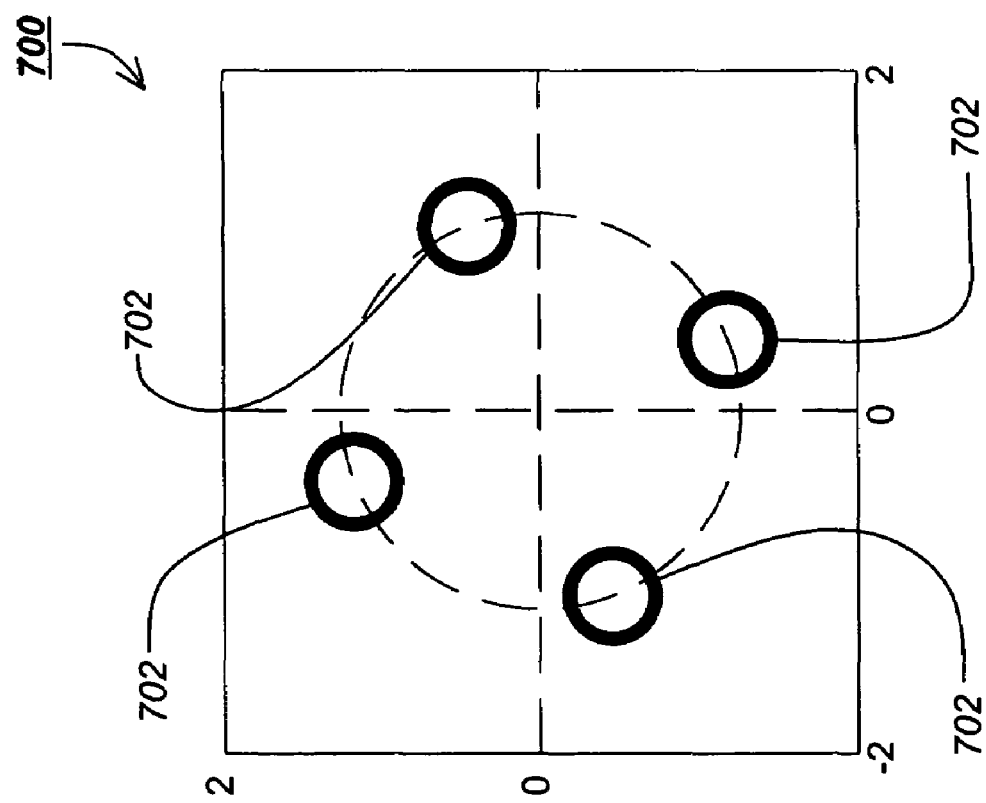
Figure 7C:
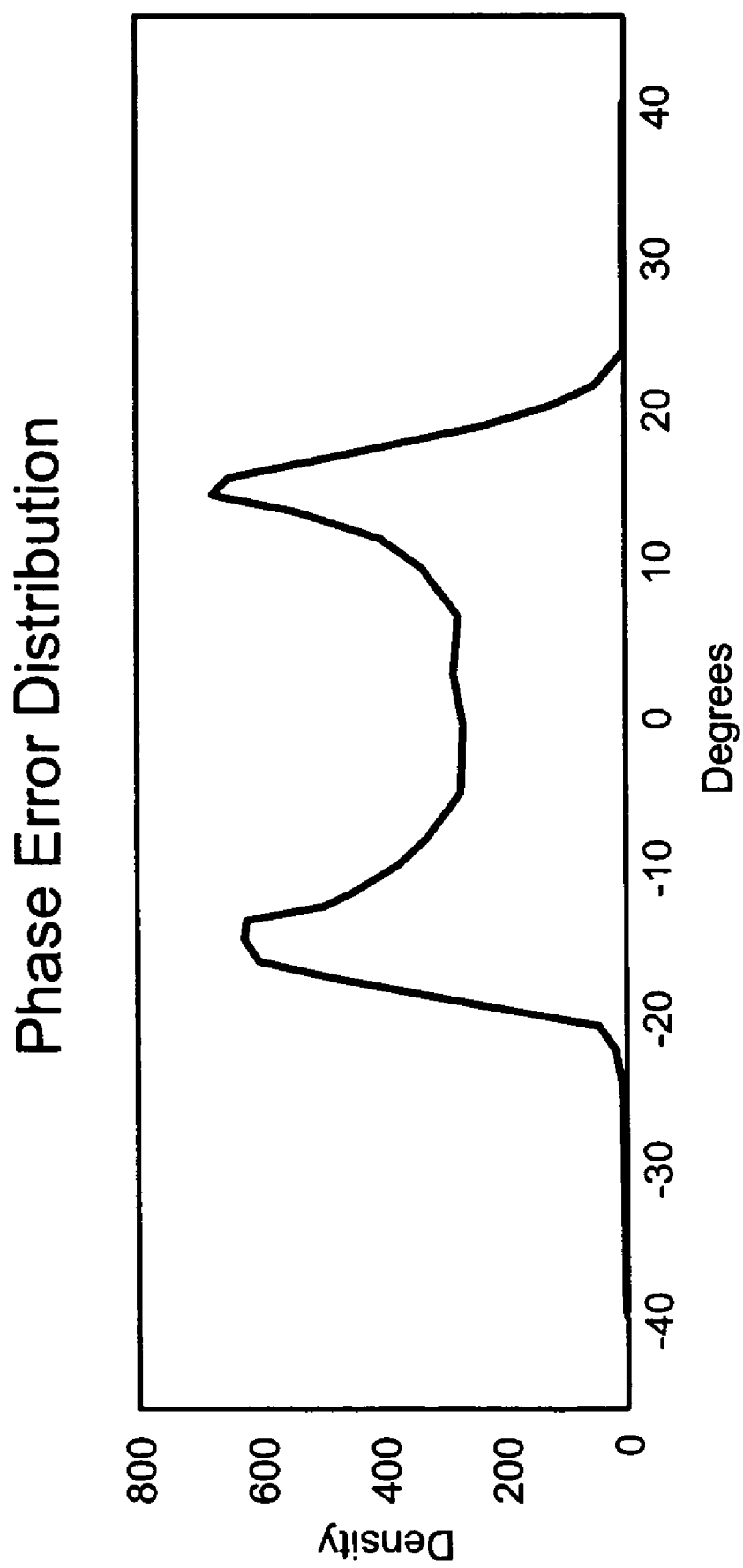

FIGS. 7A-7C are diagrams illustrating a non-coherent relationship between a lower transmission layer over the upper transmission layer after upper layer demodulation. FIG. 7A shows the constellation 700 before the first carrier recovery loop (CRL) of the upper layer and the constellation rings 702 rotate around the large radius circle indicated by the dashed line. FIG. 7B shows the constellation 704 after CRL of the upper layer where the rotation of the constellation rings 702 is stopped. The constellation rings 702 are the signal points of the lower layer around the nodes 602 of the upper layer. FIG. 7C depicts a phase distribution of the received signal with respect to nodes 602.

Relative modulating frequencies of the non-coherent upper and lower layer signals cause the lower layer constellation to rotate around the nodes 602 of the upper layer constellation to form rings 702. After the lower layer CRL this rotation is eliminated and the nodes of the lower layer are revealed (as shown in FIG. 6B). The radius of the lower layer constellation rings 702 is indicative of the lower layer power level. The thickness of the rings 702 is indicative of the carrier to noise ratio (CNR) of the lower layer. As the two layers are non-coherent, the lower layer may be used to transmit distinct digital or analog signals.

Figure 8A:
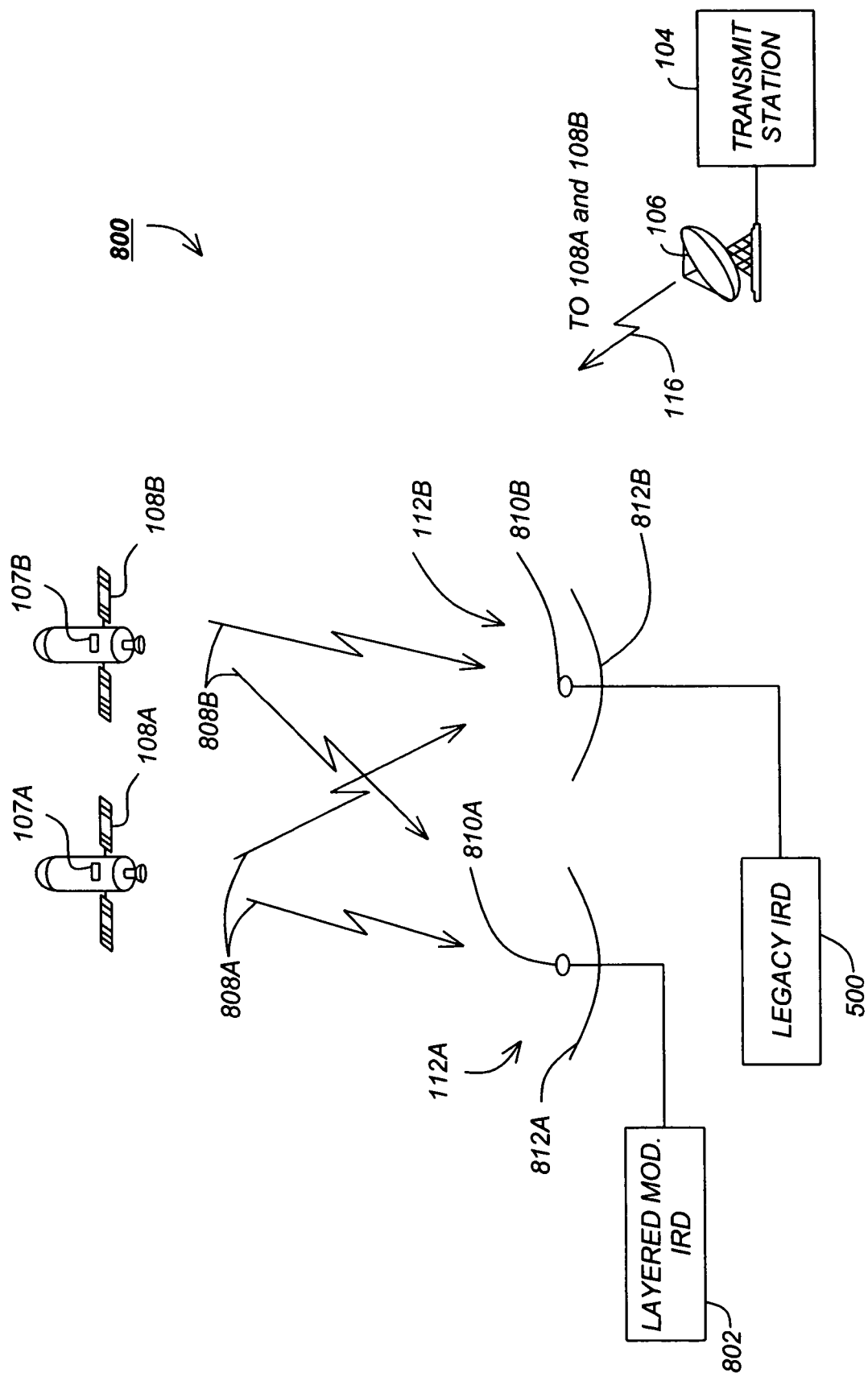
FIG. 8A is a diagram showing a system for transmitting and receiving layered modulation signals.

FIG. 8A is a diagram showing a system for transmitting and receiving layered modulation signals. Separate transmitters 107A, 107B (that include TWTAs to amplify the signals), as may be located on any suitable platform, such as satellites 108A, 108B, are used to non-coherently transmit different layers of a signal of the present invention. Uplink signals 116 are typically transmitted to each satellite 108A, 108B from one or more uplink centers 104 with one or more transmitters 105 via an antenna 106.

Figure 8B:
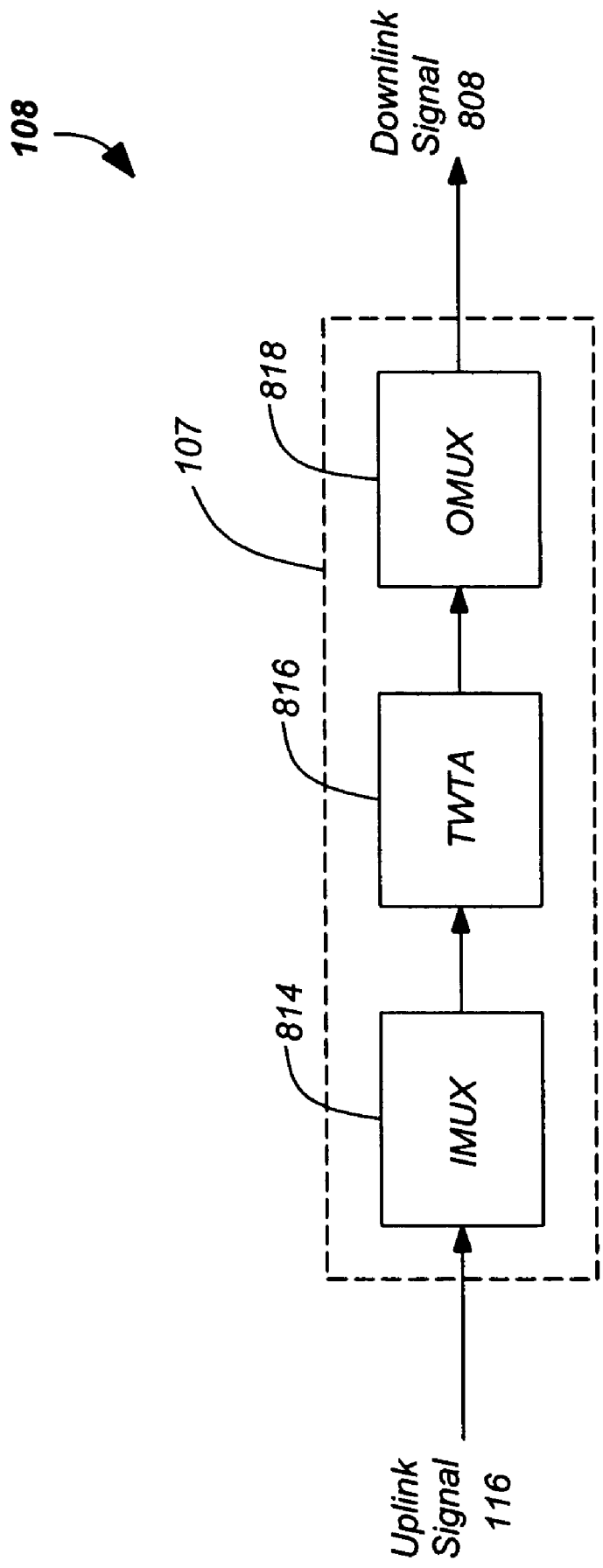
FIG. 8B is a diagram showing an exemplary satellite transponder for receiving and transmitting layered modulation signals.

FIG. 8B is a diagram illustrating an exemplary satellite transponder 107 for receiving and transmitting layered modulation signals on a satellite 108. The uplink signal 116 is received by the satellite 108 and passed through an input multiplexer (IMUX) 814. Following this the signal is amplified with a traveling wave tube amplifier (TWTA) 816 and then through an output muliplexer (OMUX) 818 before the downlink signal 118 is transmitted to the receivers 802, 500.

Figure 8C:
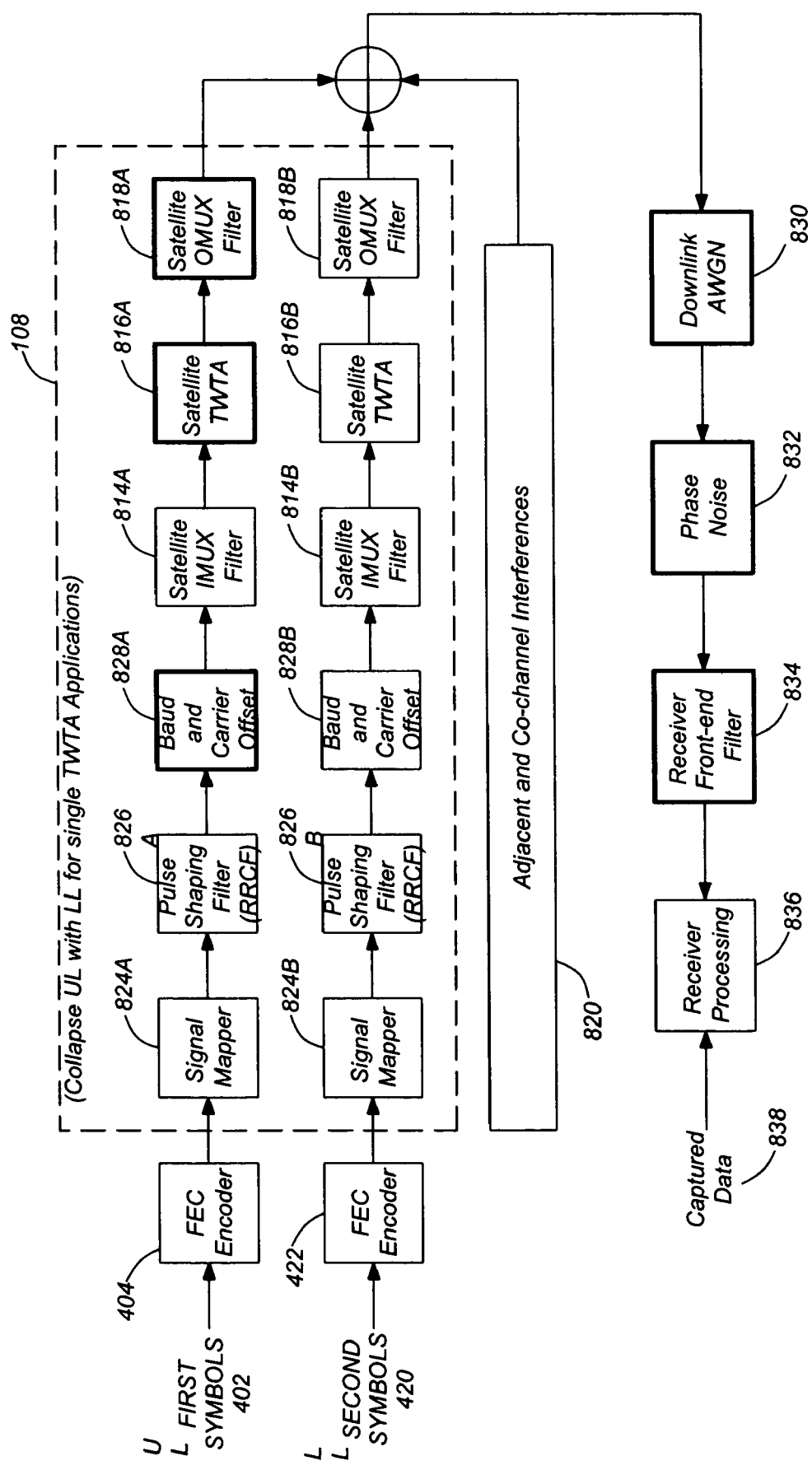
FIG. 8C is a diagram illustrating details of a simulation of an exemplary satellite transponder and signal processing.

FIG. 8C is a diagram illustrating details of a simulation of an exemplary satellite transponder and signal processing in accordance with one or more embodiments of the invention. Specifically, FIG. 8C illustrates how a layer-modulated signal can be simulated to generate results as described herein. In FIG. 8C, the blocks with potential impact on nonlinearity measurement accuracy of the upper layer TWTA are highlighted. As illustrated and described in more detail below, no adjacent or co-channel interferences 820 are included.

The FEC encoders 404 and 422 accept the first and second signal symbols 402 and 420 respectively and add redundant information that are used to reduce transmission errors. The encoded signals are modulated, up-converted in frequency, up-linked, and received in the satellite 108 with relatively small impairment.

In the simulation, the upper and lower signals are processed by signal mappers 824A and 824B respectively. The signal mappers 824A and 824B converts the FEC output bits into constellation symbols. To ensure that the fundamental shapes of the pulses of the signal do not interfere with one another at an optimal sampling point later in the receiver, pulse shaping filters 826A and 826B may be used to establish a desirable pulse shape. In this regard, the pulse shaping filters 826A and 826B may comprise a root-raised cosine filter (RRCF) in which the frequency filter provides for expressing the frequency response as the square root of the magnitude spectrum of a full raised cosine filter (RCF).

Continuing the simulation, the pulse shaped signals are independently offset by the baud and carrier offset modules 828A and 828B. As illustrated in FIG. 8B, the signal is then passed through satellite input multiplexer (IMUX) filters 814A and 814B. Following this the signal is amplified with traveling wave tube amplifiers (TWTA) 816A and 816B and then through output muliplexers (OMUX) 818A and 818B. The upper layer signal and lower layer signal are combined with adjacent and co-channel interferences 820, as may be required, before downlink transmission. In the simulation illustrated in FIG. 8C, additive white Gaussian noise (AWGN) 830 may be added to test the robustness of the invention.

As part of the simulation, phase noise 832 may be added to the signal. A receiver front-end filter 834 (e.g., a 4th order Butterworth Low Pass Filter (LPF) as an anti-aliasing filter) may be included to model receiver implementation that outputs a simulated received signal for an off-line receiver processing block 836 to measure TWTA nonlinearity. Alternatively, a down-linked signal 838 may be captured by receiver 500 for TWTA nonlinearity measurement. As illustrated and described herein, the baud and carrier offset module 828A, satellite TWTA 816A, Satellite OMUX Filter 818A, Downlink AWGN 830, Phase Noise 832, and Receiver Front-end Filter 834 have a more significant effect on the accuracy of the TWTA nonlinearity measurement than other components of the satellite and receiver.

Referring again to FIG. 8A, the layered signals 808A, 808B (e.g. multiple downlink signals 118) are received at receiver antennas 812A, 812B, such as satellite dishes, each with a low noise block (LNB) 810A, 810B where they are then coupled to integrated receiver/decoders (IRDs) 500, 802. For example, first satellite 108A and transmitter 107A can transmit an upper layer legacy signal 808A and second satellite 108B and transmitter 107B can transmit a lower layer signal 808B. Although both signals 808A, 808B arrive at each antenna 812A, 812B and LNB 810A, 810B, only the layer modulation IRD 802 is capable of decoding both signals 808A, 808B. The legacy receiver 500 is only capable of decoding the upper layer legacy signal 808A; the lower layer signal 808B appears only as noise to the legacy receiver 500.

Because the signal layers may be transmitted non-coherently, separate transmission layers may be added at any time using different satellites 108A, 108B or other suitable platforms, such as ground based or high altitude platforms. Thus, any composite signal, including new additional signal layers will be backwards compatible with legacy receivers 500, which will disregard the new signal layers. To ensure that the signals do not interfere, the combined signal and noise level for the lower layer must be at or below the allowed noise floor for the upper layer at the particular receiver antenna 812A, 812B.

Layered modulation applications include backwards compatible and non-backwards compatible applications. "Backwards compatible" in this sense, describes systems in which legacy receivers 500 are not rendered obsolete by the additional signal layer(s). Instead, even if the legacy receivers 500 are incapable of decoding the additional signal layer(s), they are capable of receiving the layered modulated signal and decoding the original signal layer. In these applications, the pre-existing system architecture is accommodated by the architecture of the additional signal layers. "Non-backwards compatible" describes a system architecture which makes use of layered modulation, but the modulation scheme employed is such that pre-existing equipment is incapable of receiving and decoding the information on additional signal layer(s).

The pre-existing legacy IRDs 500 decode and make use of data only from the layer (or layers) they were designed to receive, unaffected by the additional layers. However, as will be described hereafter, the legacy signals may be modified to optimally implement the new layers. The present invention may be applied to existing direct satellite services which are broadcast to individual users in order to enable additional features and services with new receivers without adversely affecting legacy receivers and without requiring additional signal frequency.

2.5 Demodulator and Decoder

Figure 9:
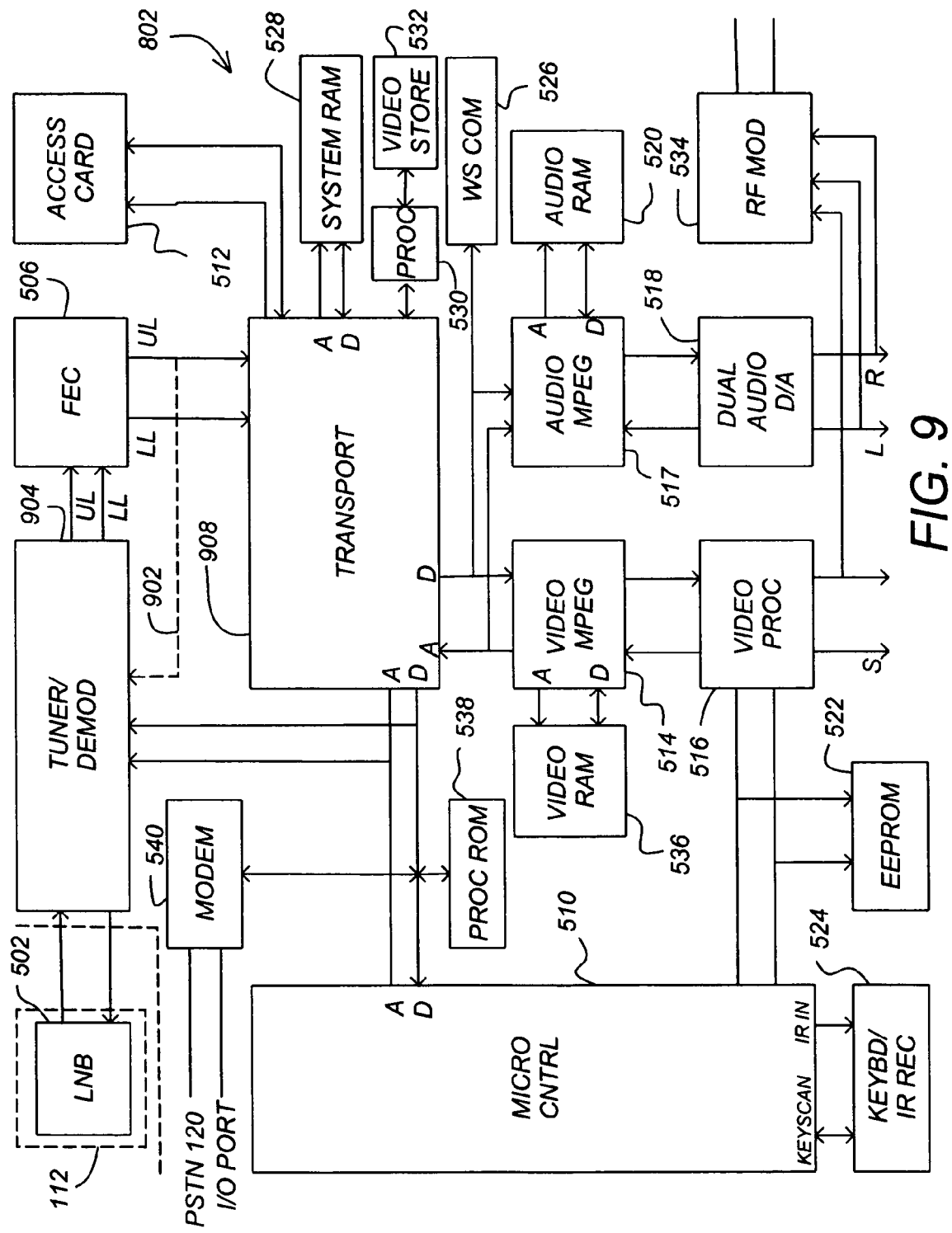
FIG. 9 is a block diagram depicting one embodiment of an enhanced IRD capable of receiving layered modulation signals.

FIG. 9 is a block diagram depicting one embodiment of an enhanced IRD 802 capable of receiving layered modulation signals. The enhanced IRD 802 includes a feedback path 902 in which the FEC decoded symbols are fed back to an enhanced modified tuner/demodulator 904 and transport module 908 for decoding both signal layers as detailed hereafter.

Figure 10A:
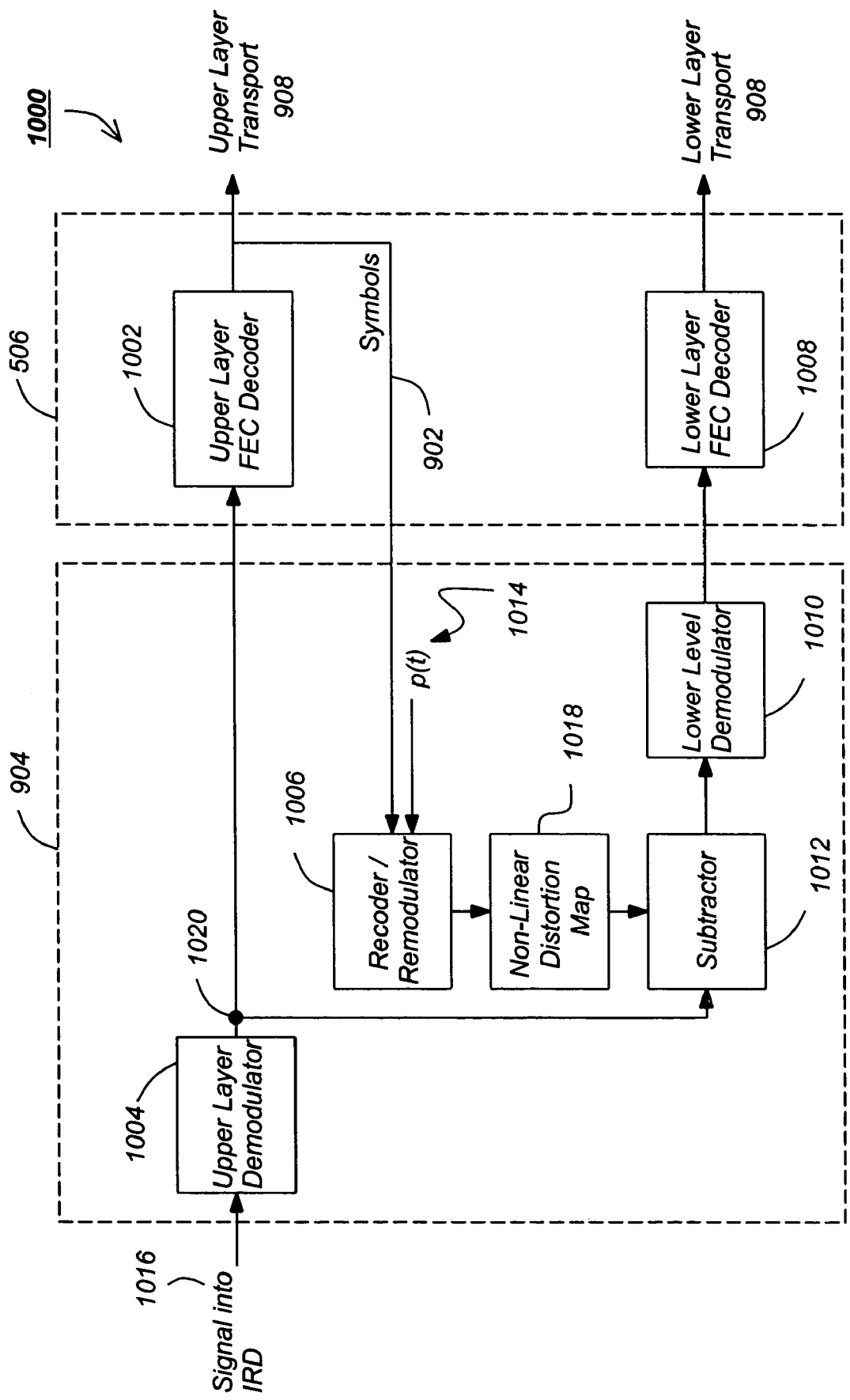
FIG. 10A is a block diagram of one embodiment of the enhanced tuner/modulator and FEC encoder.

FIG. 10A is a block diagram of one embodiment of the enhanced tuner/modulator 904 and FEC encoder 506. FIG. 10A depicts reception where layer subtraction is performed on a signal where the upper layer carrier has already been demodulated. The upper layer of the received combined signal 1016 from the LNB 502, which may contain legacy modulation format, is provided to and processed by an upper layer demodulator 1004 to produce the stable demodulated signal 1020. The demodulated signal 1020 is communicatively coupled to a FEC decoder 1002 which decodes the upper layer to produce the upper layer symbols which are output to an upper layer transport module 908. The upper layer symbols are also used to generate an idealized upper layer signal. The upper layer symbols may be produced from the decoder 402 after Viterbi decoding (BER<$10^{-3}$ or so) or after Reed-Solomon (RS) decoding (BER<$10^{-9}$ or so), in typical decoding operations known to those skilled in the art. The upper layer symbols are provided via feedback path 902 from the upper layer decoder 1002 to a remodulator 1006 which effectively produces an idealized upper layer signal. The idealized upper level signal is subtracted from the demodulated upper layer signal 1020.

In order for the subtraction to yield a clean lower layer signal, the upper layer signal must be precisely reproduced. The modulated signal has been distorted, for example, by traveling wave tube amplifier (TWTA) non-linearity or other non-linear or linear distortions in the transmission channel. The distortion effects may be estimated from the received signal after the fact by this invention method with which TWTA characteristics may be downloaded into the IRD in AM-AM and/or AM-PM maps 1018, used to eliminate the distortion (see detailed description below). The time domain response p(t) 1014 is incorporated as a signal characteristic. Alternatively, in accordance with one or more embodiments of the invention, the individual IRDs 500 and 802 may generate the nonlinearity curves locally, thereby eliminating the need to transmit the curves from the broadcast center.

A subtractor 1012 then subtracts the idealized upper layer signal from the stable demodulated signal 1020. This leaves the lower-power second layer signal. The subtractor 1012 may include a buffer or delay function to retain the stable demodulated signal 1020 while the idealized upper layer signal is being constructed. The second layer signal is demodulated by the lower level demodulator 1010 and FEC decoded by decoder 1008 according to its signal format to produce the lower layer symbols, which are provided to the transport module 908.

Figure 10B:
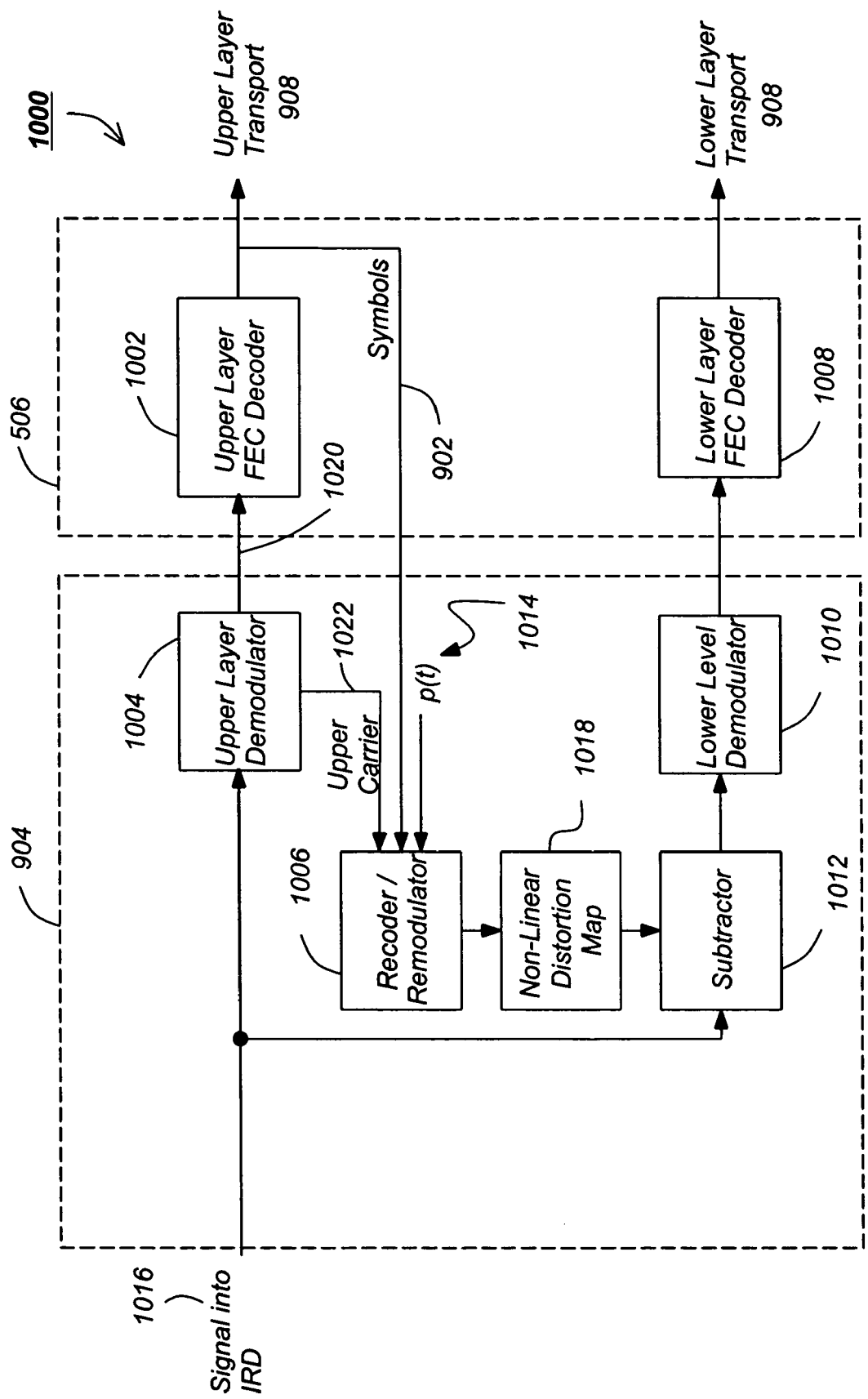
FIG. 10B depicts another embodiment of the enhanced tuner/modulator wherein layer subtraction is performed on the received layered signal.

FIG. 10B depicts another embodiment wherein layer subtraction is performed on the received layered signal (prior to upper layer demodulation). In this case, the upper layer demodulator 1004 produces the upper carrier signal 1022 (as well as the stable demodulated signal output 1020). An upper carrier signal 1022 is provided to the recoder/remodulator 1006. The recoder/remodulator 1006 provides the recoded/remodulated signal to the non-linear distortion mapper 1018 which effectively produces an idealized upper layer signal. Unlike the embodiment shown in FIG. 10A, in this embodiment, the idealized upper layer signal includes the upper layer carrier for subtraction from the received combined signal 808A, 808B.

Other equivalent methods of layer subtraction will occur to those skilled in the art and the present invention should not be limited to the examples provided here. Furthermore, those skilled in the art will understand that the present invention is not limited to two layers; additional layers may be included. Idealized upper layers are produced through remodulation from their respective layer symbols and subtracted. Subtraction may be performed on either the received combined signal or a demodulated signal. Finally, it is not necessary for all signal layers to be digital transmissions; the lowest layer may be an analog transmission.

The following analysis describes the exemplary two layer demodulation and decoding. It will be apparent to those skilled in the art that additional layers may be demodulated and decoded in a similar manner. The incoming combined signal is represented as:

$$s_{UL}(t) = f_U\left(M_U \exp(j\omega_U t + \theta_U) \sum_{m=-\infty}^{\infty} S_{Um} p(t - mT)\right) +$$
$$f_L\left(M_L \exp(j\omega_L t + \theta_L) \sum_{m=-\infty}^{\infty} S_{Lm} p(t - mT + \Delta T_m)\right) + n(t)$$

where, $M_U$ is the magnitude of the upper layer QPSK signal and $M_L$ is the magnitude of the lower layer QPSK signal and in general $M_L \ll M_U$. The signal frequencies and phase for the upper and lower layer signals are respectively $\omega_U, \theta_U$ and $\omega_L, \theta_L$. The symbol timing misalignment between the upper and lower layers is $\Delta T_m$. $p(t-mT)$ represents the time shifted version of the pulse shaping filter $p(t)$ 414 employed in signal modulation. QPSK symbols $S_{Um}$ and $S_{Lm}$ are elements of $$\left\{\exp\left(j\frac{n\pi}{2}\right), n = 0, 1, 2, 3\right\}$$

for exemplary QPSK signals. $f_U(\cdot)$ and $f_L(\cdot)$ denote the distortion function of the TWTAs for the respective signals.

Ignoring $f_U(\cdot)$ and $f_L(\cdot)$ and noise $n(t)$, the following represents the combined signal after removing the upper carrier:

$$s'_{UL}(t) = M_U \sum_{m=-\infty}^{\infty} S_{Um} p(t - mT) +$$
$$M_L \exp\{j(\omega_L - \omega_U)t + \theta_L - \theta_U\} \sum_{m=-\infty}^{\infty} S_{Lm} p(t - mT + \Delta T_m)$$

Because of the magnitude difference between $M_U$ and $M_L$, the upper layer demodulator 1004 and decoder 1002 disregard the $M_L$ component of the $s'_{UL}(t)$.

After subtracting the upper layer from $s_{UL}(t)$ in the subtractor 1012, the following remains:

$$s_L(t) = M_L \exp\{j(\omega_L - \omega_U)t + \theta_L - \theta_U\} \sum_{m=-\infty}^{\infty} S_{Lm} p(t - mT + \Delta T_m)$$

Any distortion effects, such as TWTA nonlinearity effects are estimated for signal subtraction. In a typical embodiment of the present invention, the upper and lower layer frequencies are substantially equal. Significant improvements in system efficiency can be obtained by using a frequency offset between layers.

Using the present invention, two-layered backward compatible modulation with QPSK doubles a current 6/7 rate capacity by adding a TWTA approximately 6.2 dB above an existing TWTA power. New QPSK signals may be transmitted from a separate transmitter, from a different satellite for example. In addition, there is no need for linear travelling wave tube amplifiers (TWTAs) as with 16QAM. Also, no phase error penalty is imposed on higher order modulations such as 8PSK and 16QAM.

3.0 Power Levels of Modulation Layers

In a layered modulation system, the relationship between the individual modulation layers can be structured to facilitate backward compatible applications. Alternately, a new layer structure can be designed to optimize the combined efficiency and/or performance of the layered modulation system.

3.1 Backward Compatible Applications

The present invention may be used in Backward Compatible Applications. In such applications, a lower layer signal may take advantage of advanced forward error correction (FEC) coding techniques to lower the overall transmission power required by the system.

Figure 11A:
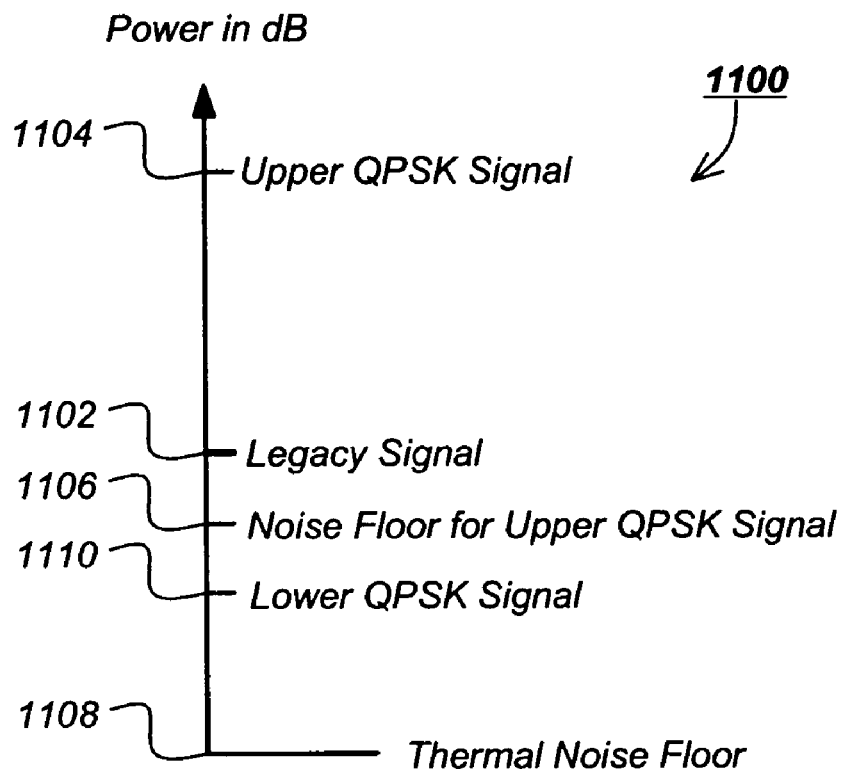
FIGS. 11A and 11B depict the relative power levels of example embodiments of the present invention.

FIG. 11A depicts the relative power levels 1100 of example embodiments of the present invention. FIG. 11A is not a scale drawing. This embodiment doubles the pre-existing rate 6/7 capacity by using a TWTA 6.2 dB above a pre-existing TWTA equivalent isotropic radiated power (EIRP) and second TWTA 2 dB below the pre-existing TWTA power. This embodiment uses upper and lower QPSK layers which are non-coherent. A code rate of 6/7 is also used for both layers. In this embodiment, the signal of the legacy QPSK signal 1102 is used to generate the upper layer 1104 and a new QPSK layer is the lower layer 1110. The CNR of the legacy QPSK signal 1102 is approximately 7 dB. In the present invention, the legacy QPSK signal 1102 is boosted in power by approximately 6.2 dB bringing the new power level to approximately 13.2 dB above thermal noise as the upper layer 1104. The noise floor 1106 of the upper layer is approximately 6.2 dB. The new lower QPSK layer 1110 has a CNR of approximately 5 dB with an advanced FEC such as a turbo code. The total signal and noise of the lower layer is kept at or below the tolerable noise floor 1106 of the upper layer. The power boosted upper layer 1104 of the present invention is also very robust, making it resistant to rain fade. It should be noted that the invention may be extended to multiple layers with mixed modulations, coding and code rates.

In an alternate embodiment of this backwards compatible application, a code rate of 2/3 may be used for both the upper and lower layers 1104, 1110. In this case, the CNR of the legacy QPSK signal 1102 (with a code rate of 2/3) is approximately 5.8 dB. The legacy signal 1102 is boosted by approximately 5.3 dB to approximately 11.1 dB (4.1 dB above the legacy QPSK signal 1102 with a code rate of 2/3) to form the upper QPSK layer 1104. The new lower QPSK layer 1110 has a CNR of approximately 3.8 dB. The total signal and noise of the lower layer 1110 is kept at or below approximately 5.3 dB, the tolerable noise floor 1106 of the upper QPSK layer. In this case, overall capacity is improved by 1.55 and the effective rate for legacy IRDs will be 7/9 of that before implementing the layered modulation.

In a further embodiment of a backwards compatible application of the present invention the code rates between the upper and lower layers 1104, 1110 may be mixed. For example, the legacy QPSK signal 502 may be boosted by approximately 5.3 dB to approximately 12.3 dB with the code rate unchanged at 6/7 to create the upper QPSK layer 1104. The new lower QPSK layer 1110 may use a code rate of 2/3 with a CNR of approximately 3.8 dB. In this case, the total capacity relative to the legacy signal 1102 is approximately 1.78. In addition, the legacy IRDs will suffer no significant rate decrease.

3.2 Non-Backward Compatible Applications

As previously discussed the present invention may also be used in "non-backward compatible" applications. In such applications, both upper and lower layer signals may take advantage of advanced forward error correction (FEC) coding techniques to lower the overall transmission power required by the system. In a first example embodiment, two QPSK layers 1104, 1110 are used each at a code rate of 2/3. The upper QPSK layer 504 has a CNR of approximately 4.1 dB above its noise floor 1106 and the lower QPSK layer 1110 also has a CNR of approximately 4.1 dB. The total code and noise level of the lower QPSK layer 1110 is approximately 5.5 dB. The total CNR for the upper QPSK signal 1104 is approximately 9.4 dB, merely 2.4 dB above the legacy QPSK signal rate 6/7. The capacity is approximately 1.74 compared to the legacy rate 6/7.

Figure 11B:
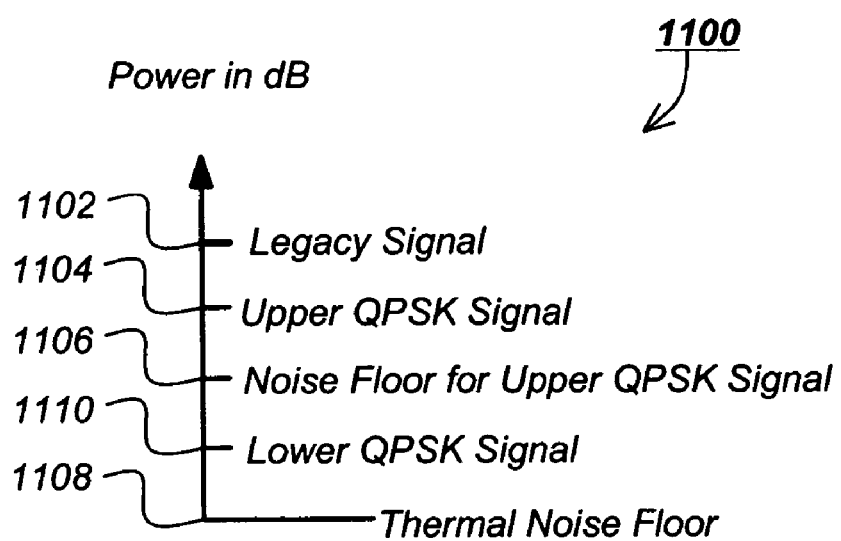

FIG. 11B depicts the relative power levels of an alternate embodiment wherein both the upper and lower layers 1104, 1110 are below the legacy signal level 1102. The two QPSK layers 1104, 1110 use a code rate of 1/2. In this example, the upper QPSK layer 1104 is approximately 2.0 dB above its noise floor 1106 of approximately 4.1 dB. The lower QPSK layer has a CNR of approximately 2.0 dB and a total code and noise level at or below 4.1 dB. The capacity of this embodiment is approximately 1.31 compared to the legacy rate 6/7.

4. Hardware Environment

Figure 12:
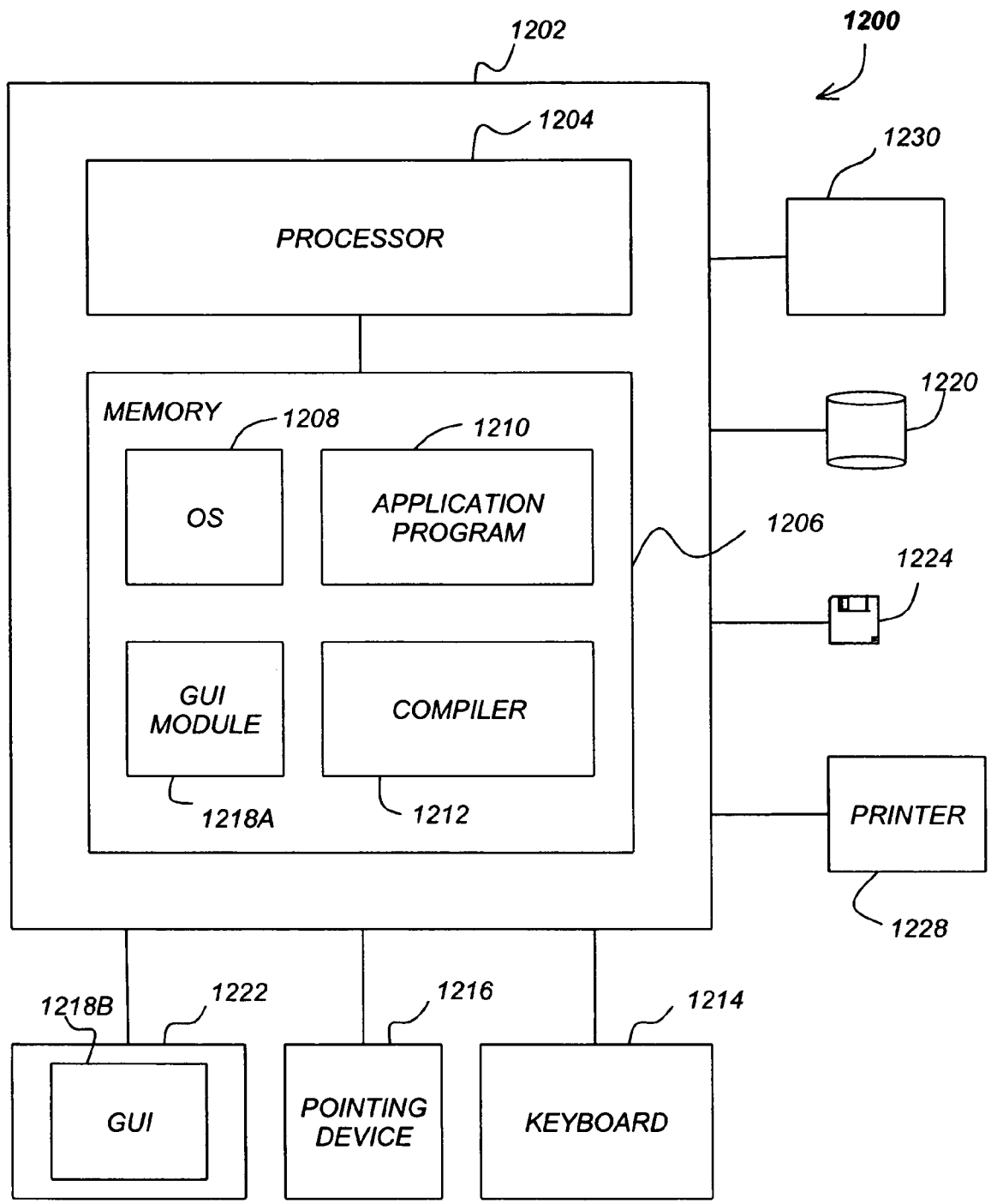
FIG. 12 illustrates an exemplary computer system that could be used to implement selected modules or functions the present invention.

FIG. 12 illustrates an exemplary computer system 1200 that could be used to implement selected modules and/or functions of the present invention. The computer 1202 comprises a processor 1204 and a memory 1206, such as random access memory (RAM). The computer 1202 is operatively coupled to a display 1222, which presents images such as windows to the user on a graphical user interface 1218B. The computer 1202 may be coupled to other devices, such as a keyboard 1214, a mouse device 1216, a printer, etc. Of course, those skilled in the art will recognize that any combination of the above components, or any number of different components, peripherals, and other devices, may be used with the computer 1202.

Generally, the computer 1202 operates under control of an operating system 1208 stored in the memory 1206, and interfaces with the user to accept inputs and commands and to present results through a graphical user interface (GUI) module 1218A. Although the GUI module 1218A is depicted as a separate module, the instructions performing the GUI functions can be resident or distributed in the operating system 1208, the computer program 1210, or implemented with special purpose memory and processors. The computer 1202 also implements a compiler 1212 which allows an application program 1210 written in a programming language such as COBOL, C++, FORTRAN, or other language to be translated into processor 1204 readable code. After completion, the application 1210 accesses and manipulates data stored in the memory 1206 of the computer 1202 using the relationships and logic that was generated using the compiler 1212. The computer 1202 also optionally comprises an external communication device such as a modem, satellite link, Ethernet card, or other device for communicating with other computers.

In one embodiment, instructions implementing the operating system 1208, the computer program 1210, and the compiler 1212 are tangibly embodied in a computer-readable medium, e.g., data storage device 1220, which could include one or more fixed or removable data storage devices, such as a zip drive, floppy disc drive 1224, hard drive, CD-ROM drive, tape drive, etc. Further, the operating system 1208 and the computer program 1210 are comprised of instructions which, when read and executed by the computer 1202, causes the computer 1202 to perform the steps necessary to implement and/or use the present invention. Computer program 1210 and/or operating instructions may also be tangibly embodied in memory 1206 and/or data communications devices 1230, thereby making a computer program product or article of manufacture according to the invention. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present invention. For example, those skilled in the art will recognize that any combination of the above components, or any number of different components, peripherals, and other devices, may be used with the present invention.

5. Estimating Non-Linearity

Referring again to FIGS. 10A and 10B, non-linear distortion maps 1018 that depict the non-linearity of the TWTA may be used by a non-linear distortion map module during the layered modulation signal reconstruction process. As described above, in an exemplary receiver 802, TWTA AM-AM and AM-PM maps are applied using an estimated operating point to a re-encoded and re-modulated signal to more accurately reconstruct the upper layer signal.

While FIGS. 10A and 10B illustrate the use of the non-linear distortion maps, knowledge of the non-linear distortion maps (and operating point) must be determined. It should be noted that the measurement of non-linearity may be conducted in a variety of manners as part of the layered modulation scheme. The TWTA non-linearity may be measured at the local IRDs 500 or 802, in which case the operating point may be automatically calculated from the nonlinearity measurements. The TWTA non-linearity may also be made at a broadcast/uplink center 104 with the operating point similarly obtained, in which case information on TWTA non-linearity and operating point can be downloaded to individual IRDs 500/802, such as through the downlink signal 118, to support the layered modulation signal receiving process.

6. Measuring Non-Linearity

As described above, the measurement of non-linearity may be conducted in a variety of manners as part of the layered modulation scheme. A first mechanism for TWTA non-linearity measurement is fully described in U.S. patent application Ser. No. 10/165,710, entitled "SATELLITE TWTA ON-LINE NON-LINEARITY MEASUREMENT", filed on Jun. 7, 2002 by Ernest C. Chen.

A second measurement mechanism (as described herein) may provide an improvement over the first mechanism. In the second measurement mechanism, non-linearity may be measured at the broadcast center or in each local IRD 500/802 (e.g., using a coherent averaging technique that maximizes processing gains).

The IRD 500/802 which receives the downlink signal 118 (e.g., from the LNB 502) may also include a signal processor which extracts the symbol stream and carrier frequency from the incoming signal and generates an ideal signal, i.e. a signal without the effects of the TWTA and noise. The ideal signal is then used in a comparison processor to produce TWTA characteristic maps (which provide the measurements for TWTA non-linearity). As described herein, the signal processor and comparison processor may be incorporated in IRD 802 within the tuner/demodulator 904, FEC 506. The details concerning the generation of the characteristic maps will be described below in the discussion of FIGS. 13A-13D.

Typically, the TWTA characteristic maps comprise measurements of the output amplitude modulation versus the input amplitude modulation (the AM-AM map) and the output phase modulation versus the input amplitude modulation (the AM-PM map). The received signal represents the TWTA amplifier output (plus noise) and the generated ideal signal represents the amplifier input. In addition to diagnosing and monitoring the amplifier, these characteristic maps may then be used to facilitate and/or improve reception of lower layer signals of a system using a layered modulation transmission scheme.

Figure 13A:
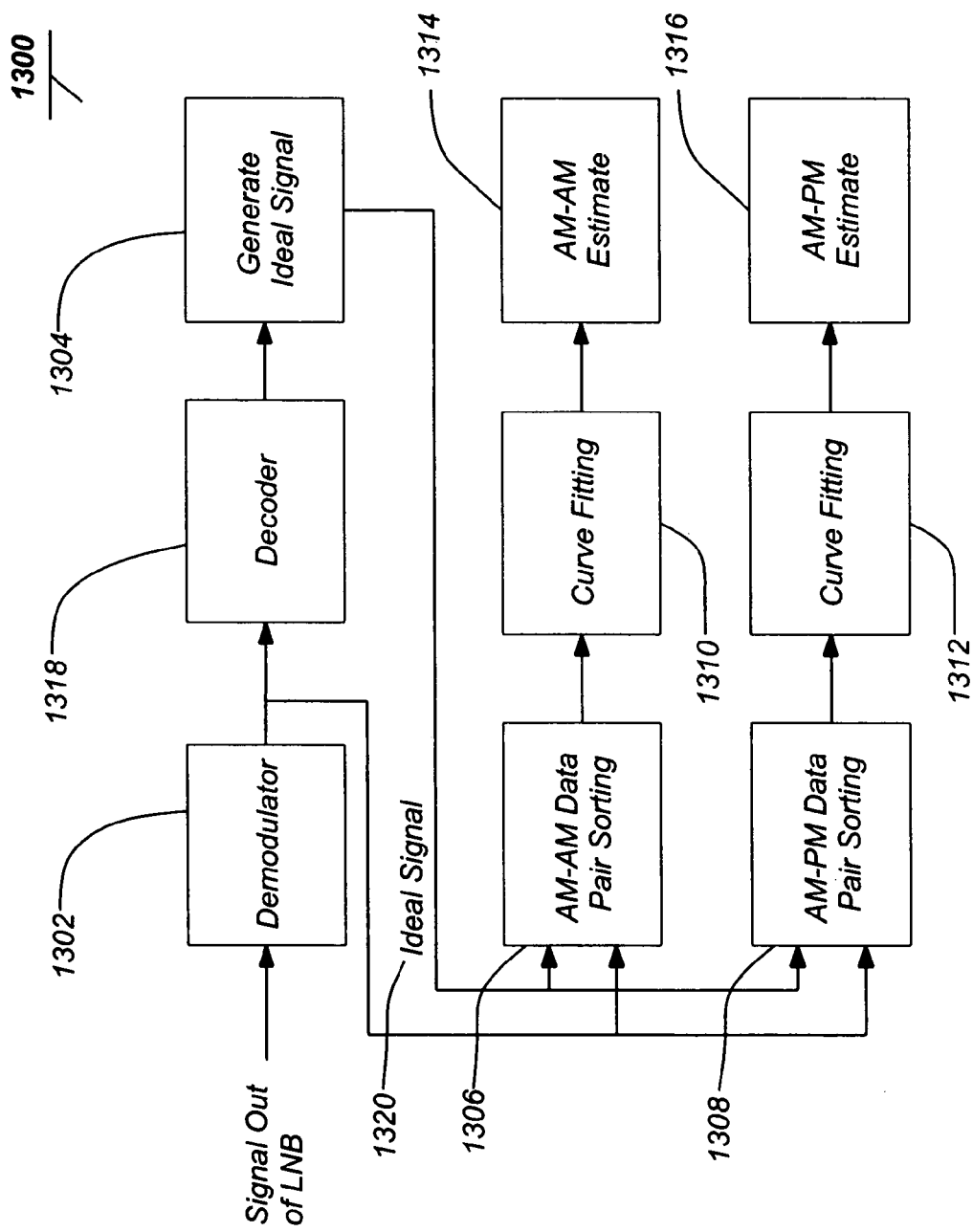
FIGS. 13A, 13B, and 13C are block diagrams of a basic system for measuring performance maps in accordance with one or more embodiments of the invention.
Figure 13B:
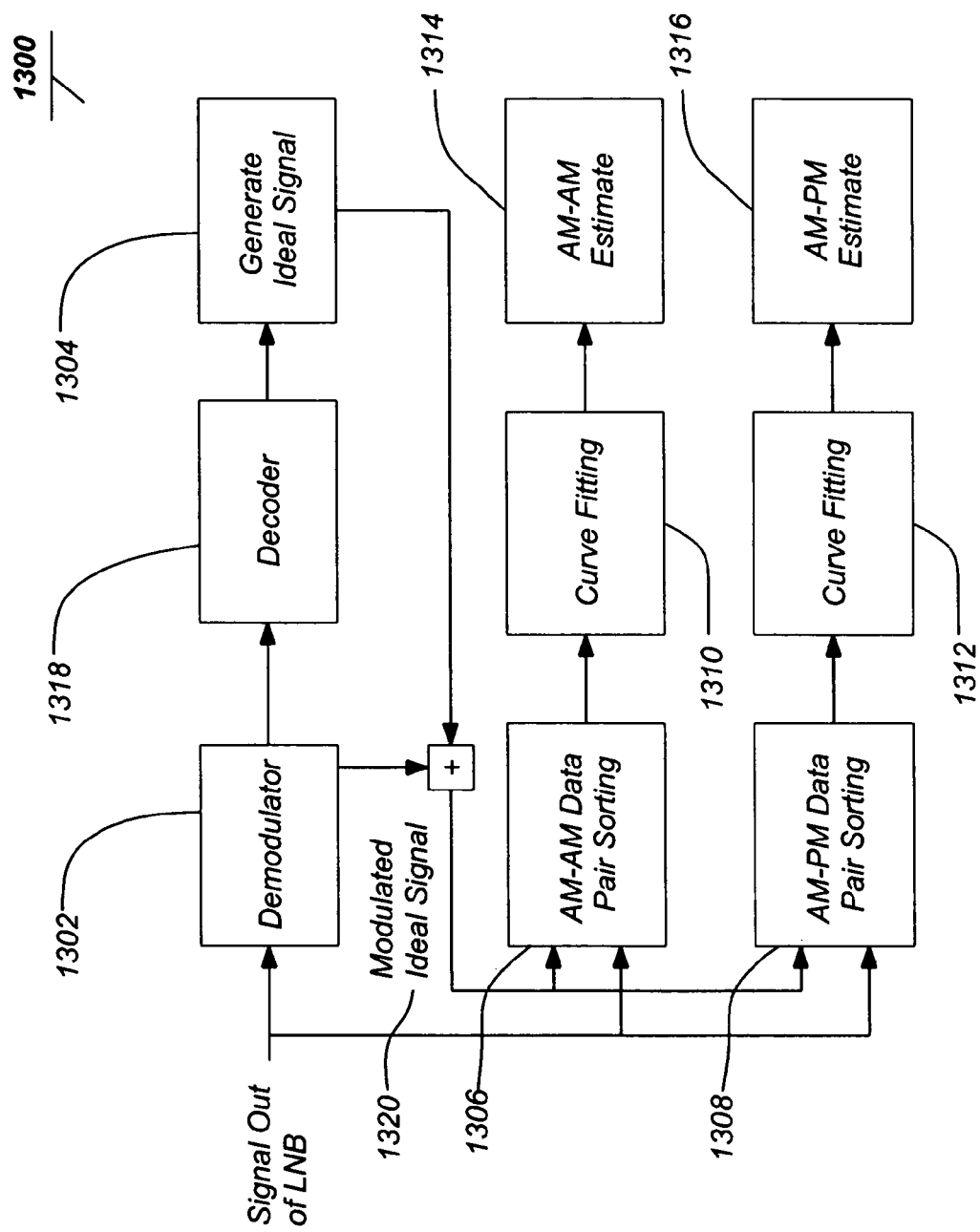
Figure 13C:
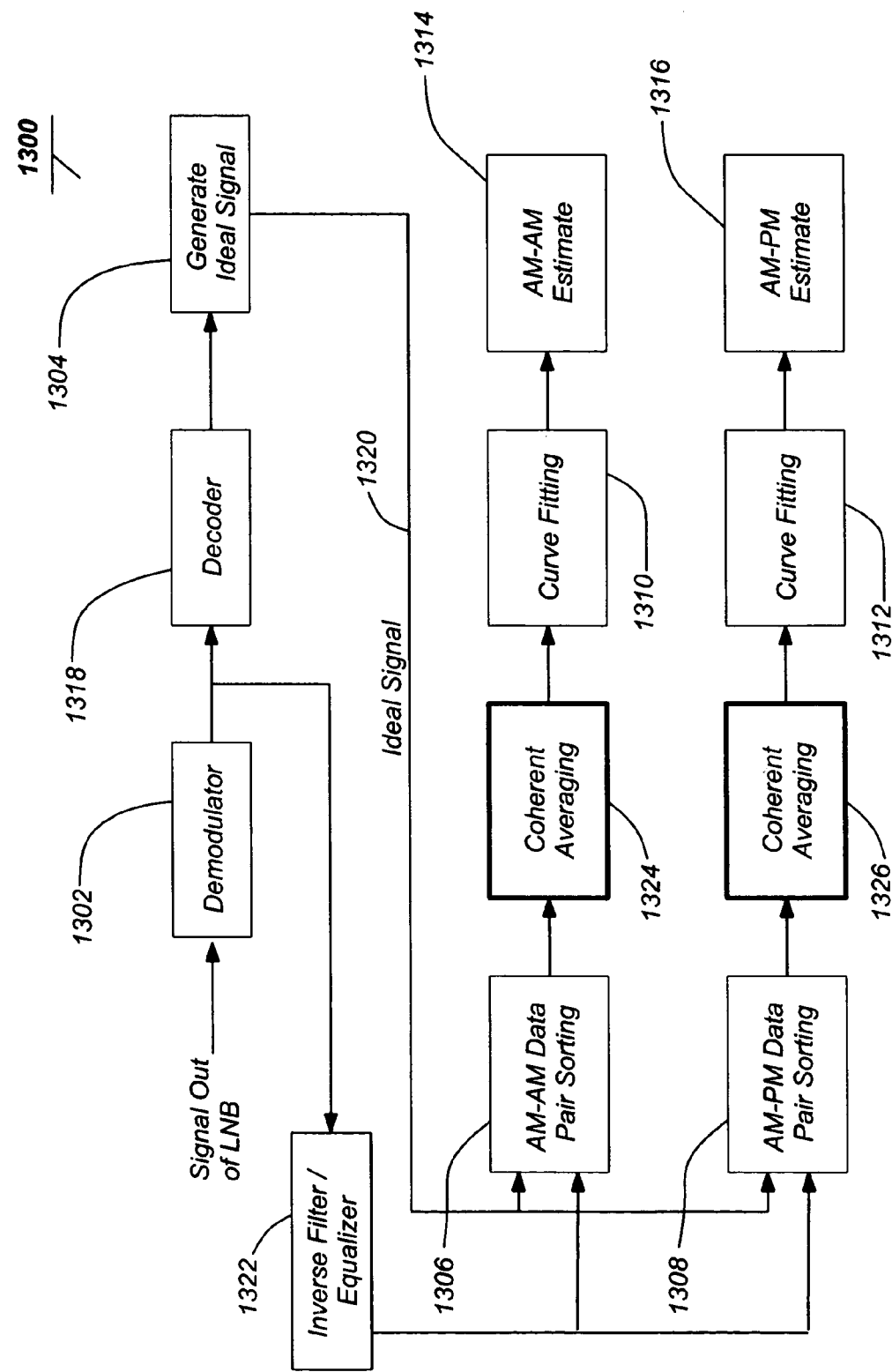

FIGS. 13A, 13B, and 13C are block diagrams of the basic system 1300 for measuring the characteristic maps. All of the described functions may be carried out within a receiver 802 used in a direct broadcast satellite system having a basic architecture as described above. The appropriate signal section is captured and demodulated by demodulator 1302 which aligns symbol timing and removes any residual carrier frequency and phase in the signal. The demodulated signal is used in a signal generator 1304 to generate an ideal signal, i.e. one representing the pre-transmitted signal. In the case of a digital signal, the signal will be further decoded to obtain the signal symbols which will be used to generate the ideal signal. The difference between the ideal signal and the received signal is used by processors 1306, 1310, 1308, 1312 to estimate a transmission non-linearity characteristic. Only a small section of the received signal, typically thousands of symbols, may be needed to obtain an estimate depending on the CNR of the received signal.

FIG. 13A depicts an embodiment where the non-linearity characteristic is estimated from a difference between the generated ideal signal (noise-free and without TWTA non-linearity) and the received signal after demodulation (and FEC decoding and remodulation as necessary). Because the ideal signal can be easily generated from only the symbols and symbol timing, obtaining the estimate from the received signal after demodulation simplifies the processing.

FIG. 13B depicts an embodiment where the performance characteristic is estimated from a difference between the ideal signal and the received signal before demodulation. In this case, the ideal signal must also be generated with the carrier frequency of the received signal. This may be done by adding the demodulated symbol timing and carrier frequency and phase to the ideal signal.

FIG. 13C is similar to FIG. 13A in that it depicts an embodiment where the non-linearity characteristic is estimated from a difference between the generated ideal signal (noise-free and without TWTA non-linearity) and the received signal after demodulation. As in FIGS. 13A and 13B, the measurement procedure starts with capturing a received signal and generating (1304) an ideal signal 1320 that is noiseless and without TWTA nonlinearity. The ideal signal 1320 is generated by re-encoding and re-modulating the symbols decoded with quasi-error-free (QEF) performance (as described above). The ideal signal 1320 represents the input to TWTA 816 and the captured signal represents the output of TWTA 816 (with noise).

In normal conditions, non-linearity widens the signal bandwidth through IM-3 (third-order inter-modulation), etc. Further, various noise and interference may impair the non-linearity measurements. For example, thermal noise (additive downlink), phase noise (LNB, tuner) and other interferences (CCI, ACI, lower-layer signal) may impair the measurements. Such impairments typically will not bias the AM-AM and AM-PM estimates. On the other hand, filtering along signal path generally reduces the observable non-linearity.

To account for the filtering effects, an inverse filter/equalizer 1322 may be used to improve the measurement accuracy by restoring the un-filtered signal (i.e., it recovers invisible non-linearity). Accordingly, the embodiment illustrated in FIG. 13C provides for using an inverse filter and/or equalizer 1322 to undo the filtering effect so that TWTA nonlinearity may be restored for most accurate measurements. A linear equalizer 1322 may be used to estimate and remove linear channel distortions and multi-path effects over the entire signal path. Thus, the linear equalizer/inverse filters 1322 effectively performs inverse filtering to "cancel" the combined filter effects. For example, the inverse filters 1322 may estimate and remove linear channel distortion caused by satellite OMUX filters (which may have a significant effect), IRD front-end low pass filters (LPF) (which may also have a major effect since bandwidth is usually limited), and/or other filters between the TWTA and the received/captured data. However, certain filters may not effect the signal. For example, an IMUX filter may have little effect since it happens prior to the bandwidth-widening effect of TWTA nonlinearity.

In all of the embodiment (i.e., illustrated in FIGS. 13A, 13B, and/or 13C) the ideal signal and the received signal are next used in processors 1306, 1308 to pair and sort data points of the two signals in a two-dimensional scattergram (a scattergram for purposes herein is the collection of paired points with input and output values represented along X and Y axes, respectively). These processors 1306, 1308 characterize a relationship between an input signal and an output signal of the amplifier plus noise. In this case, the input signal is represented by the generated ideal signal 1320 (re-modulated or otherwise) and the output signal is represented by the received signal. The X-axis of an AM-AM scattergram plots the magnitudes of the ideal signal samples before TWTA nonlinear distortions, and the Y-axis consists of the magnitudes of the received signal samples including the TWTA non-linearity (and noise). An AM-PM scattergram is similarly formed. The X-axis is the same as that for the AM-AM scattergram, and the Y-axis consists of all phase differences between the corresponding samples with and without TWTA non-linearity.

Accordingly, the two signals are aligned sample-for-sample by the timing recovery loop of the demodulator 1302, and data pairs are formed for all corresponding samples. The data sorting (1306 and 1308) sorts the data pairs to the powers of the ideal signal samples. For example, the re-generated ideal (linear) signal samples are sorted in power/magnitude.

The received (nonlinear) signal samples remain tagged to the re-generated signal samples after re-ordering.

At this point in the process, the embodiment of FIG. 13C diverges from the embodiments of FIGS. 13A and 13B. The averaging process illustrated in FIG. 13C coherently adds a given number (representing the averaging ratio) of adjacent sorted TWTA input signals for averaging (i.e., using coherent averaging processors 1324 and 1326) to reduce noise effect. The averaging ratio to be used depends on signal CNR and on the quality of the nonlinearity measurement that is required for a given application. Accordingly, measurement impairments may be compensated by increasing the averaging ratio. For uncorrelated or little correlated noise and interference samples, the averaging process can increase the quality of an unbiased estimate by 3 dB for every doubling of the averaging ratio. However, as described above, the presence of filters along the signal path before the data is collected can reduce the accuracy of the estimate. Including the satellite OMUX filter and IRD front-end low pass filter (LPF), in-path filters can hide a part of the nonlinearity from the captured data.

The use of coherent averaging improves TWTA AM-AM and AM-PM estimates without creating a measurement floor across all input signal powers and works with both classic or layer-modulated signals. Further, the coherent averaging permits TWTA non-linearity to be measured by individual IRDs thereby avoiding the need to download TWTA tables to the IRD if desired.

As part of the coherent averaging, the average powers (operating point) of the input and output signals as well as the actual AM-AM and AM-PM curves may first be rescaled to 0 dB and 0 degree respectively for convenience of subsequent processing. The sorted linear and nonlinear signals are then coherently averaged with the averaging ratio depending on the input signal CNR and quality of non-linearity measurement required as described above.

If necessary, forward error correction (FEC) may be applied to the demodulated signal followed by a re-encoding and remodulation process to ensure that all recovered symbols are error-free.

After the sorting (i.e., in FIGS. 13A and 13B) and coherent averaging (i.e., in FIG. 13C), the data points of the ideal signal and the corresponding data points of the received signal are processed by a processor 1310, 1312 to form a line through curve fitting, such as with a polynomial. The result is an estimate of the desired performance characteristic of the TWTA 1314, 1316.

Figure 13D:
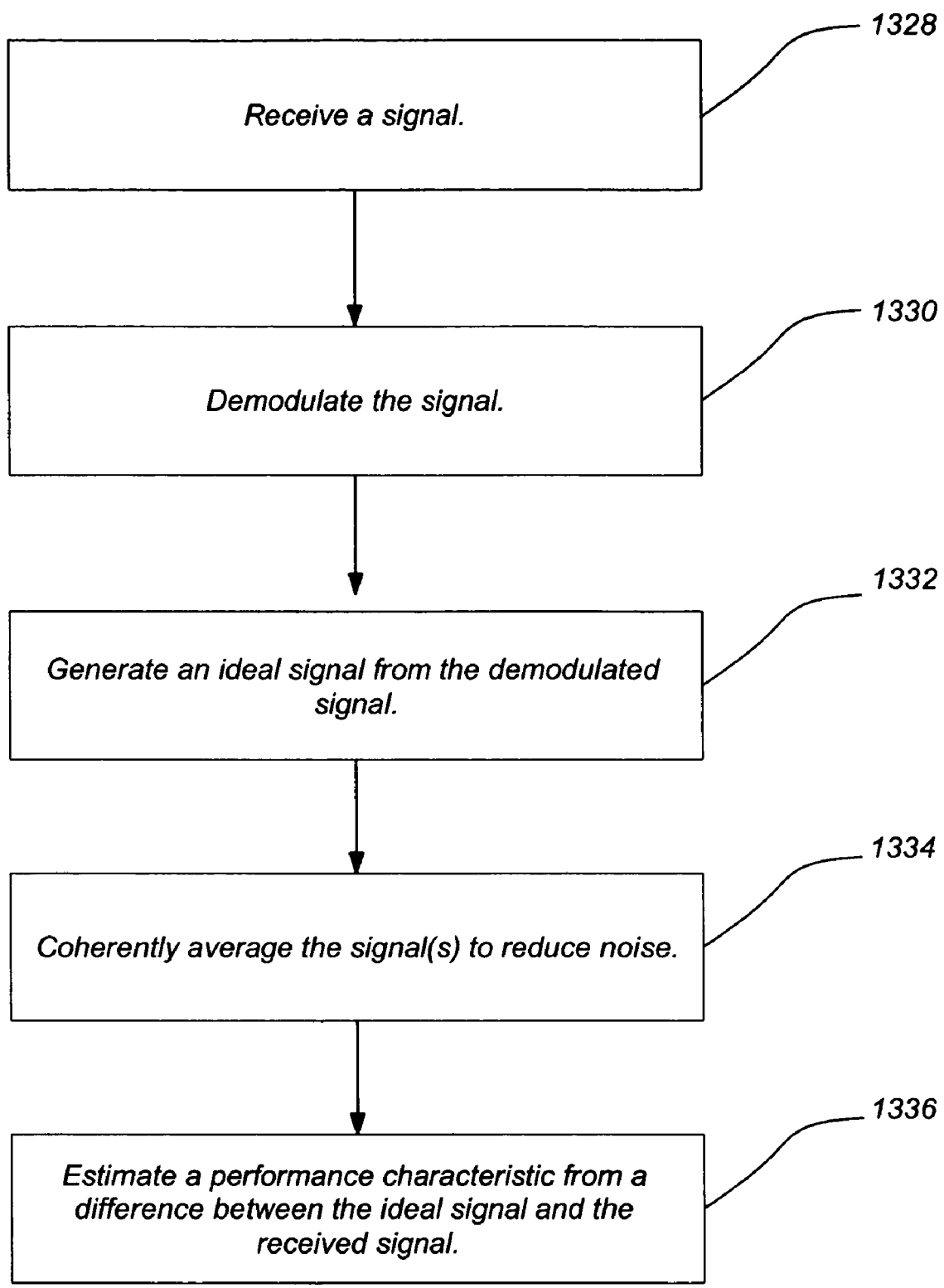
FIG. 13D outlines the flow of a method of the present invention.

FIG. 13D outlines the flow of a method of the present invention. A signal is received at block 1328. The signal is demodulated at block 1330. Then an ideal signal is generated from the demodulated (and decoded, re-encoded and remodulated as necessary) signal at block 1332. At step 1334, the received signal (either before or after demodulation) and/or the ideal signal (either with or without re-modulation correspondingly) is coherently averaged to reduce noise. Finally, a performance characteristic (i.e., a TWTA non-linearity curve) is estimated from a difference between the ideal signal (coherently averaged or prior to averaging) and the coherently averaged received signal at block 1336.

As described above, the coherent averaging 1334 and estimating 1336 steps may be performed by aligning the received signal and the ideal signal sample-for sample, forming data pairs for corresponding samples, sorting the data pairs to powers of the ideal signal samples, and coherently averaging the received signals to reduce noise. Such coherent averaging provides the capability to average complex numbers instead of merely examining the magnitude of the signals. In this regard, the coherent averaging process coherently adds a number of adjacent receiving signal samples, with the number of samples representing the averaging ratio. In addition, as described above, an inverse filter and/or linear equalizer may be used to process the received signal to restore visible nonlinearity.

7. Offsetting (Shifting) the TWTA Non-Linearity Measurements

Independent of the operating point estimation described above, the measured AM-AM and AM-PM curves may be deliberately offset or shifted to simplify the reconstruction of the upper layer signal during the signal reconstruction and cancellation process. Such an offset does not alter the performance of layered modulation processing (or non-linearity compensation performance). In fact, offsetting the operating point may result in a simple and consistent representation of TWTA non-linearity regardless of input saturation, input backoff, etc.

To offset the measurement curves, the input and output amplitude values (i.e., used during the non-linearity curve measurement) may be rescaled so that the operating point is at a desired reference point (e.g., 0 dB), for both input and output (e.g., thereby providing referenced operating point values). In the log domain, such rescaling may be performed by subtracting the measured (AM) input operating point value (in dB) from all input values (in dB). Likewise, the measured output (AM) operating point value (in dB) may be subtracted from values of all output points (in dB). Thus, by offsetting the measurement curves, the curves may be more easily referenced. In silicon and other hardware implementations, however, it may be desirable to scale the input and output operating points or signals back (e.g., to −3 dB or −5 dB) to avoid signal saturation or fractional value representation overflow for incoming (ideal) and outgoing (received) signals. The shifting process can be done similarly to that described above.

With a shifted AM scale as desired, the output PM value may also be rescaled by subtracting the measured (angular) phase value at the output operating point from the phase value of all output points.

The results of the above scaling is that the operating point will provide convenient reference values, such as (0 dB, 0 dB) for the AM-AM map, and (0 dB, 0°) for the AM-PM map. In this example case, the input signal is scaled to 0 dB to match the operating point. To guard against signal out-of-range errors (and to avoid the need for a look-up-table [LUT] extrapolation), bounding points may be placed beyond the measured signal interval in the constructed nonlinearity maps. The values for the bounding points may be obtained by extrapolating or replicating values from the endpoints of the TWTA measurement values.

Figure 14A:
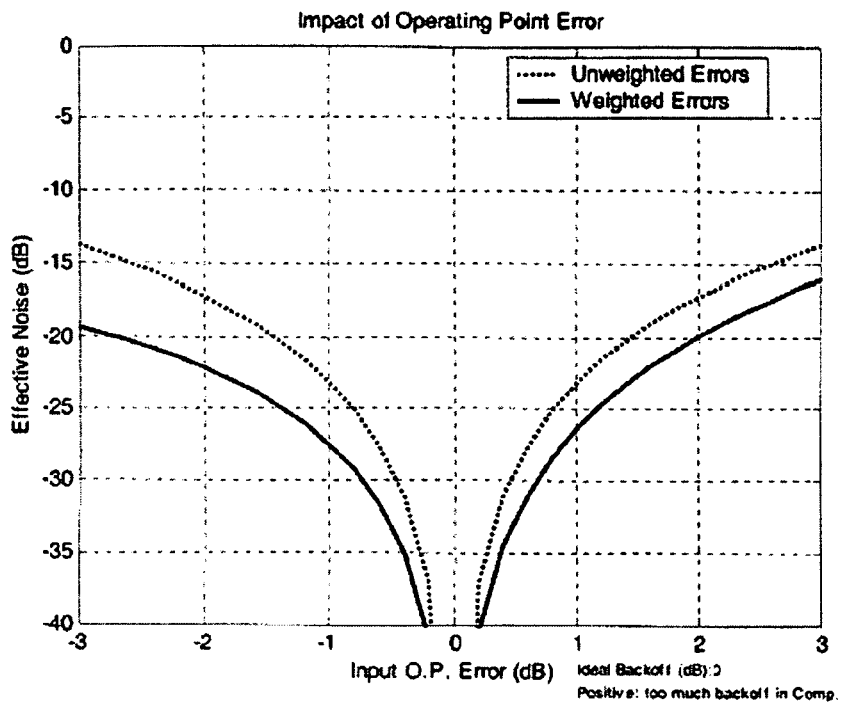
FIGS. 14A and 14B illustrate the impact of operating point errors in signal reconstruction.
Figure 14B:
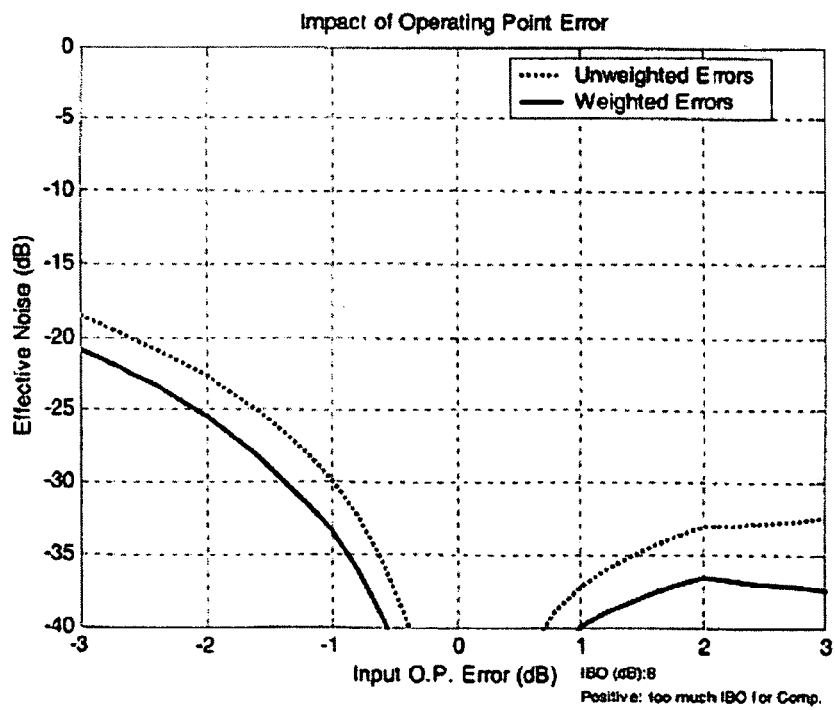

FIGS. 14A and 14B simulate the receiver performance impact of an error (offset point or O.P.) in the assumed operating points on example TWTA nonlinearity curves. The performance is expressed as an effective noise in dB relative to signal power. FIG. 14A shows the effective noise when the actual operating point is at TWTA saturation. FIG. 14B shows the effective noise when the actual operating point is 8 dB backed off from TWTA saturation. Errors are calculated assuming uniform (unweighted) distribution of the signal power as well as assuming weighting by the histogram of the signal samples in power. FIG. 14B is significantly better than FIG. 14A due to the reduced nonlinearity with TWTA backoff.

8. Effect of Coherent Averaging

Various computer simulations may be used to illustrate the effect of coherent averaging in accordance with one or more embodiments of the invention. The simulations described herein use a generic set of TWTA nonlinearity curves and the signals for all layers assume a QPSK format.

Figure 15:
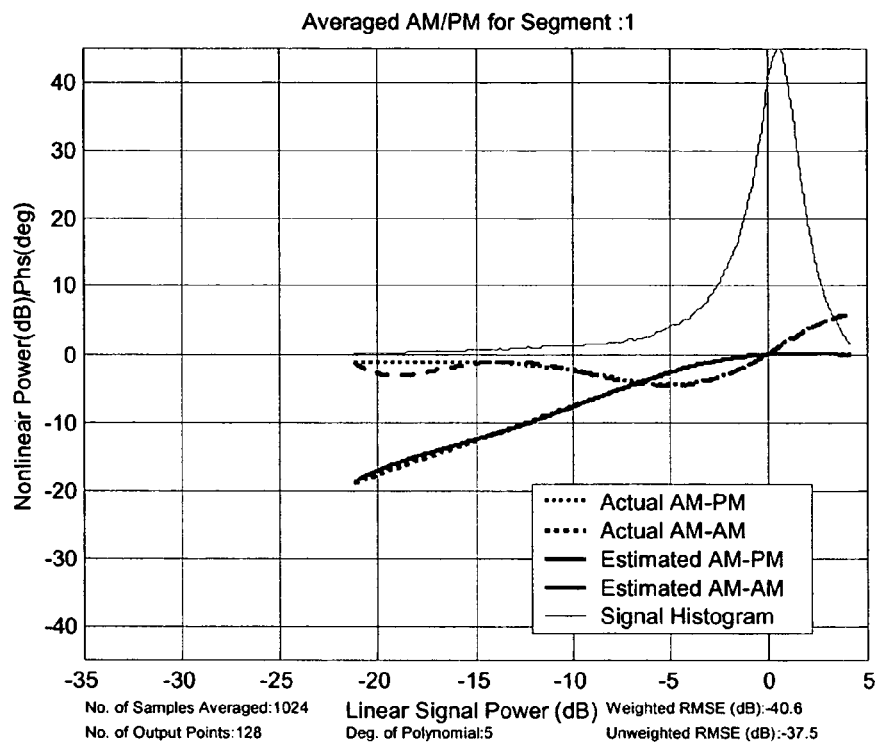
FIG. 15 shows an estimate of the TWTA nonlinearity.

FIG. 15 shows an estimate of the TWTA nonlinearity in a benign scenario, in which there is only one layer of signal (such as with a conventional QPSK signal) and no noise is added. However, a significant amount of phase noise is added in the raw data, necessitating the demodulator 1302 to track out most phase errors and reveal a stable constellation in the (I,Q) space. The averaging ratio is 1024, meaning that groups of 1024 neighboring data are coherently averaged for the individual input and output signals. This results in 128 collapsed complex data pairs from a raw data set of 131,072 (1024*128), covering 1.3 ms in real time based on a sample rate of 100 MHz and a symbol rate of 20 MHz (with a 5:1 over-sampling ratio). The 128 complex numbers each of the input and output signals are converted to (input amplitude, output amplitude) and (input amplitude, phase difference) before they are separately fitted with a 5-th order polynomial (with a total of 6 polynomial coefficients). Increasing the degree of fitting polynomial might improve measurement accuracy for AM-PM curves that are more complex.

The fitting AM-AM and AM-PM curves are shown to very closely track the actual AM-AM and AM-PM curves in the Figure. The difference power between the measured curve and the actual curve, weighted by the histogram of the input signal power, is −40.6 dB relative to the input signal power. The weighting histogram is formed from the input signal and can be seen overlaid with the nonlinearity curves in FIG. 15. For comparison and reference purposes, an unweighted error is calculated to be −37.4 dB. Only the weighted performance will be relevant to the present application since the satellite signal has an amplitude distribution depicted by the signal histogram in FIG. 15.

Figure 16:
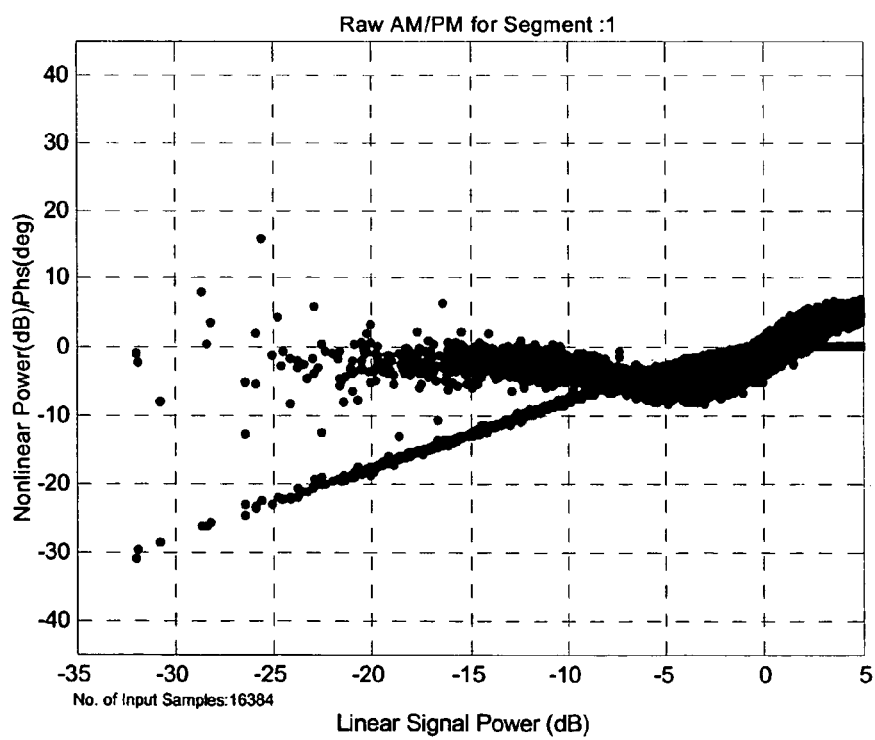
FIG. 16 shows a subset of data pairs of raw data from FIG. 15 before averaging.

FIG. 16 shows the first 16,384 of the 131,072 data pairs of raw data from FIG. 15 before averaging. The 16,384 pairs represent a duration of 164 µs in real time. Without noise added to the raw data, the demodulated signal moderately spreads out in amplitude and phase consistent with the performance of the carrier recovery loop in the demodulator 1302. Note how averaging and subsequent polynomial fitting reduce the data to curves closely matching the true ones shown in FIG. 15. Naturally, one may use templates or polynomials other than power polynomials for curve fitting, such as the Legendre polynomials.

Figure 17:
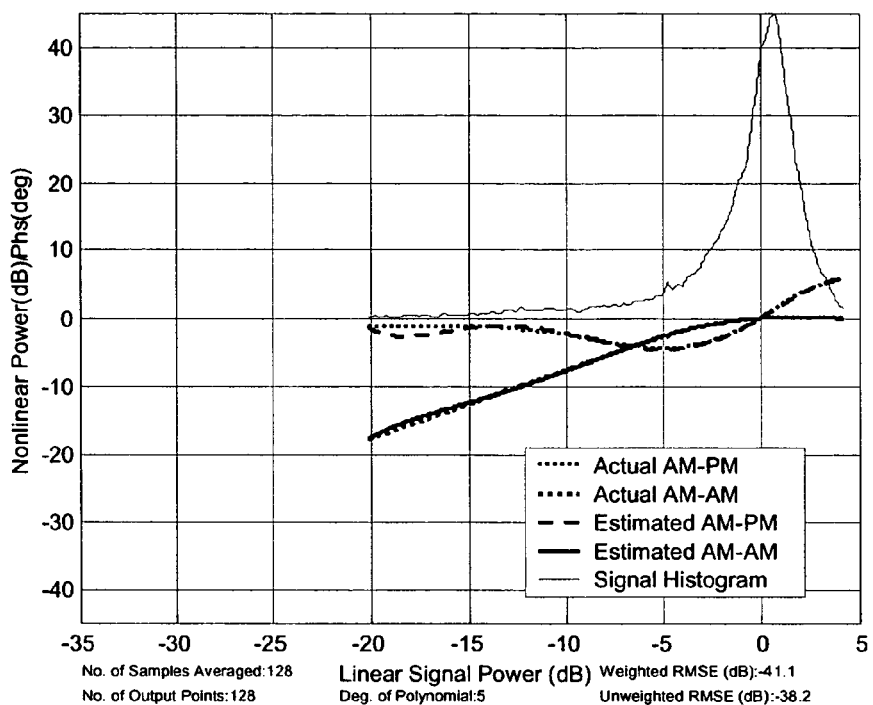
FIG. 17 shows averaged and fitted TWTA nonlinearity curves.

FIG. 17 is similar to FIG. 15, except that a reduced number of 16,384 data pairs are included. The averaging ratio is 128, meaning that groups of 128 neighboring data are coherently averaged for the individual input and output signals. This results in 128 collapsed complex data pairs from a raw data set of 61,384 (128*128). The error performance is −41.1 dB. Comparing the error performance with the performance from 131,072 samples in FIG. 15, it may be concluded that as few as 16,384 data pairs can provide nearly full measurement accuracy for a signal with a strong carrier to noise ratio (CNR).

Figure 18:
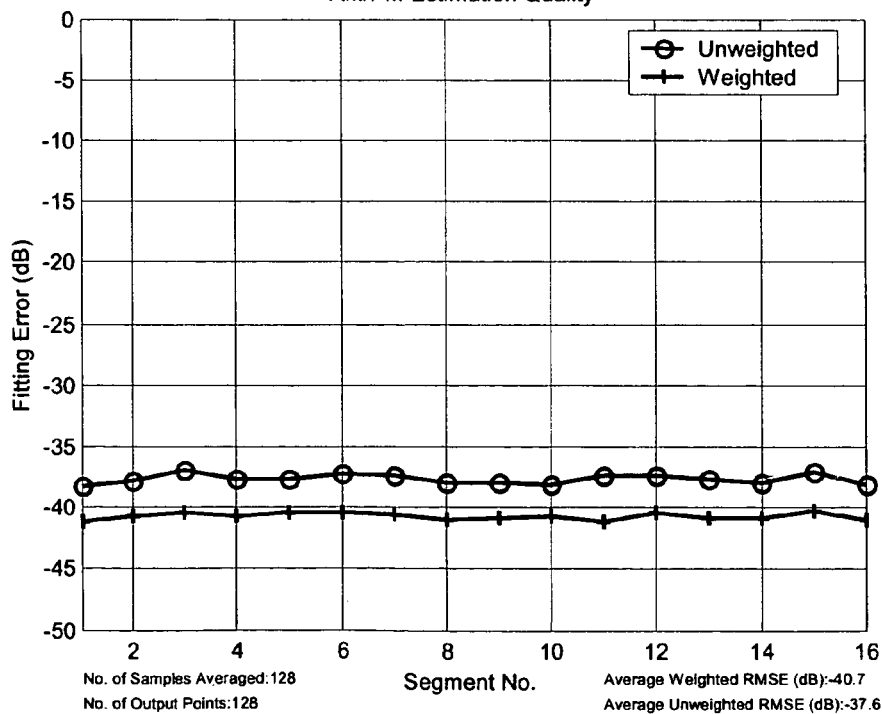
FIG. 18 shows the quality of AM/PM fitting polynomials.

The averaging and fitting process for FIG. 17 is repeated for sixteen (16) consecutive sets of 16,384 data pairs each. The short-term performance of the error performance is plotted in FIG. 18 that illustrates the quality of the fitted AM/PM curves. FIG. 18 demonstrates a consistent measurement accuracy around −40.7 dB.

Figure 19:
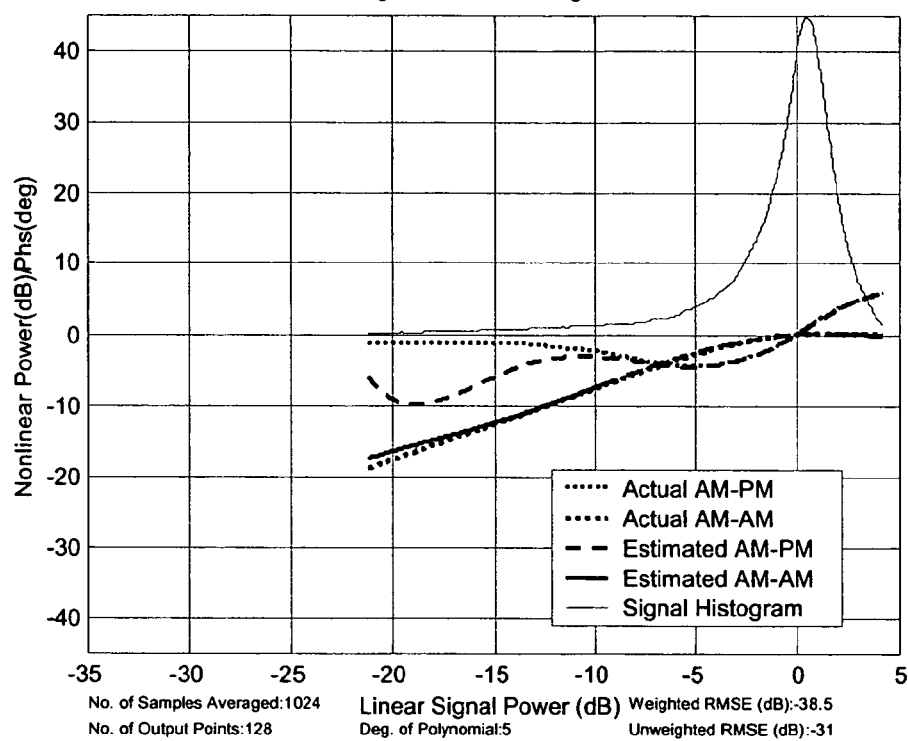
FIG. 19 illustrates the layered signal AM/AM and AM/PM data after averaging.

A lower-layer signal and some Gaussian noise may be added to test the robustness of the measurement method described herein. FIG. 19 illustrates the layered signal AM/AM and AM/PM data after averaging (and the addition of the lower-layer signal and Gaussian noise). The lower-layer signal is at −8.4 dB from the upper-layer signal, and the thermal noise is at −16 dB from the upper-layer signal. The lower-layer signal and additive noise combine to form an effective noise floor for the upper layer signal at −7.7 dB from the upper-layer signal. The weighted measurement error is −38.5 dB. Such good measurement performance is very significant considering that it is only 2.1 dB worse than that in FIG. 15, which did not include noise or interference impairments. This level of performance is expected to be sufficient for most layer modulation applications. One can therefore draw a conclusion that a local IRD can measure TWTA nonlinearity with the accuracy needed for layered modulation applications. Furthermore, the performance of FIG. 19 may be improved by increasing the averaging ratio, at the expense of increased data buffer and processing time.

Figure 20:
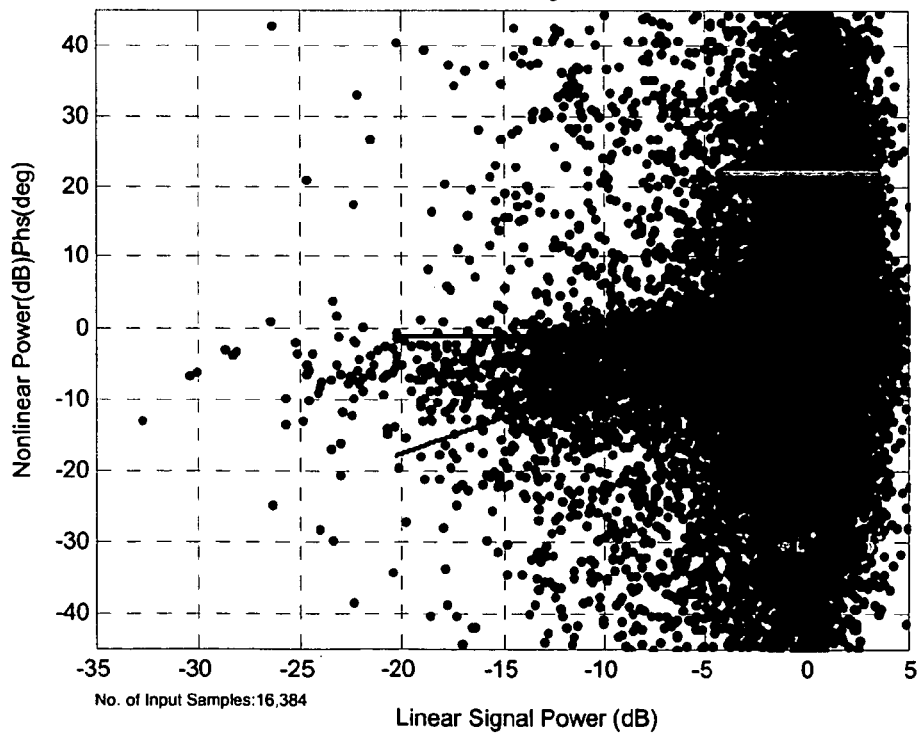
FIG. 20 illustrates the layered signal raw AM-PM data.
Figure 21:
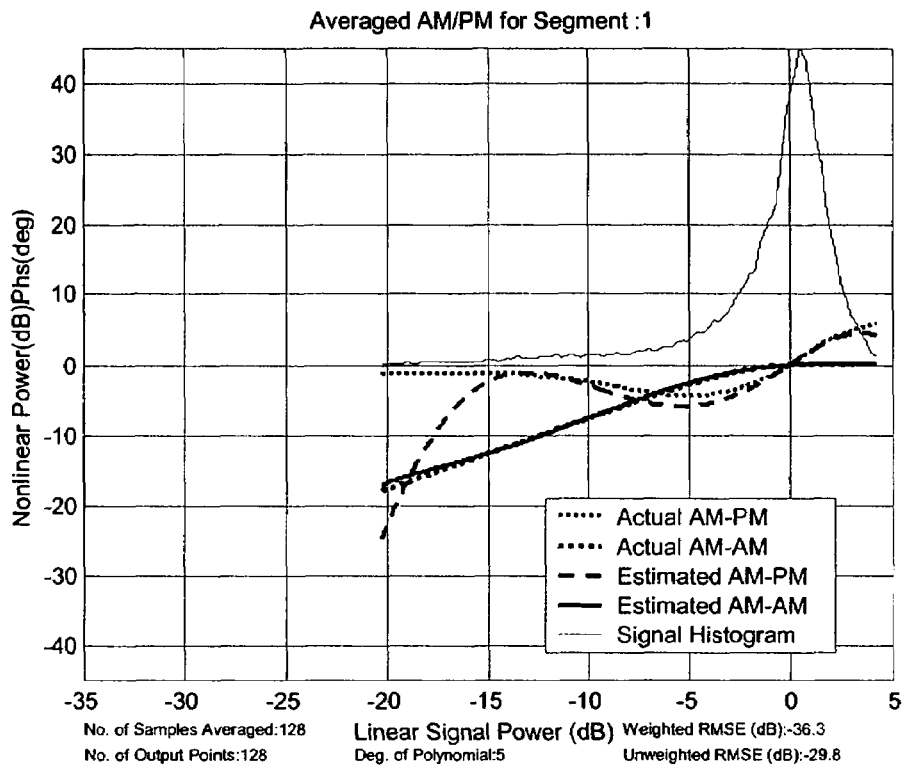
FIG. 21 illustrates the layered signal fitted AM/AM and AM/PM data.
Figure 22:
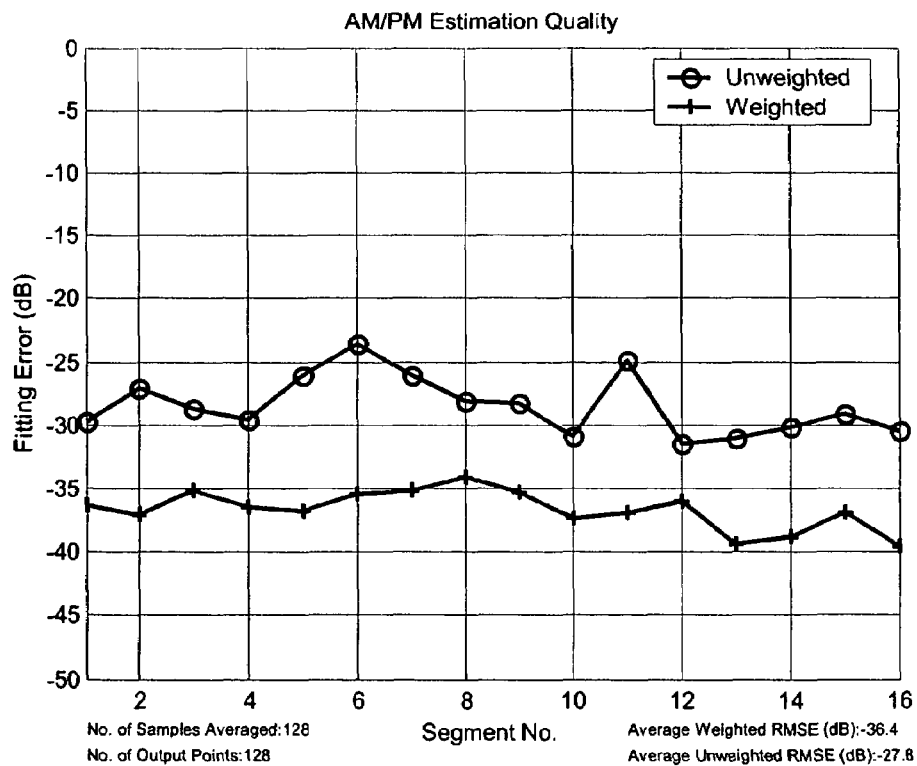
FIG. 22 illustrates the layered signal quality of AM/PM estimates.

Showing much spreading in AM and PM curves, FIG. 20 (illustrating the layered signal raw AM-PM data) is the counterpart to the noiseless case of FIG. 16. After averaging and fitting, the segment of 16,384 data pairs is reduced to the curves in FIG. 21 (illustrating the layered signal fitted AM/AM and AM/PM data), which has a weighted error of −36.3 dB. A short history of error performance similar to that in Chart 18 is shown in FIG. 22 (illustrating the layered signal quality of AM/PM estimates), with 16 segments from 16,384 adjacent data pairs each. The average error over all 16 segments is −36.4 dB.

Figure 23:
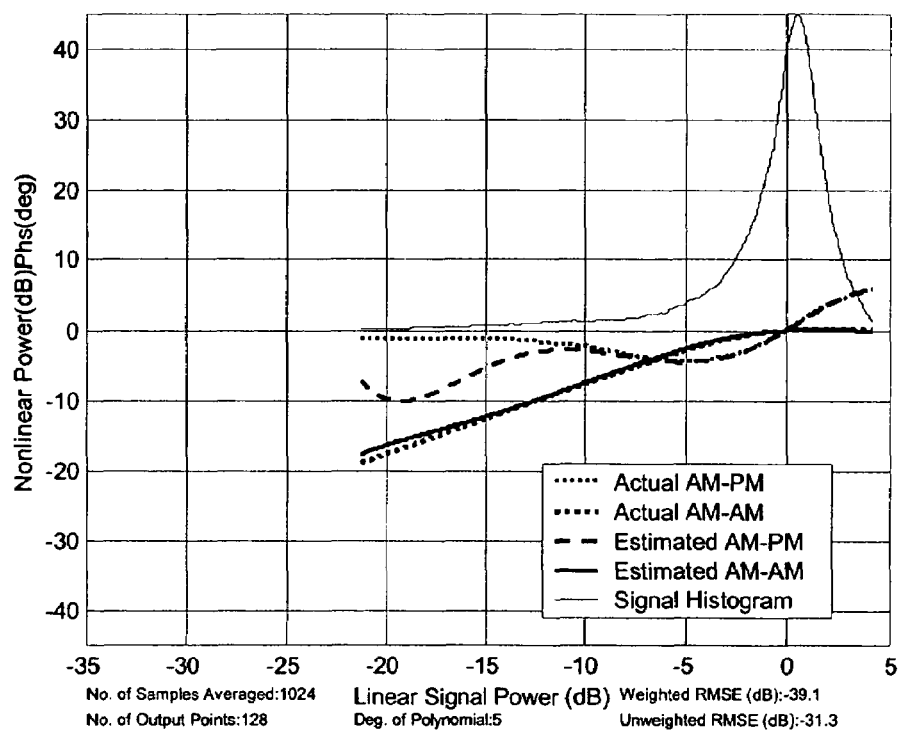
FIG. 23 illustrates the effect of an IMUX filter to AM/PM estimates.

FIG. 23 adds the effect of an example IMUX filter. Within the CNR calculation accuracies, the weighted performance of −39.1 dB for FIG. 23 is little changed from the −38.5 dB value of FIG. 19 without the filter. Such results are consistent with the fact that the input signal into the IMUX filter is well constrained within the designated signal bandwidth and that the input signal is generally little affected by the IMUX filter.

Figure 24:
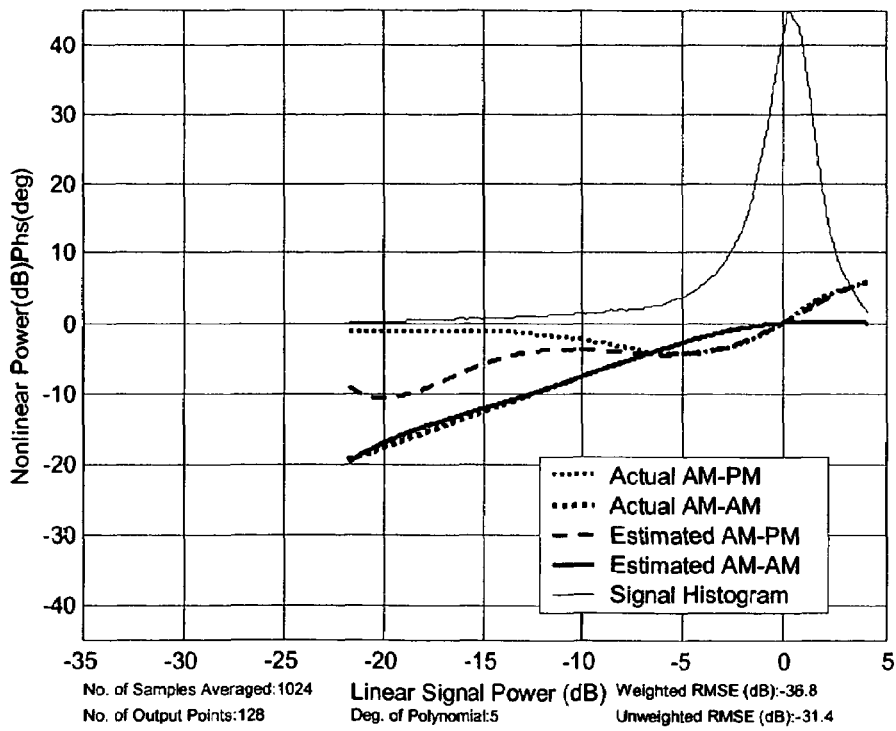
FIG. 24 illustrates the effect of adding a baud rate offset ratio of $10^{-5}$ to AM/PM estimates.

To continue adding impairments to the data to test the nonlinearity measurement technique, a symbol baud rate offset ratio of $10^{-5}$ is next included in the received data as illustrated in FIG. 24. The slipping between data symbols and A/D clock forces the timing recovery loop in the demodulator 1302 to employ an interpolator that brings along certain filtering effects that are commensurate with the interpolator performance. The results in FIG. 24 show an error of −36.8 dB. This compares with −39.1 in FIG. 23 without the baud rate offset.

Figure 25:
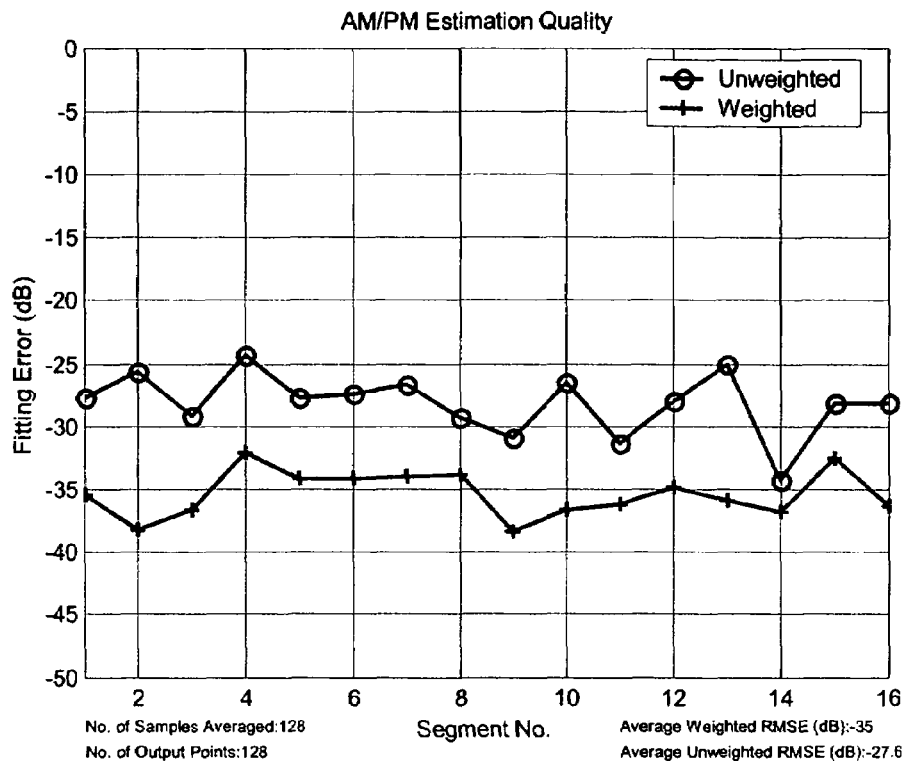
FIG. 25 illustrates a sample history of the estimation performance over a subset of the data pairs of FIG. 24.

Likewise, a sample history of the estimation performance over the series of 16,384 data pairs is shown in FIG. 25, indicating an average performance of −35 dB. This compares with −36.4 dB in FIG. 22 without the baud rate offset.

Figure 26:
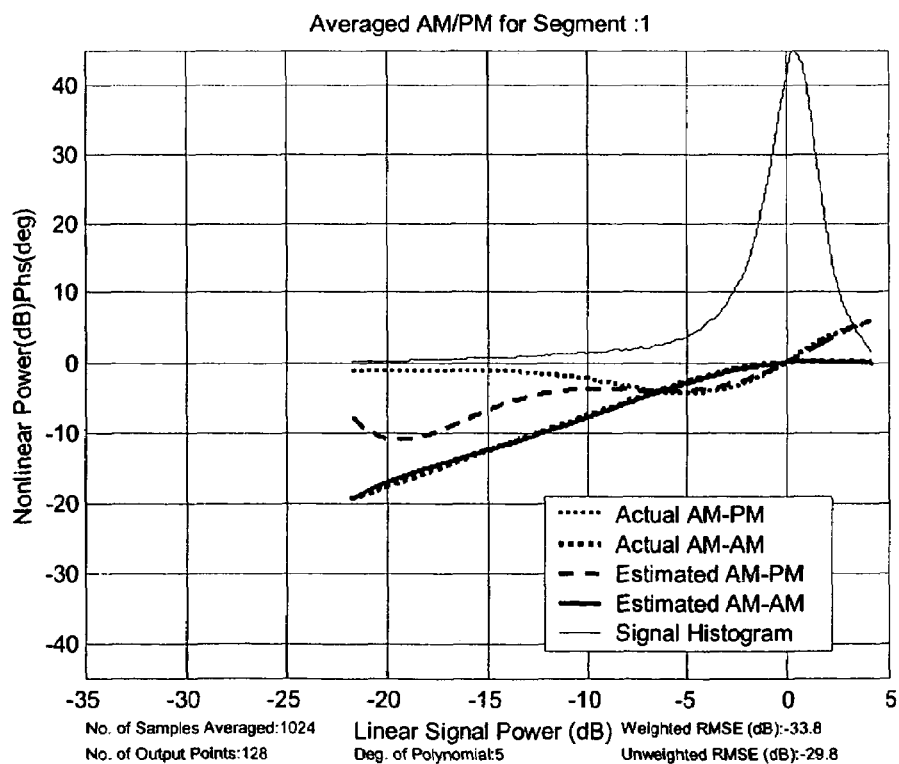
FIG. 26 illustrates the effect of adding an OMUX filter to the AM/PM estimates.

Next, an OMUX filter is added to the simulated data. The performance of −33.8 dB in FIG. 26 compares with −36.8 dB of FIG. 24 before adding the filter.

Figure 27:
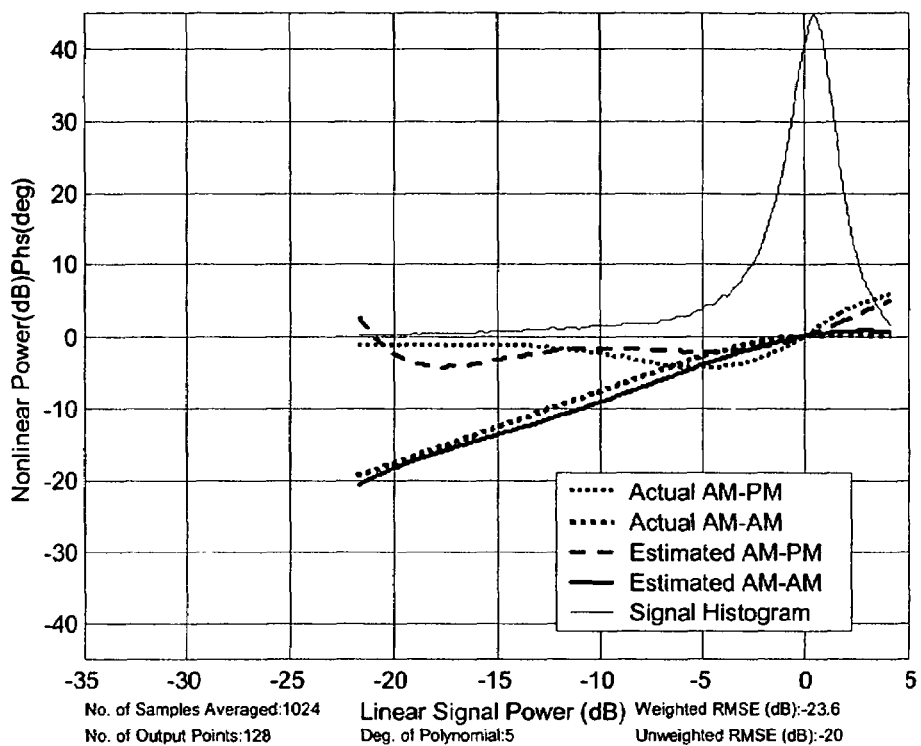
FIG. 27 illustrates the effect of the addition of a 4-th order Butterworth LPF filter to the AM/PM estimates.

FIG. 27 illustrates performance with the addition of a 4-th order Butterworth LPF filter, which represents an anti-aliasing filter at the receiver front end, with a 3-dB bandwidth of 14 MHz. The error performance drops significantly to −23.6 dB, indicating a large impact of the LPF filter on nonlinearity measurement performance. As illustrated, the 14 MHz filter is much narrower than the OMUX filter and therefore imposes a heavier impact on the observability of the TWTA nonlinearity.

The next several figures present measurement results from a layer-modulated signal emulated from two QPSK satellite signals. The layer-modulated signal is processed to produce measured AM/AM and AM/PM curves. The measured curves are compared with the known curves provided for performance evaluation.

Figure 28:
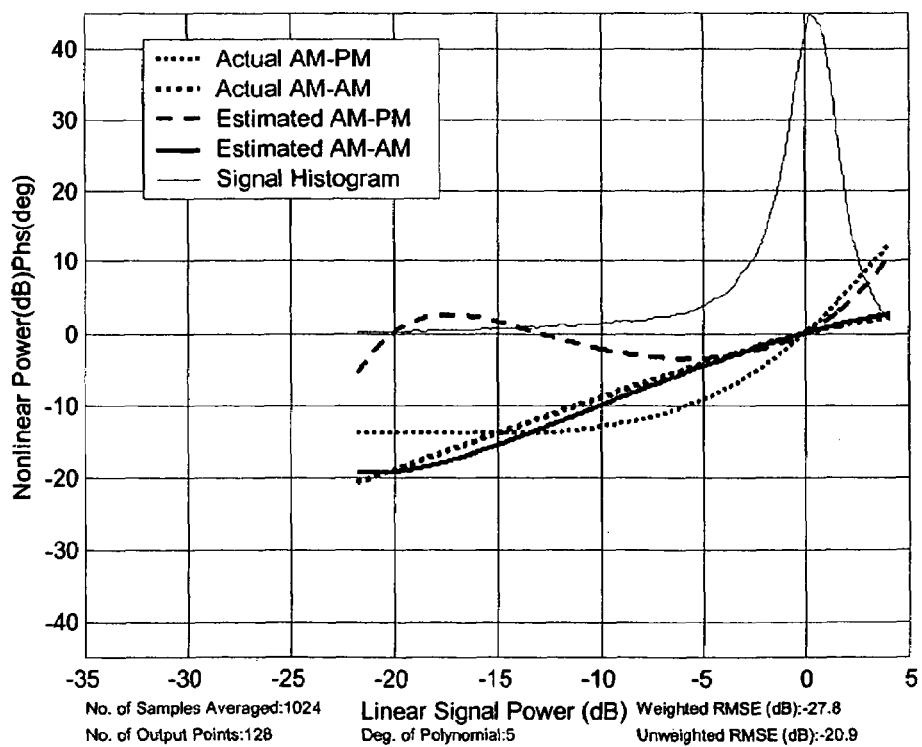
FIG. 28 plots the measured nonlinearity from the emulated layer-modulated signal.

Comparing with FIG. 27, FIG. 28 plots the measured nonlinearity by emulating layer-modulated signal from captured signal-layer signal. The upper-layer signal is from an example non-linearized TWTA with an input backoff, and the lower-layer signal is from another example linearized TWTA driven at saturation. The lower-layer signal is attenuated appropriately before it is combined with the upper-layer signal to from the emulated layer-modulated signal. The 3-dB bandwidth of the IRD front-end LPF is 21.4 MHz. Other processing parameters are similar to those described above. Results from processing a 1.3 ms worth of data captured at 100 MHz show an error performance of −27.8 dB. Accordingly, FIG. 28 illustrates the difference between the measured TWTA nonlinearity and the manufacturer-provided TWTA nonlinearity, the latter being based to form the simulated data.

Figure 29:
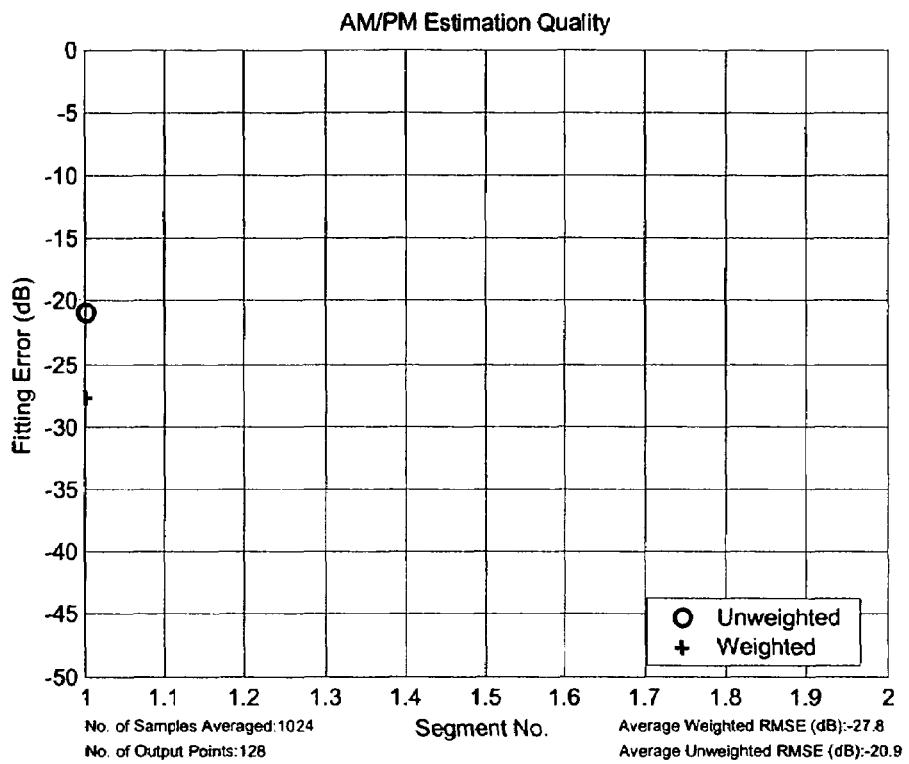
FIG. 29 illustrates the AM/PM estimate RMSE (root mean square error) history and contains only one data segment processed from the captured data.

FIG. 29 illustrates the AM/PM estimate RMSE (root mean square error) history which contains only one data segment processed from a short captured data interval length. The figure illustrates an unweighted nonlinearity measurement error of −20.9 dB.

Figure 30:
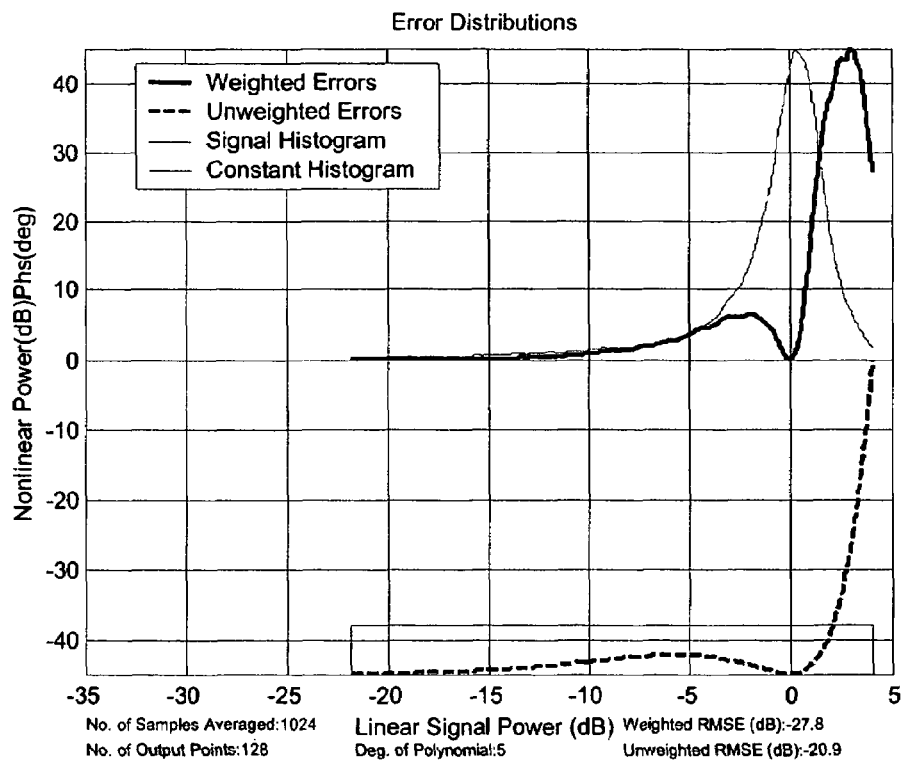
FIG. 30 illustrates a signal sample power histogram and error contributions of the reconstructed signal from the processed data segment.

FIG. 30 illustrates a signal power histogram and error contributions of the reconstructed signal from the processed data segment. The signal power histogram is shown as a thin curve in the top half of the window. The histogram is accompanied by an error contribution profile shown as a thick solid curve, which is the product of the signal histogram and the error between measured and actual nonlinear curves of FIG. 28. The error contribution profile integrates to the weighted error of −27.8 dB. Likewise, in the lower half of the window, a uniform "histogram" and a corresponding error contribution profile are overlaid for unweighted performance. The error contribution profile integrates to an unweighted error of −20.9 dB.

Figure 31:
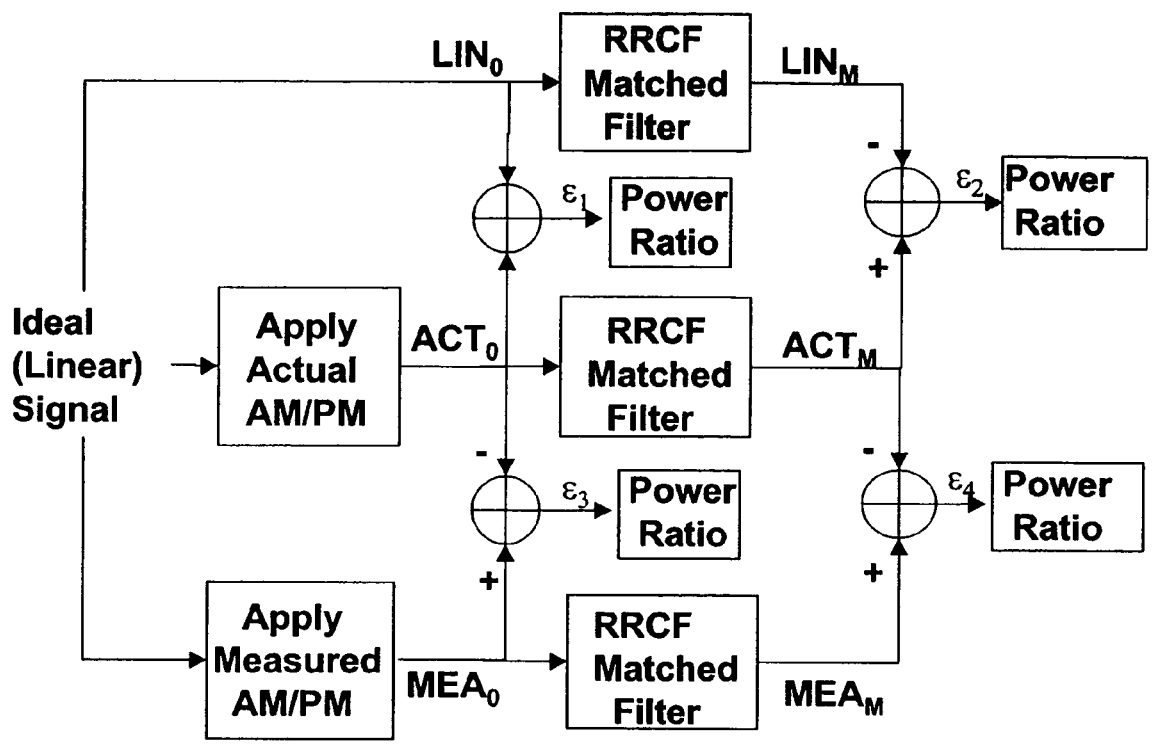
FIG. 31 is a signal processing diagram for TWTA nonlinearity impact calculations from satellite signals.

FIG. 31 is a signal processing diagram for the production of several subsequent plots/Figures to show how TWTA nonlinearity reduces available signal power and how a receiver matched filter actually reduces the apparent impact of TWTA nonlinearity in terms of residual CNR that was calculated above. To evaluate measurement performance, an ideal linear signal, denoted as $LIN_0$, is again first generated from the QEF symbols decoded from the upper-layer signal as part of the layer-demodulation process. $LIN_0$ is distorted with the actual AM/AM and AM/PM curves to form signal $ACT_0$. The ideal signal is also distorted with the measured AM/AM and AM/PM curves to form signal $MEA_0$. After matching the overall magnitude and phase between signals being compared, two error signals are computed: $\epsilon_1$ is the difference between $ACT_0$ and $LIN_0$, and $\epsilon_3$ is the difference between $MEA_0$ and $ACT_0$. $LIN_0$, $ACT_0$ and $MEA_0$ are processed with the receiver matched-filter, which is a root-raised cosine filter (RRCF), resulting in signals $LIN_M$, $ACT_M$, and $MEA_M$, respectively. Two error signals are formed from the match-filtered signals: $\epsilon_2 = ACT_M - LIN_M$ and $\epsilon_4 = MEA_M - ACT_M$. Powers of the above signals are computed by adding the squares of the magnitudes of the signal samples to normalize the results.

Figure 32:
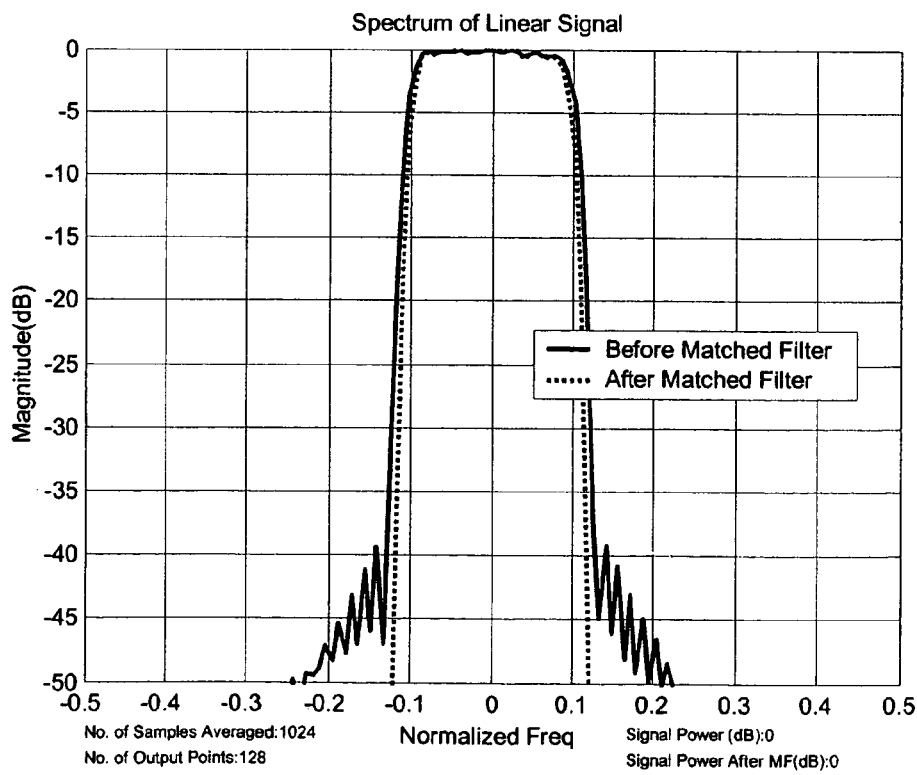
FIG. 32 displays the spectrum of the upper layer input (linear) signal.

FIG. 32 overlays the spectrum of signal $LIN_0$ which is before matched-filtering and the spectrum of signal $LIN_M$ which is after matched-filtering. Both signals are well confined within a bandwidth of +/−12 MHz from the center frequency. The two-sided bandwidth of 24 MHz corresponds to a symbol rate of 20 MHz plus an excess bandwidth ratio of 20%.

Figure 33:
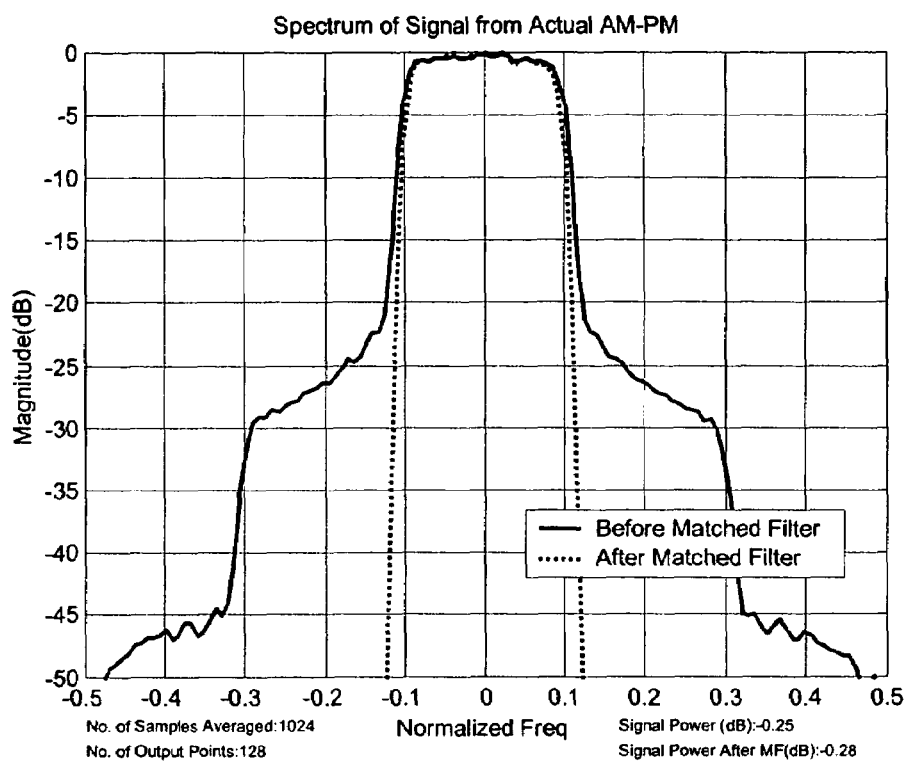
FIG. 33 illustrates the upper layer output signal with actual AM/PM nonlinearity.

FIG. 33 illustrates the upper layer output signal with actual AM/PM nonlinearity. Specifically, FIG. 33 shows the spectrum of signal $ACT_0$ with the actual TWTA nonlinearity. Two tiers are visible on either side of the spectrum: a near tier that comes from IM-3 (inter-modulation order 3) and a far tier that comes from IM-5 (inter-modulation order 5). These tiers reduce signal power by approximately 0.25 dB. In comparison, the matched filter reduces signal power by 0.28 dB. The dotted curve for the matched-filtered signal indicates that the nonlinearity beyond +/−12 MHz is removed by the receiver RRCF.

Figure 34:
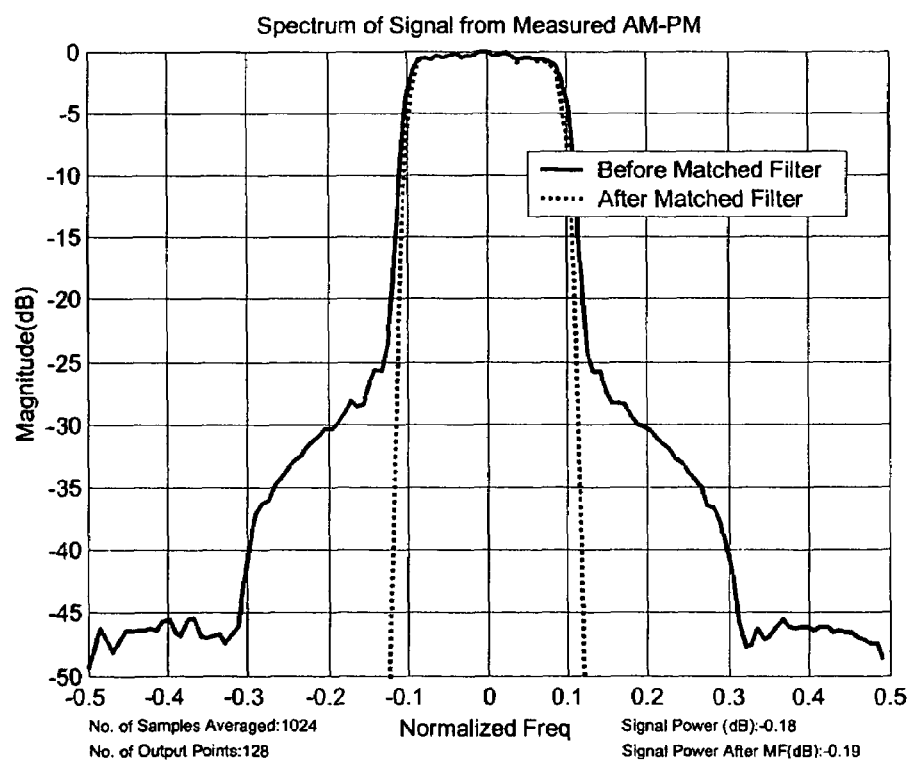
FIG. 34 illustrates the upper layer output signal with measured AM/PM nonlinearity.

FIG. 34 illustrates the upper layer output signal with measured AM/PM nonlinearity. Specifically, FIG. 34 shows the spectrum of signal $MEA_0$ at the output of the measured nonlinear TWTA. The two tiers of intermodulation are down from those in FIG. 33. Such a reduction is due to the amount of observable TWTA nonlinearity becoming smaller after the filtering narrows down the re-grown spectrum.

Figure 35:
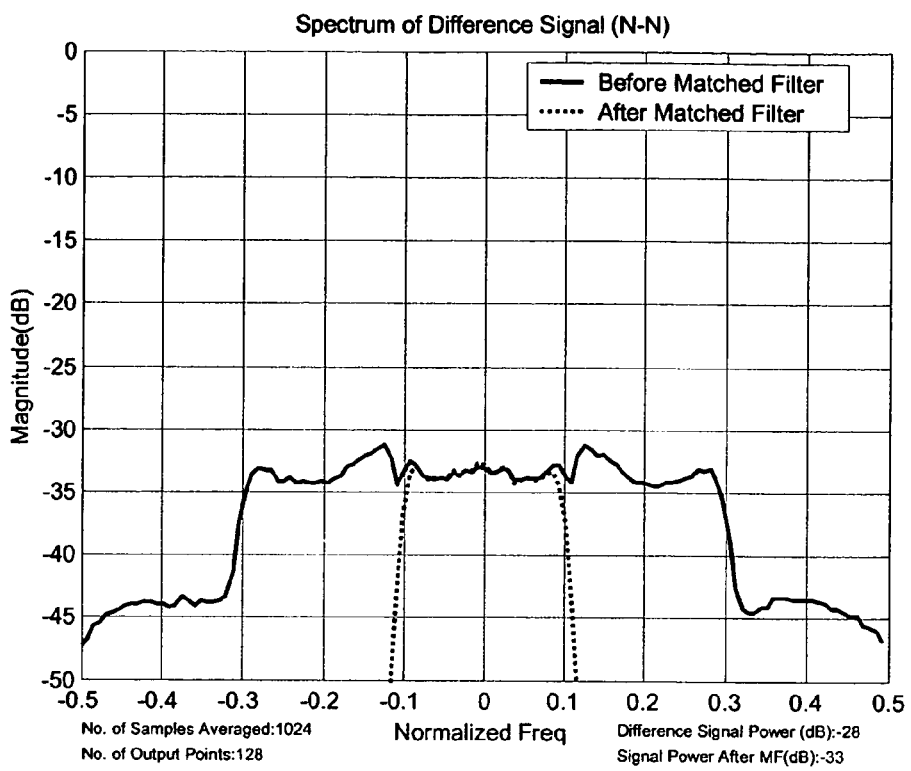
FIG. 35 illustrates the difference between actual and measured nonlinear signals.

FIG. 35 illustrates the difference between actual and measured nonlinear signals, i.e., the measurement errors. The solid curve shows the spectrum of the difference signal between $ACT_0$ and $MEA_0$. The difference signal integrates to approximately −28 dB relative to the linear signal. The dotted curve represents the difference signal between matched-filtered $ACT_M$ and signal $MEA_M$. This second difference signal integrates to −33 dB relative to the linear signal. The improvement of 5 dB after matched-filtering is due to the receiver RRCF filtering out a significant portion of the nonlinearity which does not contribute to the desired signal. The −33 dB value is for the portion of the curves within the 24 MHz signal bandwidth. Further, it should be noted that all errors presented in FIGS. 15-31 were measured over the entire spectrum without matched filtering. It is observed that matched filtering can reduce the nonlinearity effect by 4 to 5 dB, by removing the error power due to IM3 which expands the signal bandwidth by approximately a factor of 3.

Figure 36:
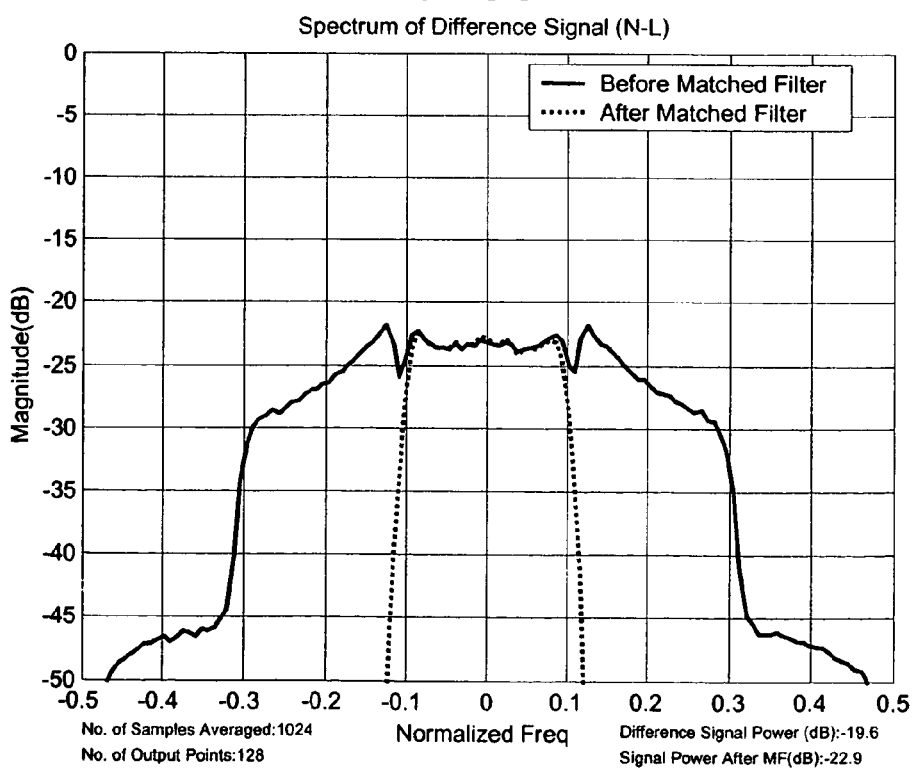
FIG. 36 illustrates the difference between nonlinear signals and linear signals.

FIG. 36 illustrates the difference between nonlinear signals and linear signals. Specifically, FIG. 36 illustrates the impact of TWTA nonlinearity without nonlinearity compensation. The solid curve draws the spectrum of the difference signal between $ACT_0$ and $LIN_0$ which are without matched filtering. This error signal integrates to −19.6 dB relative to the linear signal. The dotted curve with matched filtering in FIG. 36 integrates to −22.9 dB, for a 3.3 dB reduction. Recall that the TWTA for the captured and simulated data is backed off by 8 dB in input power to operate in a more linear region. Naturally, operating closer to saturation could significantly increase the difference signal power. Comparing the −22.9 dB value of FIG. 36 with the −33 dB value of FIG. 35, one realizes that compensating with the measured TWTA nonlinearity reduces the nonlinearity impact by about 10 dB in this case.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. For example, it is noted that the uplink configurations depicted and described in the foregoing disclosure can be implemented by one or more hardware modules, one or more software modules defining instructions performed by a processor, or a combination of both.

As described above, coherent averaging enhances the processed signal and downplays the non-coherent noise and interference. As a result, averaging significantly improves the performance of TWTA AM-AM and AM-PM estimates. Since coherent averaging is zero-meaning, the measurement floor disappears with the process. One does not need a very strong single-layered signal with a large receiving antenna to accurately estimate the TWTA nonlinearity. In other words, TWTA nonlinearity may be measured from a layer-modulated signal and at an individual IRD in the field rather than at the broadcast center with a large antenna. This operation flexibility may significantly reduce the complexity of the communications system, with eliminated needs to transmit TWTA nonlinearity data in the traffic.

In addition to the above, linear filters in signal propagation path prior to data capturing can reduce observable TWTA nonlinearity. Lost nonlinearity may be recovered by using an inverse filter or equalizer. Further, the memory buffer required to store the captured data for data sorting and coherent averaging may be shared with the delay buffer that is already part of a layered modulation receiver.

It is intended that the scope of the invention be limited not by this detailed description, but rather by the claims appended hereto. The above specification, examples and data provide a complete description of the manufacture and use of the apparatus and method of the invention. Since many embodiments of the invention can be made without departing from the scope of the invention, the invention resides in the claims hereinafter appended.

What is claimed is:

1. A method of measuring a transmission performance characteristic for a traveling wave tube amplifier, comprising:
   receiving, in a receiver, a signal transmitted from a satellite;
   demodulating, in the receiver, the signal;
   generating, in the receiver, an ideal signal from the demodulated signal;
   coherently averaging, in the receiver, the received signal to reduce noise; and
   estimating the performance characteristic for the traveling wave tube amplifier from a difference between the ideal signal and the coherently averaged received signal for use in a layered modulation scheme.

2. The method of claim 1, wherein the coherent averaging is performed after demodulation.

3. The method of claim 1, further comprising coherently averaging the ideal signal and wherein the performance characteristic is based on the difference between the coherently averaged ideal signal and coherently averaged received signal.

4. The method of claim 1, wherein the coherently averaging and estimating steps comprise:
   aligning, in the receiver, the received signal and the ideal signal sample-for-sample;
   forming, in the receiver, data pairs for corresponding samples;
   sorting, in the receiver, the data pairs to powers of the ideal signal samples; and
   coherently averaging, in the receiver, the received signals to reduce noise.

5. The method of claim 4, further comprising coherently averaging, in the receiver, the ideal signals to reduce noise.

6. The method of claim 1, wherein the coherently averaging comprises coherently adding a given number of adjacent received signals; the number representing the averaging ratio.

7. The method of claim 1, wherein the step of estimating the performance characteristic includes fitting a curve of the received signal versus the ideal signal.

8. The method of claim 7, wherein die curve is an AM-AM plot.

9. The method of claim 7, wherein the curve is an AM-PM plot.

10. The method of claim 1, further comprising inverse filtering, in the receiver, the received signal to restore nonlinearity.

11. The method of claim 1, further comprising using, in the receiver, a linear equalizer on the received signal to restore nonlinearity.

12. A system for measuring a transmission performance characteristic for a traveling wave tube amplifier, comprising:
   (a) a demodulator, in a receiver, for demodulating a received signal that has been transmitted from a satellite;
   (b) a signal generator, in the receiver, for producing an ideal signal from the demodulated signal; and
   (c) a processor, in the receiver, for:
      (i) coherently averaging the received signal to reduce noise; and
      (ii) estimating the performance characteristic for the traveling wave tube amplifier from a difference between the ideal signal and the coherently averaged received signal for use in a layered modulation scheme.

13. The system of claim 12, wherein the coherent averaging is performed after demodulation.

14. The system of claim 12, wherein the processor is further configured to coherently average the ideal signal and wherein the performance characteristic is based on the difference between the coherently averaged ideal signal and coherently averaged received signal.

15. The system of claim 12, wherein the processor is configured to coherently average and estimate by:
   aligning the received signal and the ideal signal sample-for-sample;
   forming data pairs for corresponding samples;
   sorting the data pairs to powers of the ideal signal samples; and
   coherently averaging the received signals to reduce noise.

16. The system of claim 15, wherein the processor is further configured to coherently average the ideal signals to reduce noise.

17. The system of claim 12, wherein the processor is configured to coherently average by coherently adding a given number of adjacent received signals; the number representing the averaging ratio.

18. The system of claim 12, wherein the processor is configured to estimate the performance characteristic by fitting a curve of the received signal versus the ideal signal.

19. The system of claim 18, wherein the curve is an AM-AM plot.

20. The system of claim 18, wherein the curve is an AM-PM plot.

21. The system of claim 12, further comprising an inverse filter that is used on the received signal to restore nonlinearity.

22. The system of claim 12, further comprising a linear equalizer that s used on the received signal to restore nonlinearity.

* * * * *